(12) United States Patent
Kim et al.

(10) Patent No.: US 11,371,124 B2
(45) Date of Patent: Jun. 28, 2022

(54) FE-BASED SOFT MAGNETIC ALLOY, MANUFACTURING METHOD THEREFOR, AND MAGNETIC PARTS USING FE-BASED SOFT MAGNETIC ALLOY

(71) Applicants: AMOGREENTECH CO., LTD., Gyeonggi-do (KR); INDUSTRY-UNIVERSITY COOPERATION FOUNDATION HANYANG UNIVERSITY ERICA CAMPUS, Gyeonggi-do (KR)

(72) Inventors: Jong Ryoul Kim, Seoul (KR); Min Kang, Gyeonggi-do (KR); Woo Chul Kim, Seoul (KR); Han Ho Oh, Gyeonggido (KR); Yong-Sul Song, Seoul (KR)

(73) Assignees: INDUSTRY-UNVERSITY COOPERATION FOUNDATION HANYANG UNIVERSITY ERICA CAMPUS, Gyeonggi-Do (KR); AMOGREENTECH CO., LTD., Gyeonggi-Do (KR)

( * ) Notice: Subject to any disclaimer, the term of this patent is extended or adjusted under 35 U.S.C. 154(b) by 787 days.

(21) Appl. No.: 16/068,623

(22) PCT Filed: Jan. 6, 2017

(86) PCT No.: PCT/KR2017/000231
§ 371 (c)(1),
(2) Date: Jul. 6, 2018

(87) PCT Pub. No.: WO2017/119787
PCT Pub. Date: Jul. 13, 2017

(65) Prior Publication Data
US 2019/0010586 A1 Jan. 10, 2019

(30) Foreign Application Priority Data

Jan. 6, 2016 (KR) .................. 10-2016-0001749
Jan. 6, 2016 (KR) .................. 10-2016-0001752
Jan. 6, 2016 (KR) .................. 10-2016-0001754

(51) Int. Cl.
*C22C 38/16* (2006.01)
*H01F 3/08* (2006.01)
(Continued)

(52) U.S. Cl.
CPC ............ *C22C 38/16* (2013.01); *C21D 6/00* (2013.01); *H01F 1/153* (2013.01); *H01F 3/08* (2013.01);
(Continued)

(58) Field of Classification Search
CPC ........ H01F 1/147–14791; H01F 1/153–15391; H01F 3/08; H01F 27/24; H01F 27/28; C22C 38/16; C22C 38/02; C22C 38/10; C22C 2200/02; C22C 2200/04; C22C 45/02; C22C 33/003; C22C 45/008; C22C 33/006; C22C 33/0207; C22C 33/0257; C22C 33/04; C22C 38/00; C22C 2202/02; C21D 2201/03; C21D 6/00; C21D 8/12
See application file for complete search history.

(56) References Cited

U.S. PATENT DOCUMENTS

2009/0266448 A1* 10/2009 Ohta .................. C22C 45/02
148/121
2010/0043927 A1* 2/2010 Makino .................. C22C 38/12
148/612
(Continued)

FOREIGN PATENT DOCUMENTS

CN 101263240 9/2008
CN 101627141 1/2010
(Continued)

OTHER PUBLICATIONS

I. Janotova et al. "Phase Transformation In Fe—B—(Si)—C-(Cu) Soft Magnetic Systems," Institute of Physics, Slovak Academy of Sciences (Year: 2014).*

(Continued)

*Primary Examiner* — Anthony J Zimmer
*Assistant Examiner* — Dean Mazzola
(74) *Attorney, Agent, or Firm* — Norton Rose Fulbright US LLP

(57) ABSTRACT

An Fe-based soft magnetic alloy is provided. The Fe-based soft magnetic alloy can be represented by empirical formula $Fe_aB_bC_cCu_d$, and in the empirical formula, a, b, c and d are atomic percent (at %) of the corresponding element and are respectively $78.5 \leq a \leq 86$, $13.5 \leq b+c \leq 21$ and $0.5 \leq d \leq 1.5$. The alloy has a high saturated magnetic flux density, excellent high frequency characteristics and low coercivity, and thus greatly facilitates the development of use as high performance/high efficiency small/lightweight parts. Since manufacturing costs are very low and the components contained in an alloy are easily controlled in an alloy manufacturing process, thereby enabling mass production of the alloy, the present invention can be widely applied as magnetic parts of electric and electronic devices such as a high power laser, a high frequency power supply, a high-speed pulse generator, an SMPS, a high-pass filter, a low-loss high frequency transformer, a fast switch and wireless charging.

8 Claims, 32 Drawing Sheets

(51) Int. Cl.
*H01F 1/153* (2006.01)
*H01F 27/24* (2006.01)
*H01F 27/28* (2006.01)
*H01F 1/147* (2006.01)
*C21D 6/00* (2006.01)

(52) U.S. Cl.
CPC ............ *H01F 27/24* (2013.01); *H01F 27/28* (2013.01); *C22C 2200/04* (2013.01); *C22C 2202/02* (2013.01); *H01F 1/147* (2013.01)

(56) References Cited

U.S. PATENT DOCUMENTS

| | | | | |
|---|---|---|---|---|
| 2010/0098576 | A1* | 4/2010 | Yoshizawa | C22C 38/16 420/82 |
| 2012/0199254 | A1* | 8/2012 | Urata | B22F 1/0044 148/579 |
| 2013/0314198 | A1* | 11/2013 | Ito | C21D 1/62 336/234 |
| 2018/0096766 | A1* | 4/2018 | Yoshidome | H01F 1/15308 |

FOREIGN PATENT DOCUMENTS

| | | |
|---|---|---|
| CN | 101906582 | 12/2010 |
| JP | 2001-226753 | 8/2001 |
| JP | 2002-030398 | 1/2002 |
| JP | 2008-231533 | 10/2008 |
| JP | 2011-149045 | 8/2011 |
| KR | 2015-0128031 | 11/2015 |

OTHER PUBLICATIONS

Fan et al. "Fe-based nanocrystalline FeBCCu soft magnetic alloys with high magnetic flux density" Mar. 28, 2011, J. Appl. Phys., 109 07A314(Year: 2011).*

International Search Report and Written Opinion issued in International Patent Application No. PCT/KR2017/000231, dated May 1, 2017.

Office Action issued in Corresponding Chinese Application No. 201780006026.9, dated Jul. 9, 2019.

* cited by examiner

«FE-BASED SOFT MAGNETIC ALLOY, MANUFACTURING METHOD THEREFOR, AND MAGNETIC PARTS USING FE-BASED SOFT MAGNETIC ALLOY»

CROSS-REFERENCE TO RELATED APPLICATIONS

This application is a national phase application under 35 U.S.C. § 371 of International Application No. PCT/KR2017/000231, filed Jan. 6, 2017, which claims priority to and the benefit of Korean Patent Applications No. 10-2016-0001749, filed Jan. 6, 2016, No. 10-2016-0001752, filed Jan. 6, 2016, and No. 10-2016-0001754, filed Jan. 6, 2016. The contents of the referenced patent applications are incorporated into the present application by reference.

TECHNICAL FIELD OF THE DISCLOSURE

The present invention relates to an Fe-based soft magnetic alloy, and more particularly, to an Fe-based soft magnetic alloy having a high saturated magnetic flux density and low magnetic loss, a manufacturing method therefor, and magnetic parts using the Fe-based soft magnetic alloy.

DESCRIPTION OF RELATED ART

A soft magnetic material is a material for magnetic cores such as various transformers, choke coils, various sensors, saturable reactors, and magnetic switches and has been widely used in various electric and electronic devices for supply of electric power, conversion of electric power, and the like, such as a transformer for distribution, a laser power supply or an accelerator.

The market demand for such electric and electronic devices is a small and lightweight product with high performance/high efficiency, and a low unit price. In order to satisfy such market demand, the soft magnetic material needs to have a high saturated magnetic flux density and low magnetic loss. Specifically, the output of the magnet core can be calculated by an equation: voltage (E)=magnetic flux density (Bm)×4.44 frequency (f)×number of turns (N)× magnetic core cross-sectional area (S), and in order to increase the voltage (E), each factor needs to become high.

Among the above factors, the factors which depend on the magnetic material of the magnetic core are the magnetic flux density (Bm) and the frequency (f), and in order to increase the magnetic flux density, a material having both a high saturated magnetic flux density and low magnetic loss of the magnetic material is required. The magnetic loss is calculated as a sum of hysteresis loss, eddy current loss and anomalous loss, and the eddy current loss and the anomalous loss depend on the magnetic domain size of the magnetic material of the magnetic core, resistivity, and thickness of the magnetic core, and the smaller the size of the magnetic core, the higher the resistivity, and the thinner the thickness of the magnetic core are, the more advantageous the magnetic loss may be. Further, in order to increase the frequency, the high frequency loss of the magnetic material needs to be low, but there is a limit in the material approach, as a circuit approach is required to increase the frequency (f).

Meanwhile, since crystal grains are not present in an amorphous alloy containing Fe which is known as a material having both a high saturated magnetic flux density and a low loss as a currently commercialized magnetic material, an amorphous alloy containing Fe has attracted attention as an energy-saving material as no crystal magnetic anisotropy is present, the hysteresis loss is low due to the low coercivity, and excellent soft magnetism is exhibited.

The amorphous alloy containing Fe has been developed and manufactured by including an element such as Si, B or P, which enhances the amorphous forming ability in addition to Fe as an element forming an alloy, or a metalloid such as a Cu, Nb, or Zr element, which serves as a nucleation site and/or a diffusion barrier.

However, when the content of the aforementioned metalloid is increased, there is a problem in that the saturated magnetic flux density of the alloy is lowered, and when the content of the metalloid is decreased, the initial alloy is not formed in an amorphous phase, or it is difficult to control the crystal size in a subsequent treatment process (for example, heat treatment) for changing characteristics, so that the coercivity and the magnetic loss may be increased. In addition, other problems may occur due to incorporation of metalloid elements, and specifically, as an Fe-based amorphous alloy containing P, which is known to improve the amorphous forming ability, is easily volatilized in a subsequent process for changing characteristics, it is very difficult to perform a subsequent process while inhibiting the volatilization of P, the productivity of the alloy is remarkably decreased in the subsequent process, and the Fe-based amorphous alloy may also be very disadvantageous for mass production.

In addition, in the case of including B which is known to have an amorphous forming ability, the difference between a first crystallization temperature and a second crystallization temperature of an alloy manufactured becomes very narrow, so that Fe and other inter-element compounds (for example, Fe—B) are produced in addition to α-Fe during the subsequent treatment, and as a result, there is a problem in that it may be difficult to obtain a homogeneous crystal of α-Fe. Furthermore, the case where a rare metal such as Nb is included is advantageous in controlling the crystal particle size in the subsequent process, but there is a problem in that the production cost is significantly increased because the unit cost of the above element is expensive.

SUMMARY OF THE INVENTION

The present invention has been devised in consideration of the above-described points, and an object thereof is to provide an Fe-based soft alloy which has a high saturated magnetic flux density and excellent high frequency characteristics, and thus can be utilized as small and lightweight parts, and has low magnetic loss such as low coercivity, and thus greatly facilitates the development of use as high performance/high efficiency parts.

Further, another object of the present invention is to provide an Fe-based soft magnetic alloy which may exhibit magnetic characteristics at a high level as the crystal phase is controlled, even though a component having a high unit price, such as a rare-earth element, is not included.

Furthermore, still another object of the present invention is to provide a method for manufacturing an Fe-based soft magnetic alloy in which magnetic characteristics to be exhibited are exhibited at a level which is equivalent to or more than those in the related art, even though the alloy is able to be produced more easily and in a large amount by easily controlling components of the Fe-based soft magnetic alloy.

In addition, yet another object of the present invention is to provide magnetic parts of various electric and electronic devices containing an Fe-based soft magnetic alloy according to the present invention, which may perform the energy supply and conversion functions excellently.

In order to solve the above-described problems, the present invention provides an Fe-based soft magnetic alloy represented by empirical formula $Fe_aB_bC_cCu_d$. However, in the empirical formula, a, b, c and d are atomic percent (at %) of the corresponding element and are respectively 78.5≤a≤86, 13.5≤b+c≤21 and 0.5≤d≤1.5.

According to one embodiment of the present invention, in the empirical formula, a may be 82 to 86 at %, a sum of b and c may be 13.5 to 17.5 at %, and a value according to the following Mathematical Formula 1 may be 0.38 to 28.5. Further, more preferably, the value according to the following Mathematical Formula 1 may be 0.65 to 16.1.

$$\frac{b}{c\sqrt{c}}$$ [Mathematical Formula 1]

In addition, in the empirical formula, according to a and d, a value according to the following Mathematical Formula 2 may be 2.92 to 3.70.

$$\sqrt[4]{\frac{a}{d}}$$ [Mathematical Formula 2]

Furthermore, in the empirical formula, c may be 1.0 to 4.0 at %.

Further, according to another embodiment of the present invention, in the empirical formula, a is 78.5 or more and less than 82.0 at %, a sum of b and c is more than 16.5 at % and 21 at % or less, and a value of the following Mathematical Formula 3 may be 0.67 or more, more preferably, 0.85 to 200.

$$\frac{5b}{c\sqrt{c}}$$ [Mathematical Formula 3]

In addition, in the empirical formula, according to a and d, a value of the following Mathematical Formula 4 may be 8.3 to 12.8.

$$\sqrt{\frac{a}{d}}$$ [Mathematical Formula 4]

Further, the Fe-based soft magnetic alloy may be amorphous or crystalline, or may have a heterogeneous atomic arrangement structure including both an amorphous region and a crystalline region.

Furthermore, in the Fe-based soft magnetic alloy having a heterogeneous atomic arrangement structure, the amorphous region and the crystalline region may have a volume ratio of 5.5:4.5 to 1:9.

Further, the crystals or the crystals of the heterogeneous atomic arrangement structure may be nanocrystal grains.

In addition, the Fe-based soft magnetic alloy may be an alloy in which some of one or more elements of Fe and B are not substituted with Si.

Furthermore, a form of the Fe-based soft magnetic alloy may be a powder-type, a ribbon-type, a flat plate-type, a doughnut-type, a cylinder-type, or a rod-type.

Further, the present invention provides an Fe-based soft magnetic alloy represented by empirical formula $Fe_aB_bC_cCu_d$ and containing nanocrystal grains having an average particle diameter of 30 nm or less. However, in the empirical formula, a, b, c and d are atomic percent (at %) of the corresponding element and are respectively 78.5≤a≤86, 13.5≤b+c≤21 and 0.5≤d≤1.5.

According to one embodiment of the present invention, the nanocrystal grains may have an average particle diameter of 16 to 25 nm.

In addition, the present invention provides an Fe-based soft magnetic alloy represented by empirical formula $Fe_aB_bC_cCu_d$ and containing α-Fe and metal compounds formed between Fe and at least one of B, C and Cu. However, in the empirical formula, a, b, c and d are atomic percent (at %) of the corresponding element and are respectively 78.5≤a≤86, 13.5≤b+c≤21 and 0.5≤d≤1.5.

According to one embodiment of the present invention, the metal compound may include an Fe—B compound and an Fe—C compound. Furthermore, the Fe—C compound may include one or more compounds of $Fe_3C$, $Fe_{93}C_7$ and $Fe_4C_{0.63}$.

In the Fe-based soft magnetic alloy, a crystallized area value according to the following Relationship Equation 1 may be 45 to 90%, more specifically, 53 to 83%.

[Relationship Equation 1]

Crystallized area value (%) =

$$\frac{\text{Area of crystlline region}}{\text{Area of crystlline region} + \text{Area of amorphous region}} \times 100$$

In this case, the area refers to an integral value for a crystalline region or an amorphous region measured during an X-ray diffraction (XRD) analysis of the Fe-based soft magnetic alloy at an angle (2θ) of 0 to 90°.

Further, the present invention provides a method for manufacturing an Fe-based soft magnetic alloy, the method including: manufacturing an Fe-based initial alloy represented by empirical formula $Fe_aB_bC_cCu_d$, where in the empirical formula, a, b, c and d are atomic percent (at %) of the corresponding element and are respectively 78.5≤a≤86, 13.5≤b+c≤21 and 0.5≤d≤1.5; and heat-treating the Fe-based initial alloy.

According to one embodiment of the present invention, the heat treatment may be carried out at a heat treatment temperature of 200 to 410° C. for 40 to 100 seconds, and may be carried more preferably at a heat treatment 280 to 410° C.

In addition, the heat treatment may be carried out at a heating rate of 90° C./min or less to the predetermined heat treatment temperature, and the heat rate may be more preferably 28 to 82° C./min.

Furthermore, the present invention provides an Fe-based soft magnetic alloy represented by empirical formula $X_aB_bC_cCu_d$, where in the empirical formula, X includes Fe and one or more elements of Co and Ni, and a, b, c and d are atomic percent (at %) of the corresponding element in the alloy and are respectively 78.5≤a≤86, 13.5≤b+c≤21 and 0.5≤d≤1.5.

According to one embodiment of the present invention, in the empirical formula, a may be 82 to 86 at %, a sum of b and c may be 13.5 to 17.5 at %, and a value according to the following Mathematical Formula 1 may be 0.38 to 28.5.

Further, more preferably, the value according to the following Mathematical Formula 1 may be 0.65 to 16.1.

$$\frac{b}{c\sqrt{c}}$$ [Mathematical Formula 1]

In addition, in the empirical formula, according to a and d, a value according to the following Mathematical Formula 2 may be 2.92 to 3.70.

$$\sqrt[4]{\frac{a}{d}}$$ [Mathematical Formula 2]

Furthermore, in the empirical formula, c may be 1.0 to 4.0 at %.

Further, according to another embodiment of the present invention, in the empirical formula, a is 78.5 or more and less than 82.0 at %, a sum of b and c is more than 16.5 at % and 21 at % or less, and a value of the following Mathematical Formula 3 may be 0.67 or more, more preferably, 0.85 to 200.

$$\frac{5b}{c\sqrt{c}}$$ [Mathematical Formula 3]

In addition, in the empirical formula, according to a and d, a value according to the following Mathematical Formula 4 may be 8.3 to 12.8.

$$\sqrt{\frac{a}{d}}$$ [Mathematical Formula 4]

Furthermore, X is expressed as $Fe_mCo_n$, where m and n are atomic percent (at %) of the corresponding element in X, 49≤m≤95 and 5≤n≤51, and more preferably, m and n may be 64≤m≤92 and 8≤n≤36. Further, a crystallized area value according to the following Relationship Equation 1 may be 50 to 78%.

[Relationship Equation 1]

Crystallized area value (%) = $\frac{\text{Area of crystlline region}}{\text{Area of crystlline region} + \text{Area of amorphous region}} \times 100$ In this case, the area refers to an integral value for a crystalline region or an amorphous region measured during an X-ray diffraction (XRD) analysis of the soft magnetic alloy at an angle (2θ) of 0 to 90°.

Alternatively, X is expressed as $Fe_pNi_q$, where p and q are atomic percent (at %) of the corresponding element in X and may be 70≤p≤99 and 1≤q≤30. More preferably, p and q may be 78≤p≤99 and 1≤q≤22. In addition, a crystallized area value according to the following Relationship Equation 1 may be 50 to 70%.

Furthermore, the present invention provides a method for manufacturing an Fe-based soft, the method including: manufacturing a soft magnetic initial alloy represented by empirical formula $X_aB_bC_cCu_d$, where in the empirical formula, X includes Fe and one or more elements of Co and Ni, and in the empirical formula, a, b, c and d are atomic percent (at %) of the corresponding element in the alloy and are respectively 78.5≤a≤86.0, 13.5≤b+c≤21 and 0.5≤d≤1.5; and heat-treating the soft magnetic initial alloy.

According to one embodiment of the present invention, the heat treatment may be carried out at a heat treatment temperature of 200 to 410° C. for 40 to 100 seconds, and may be carried out more preferably at a heat treatment temperature of 280 to 410° C.

Further, the heat treatment may be carried out at a heating rate of 90° C./min or less to the predetermined heat treatment temperature, and more preferably the heat treatment may be carried out at a heating rate of 28 to 90° C./min.

In addition, the present invention provides an electromagnetic wave shielding member including: the Fe-based soft magnetic alloy according to the present invention.

Furthermore, the present invention provides a magnetic core including: the Fe-based soft magnetic alloy according to the present invention.

Further, the present invention provides a magnetic core according to the present invention; and a coil part wound on the outside of the magnetic core.

Hereinafter, the terms used in the present invention will be described.

As a term used in the present invention, the term "initial alloy" refers to an alloy in a state where the alloy is not subjected to a separate treatment for the change of characteristics of the alloy, for example, a process such as heat treatment.

In addition, as a term used in the present invention, the term "high frequency" refers to a frequency band from several tens of kHz to several tens of MHz.

According to the present invention, as the Fe-based soft magnetic alloy has a high saturated magnetic flux density, excellent high frequency characteristics and low coercivity, the development of use as high performance/high efficiency small/lightweight parts is greatly facilitated. In addition, since manufacturing costs are very low and the components contained in an alloy are easily controlled in an alloy manufacturing process, thereby facilitating manufacture of the alloy so as to enable mass production, the present invention can be widely applied as magnetic parts of electric and electronic devices such as a high power laser, a high frequency power supply, a high-speed pulse generator, an SMPS, a high-pass filter, a low-loss high frequency transformer, a fast switch, wireless power transmission, and electromagnetic wave shield.

DETAILED DESCRIPTION OF THE DRAWINGS

Figure 1:
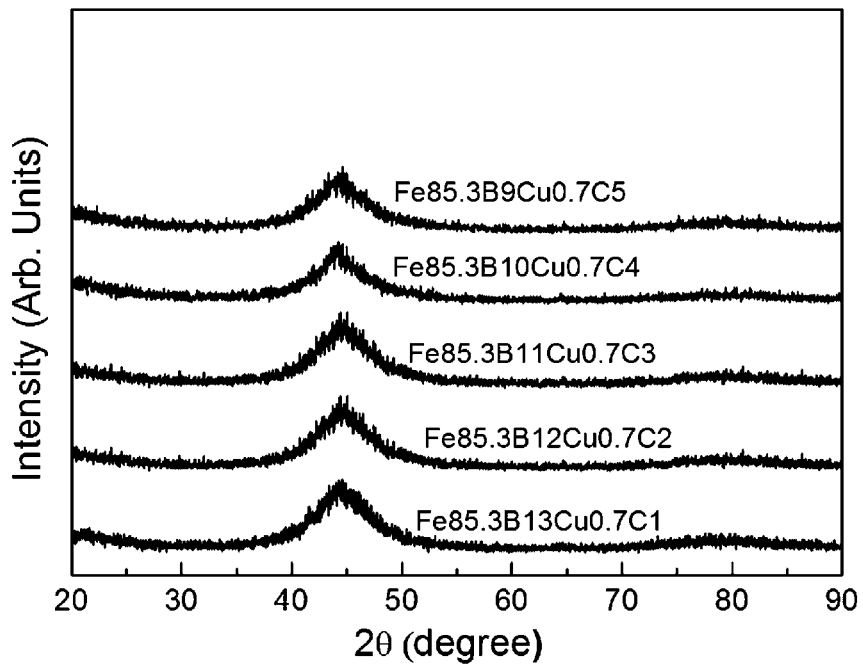
FIGS. 1 and 2 are XRD patterns in an initial alloy state before heat treatment of Fe-based soft magnetic alloys according to various embodiments of the present invention.

Hereinafter, embodiments of the present invention will be described in detail with reference to the accompanying drawings such that a person with ordinary skill in the art to which the present invention pertains can easily carry out the present invention. The present invention can be realized in various forms, and is not limited to the embodiments described herein.

An Fe-based soft magnetic alloy according to the present invention is an alloy represented by empirical formula $Fe_aB_bC_cCu_d$, and in the empirical formula, a, b, c and d are atomic percent (at %) of the corresponding element and respectively satisfy $78.5 \leq a \leq 86$, $13.5 \leq b+c \leq 21$ and $0.5 \leq d \leq 1.5$.

First, Fe is the main element of an alloy for exhibiting magnetism and is contained at 78.5 at % or more in the alloy in order to improve the saturated magnetic flux density. If Fe is contained at less than 78.5 at %, a saturated magnetic flux density at a target level may not be realized. Furthermore, Fe is contained at 86 at % or less in the alloy, and if Fe is contained at more than 86.0 at % in the alloy, it may be difficult to manufacture a crystal phase of an initial alloy in an amorphous phase during the rapid cooling of a liquid for manufacturing the initial alloy, and as crystals produced in the initial alloy interfere with the uniform crystal growth in a heat treatment process for changing characteristics and the size of the produced crystals is excessively increased, the magnetic loss such as an increase in coercivity may be increased.

Next, B and C in the empirical formula are elements having the amorphous forming ability, and the initial alloy may be formed in an amorphous phase through these elements. Further, the combination of the element C with the element B facilitates control of the particle size of α-Fe crystals to be produced as compared to the case of containing only the element B, and has an advantage in obtaining uniform α-Fe crystals during heat treatment by improving the thermal stability of the initial alloy. If the total sum of the element B and the element C is less than 13.5 at % in the alloy, the manufactured initial alloy may be crystalline, the crystal in the initial alloy make it difficult to uniformly grow crystals to be produced during heat treatment for changing magnetic characteristics, and crystals having coarse particle diameters may be contained, thereby increasing the magnetic loss. In addition, when the total sum of the element C and the element B in the alloy exceeds 21 at %, as the content of the element Cu to be described below needs to be further increased in order to manufacture an alloy of nanocrystal grains after heat treatment, the content of the element Fe in the alloy may be further relatively decreased, and accordingly, a saturated magnetic flux density at a target level may not be realized. In addition, Fe, in addition to α-Fe crystals, easily forms a compound with B and/or C, and as the amount of formed compound is increased, magnetic characteristics such as a saturated magnetic flux density may be decreased.

Next, in the empirical formula, Cu is an element that plays a role as a nucleation site for producing α-Fe crystals in an alloy, and thus allows an amorphous initial alloy to be easily realized as a nanocrystalline grain alloy. The element Cu allows crystals produced after heat treatment to be nanocrystal grains even though the crystal phase of an initial alloy of the element Cu is amorphous, and the element Cu may be contained at 0.5 to 1.5 at %, preferably 0.5 to 1.1 at % in the alloy in order to remarkably exhibit target physical properties. If the element Cu is contained at less than 0.5 at %, the resistivity of an alloy to be manufactured may be greatly decreased, so that a magnetic loss due to the eddy current may be increased, nanocrystal grains of α-Fe are not produced at a target level in the heat-treated alloy, and when crystals are produced, the particle diameter of the produced crystals may not be easily controlled. Furthermore, if the element Cu is contained at more than 1.5 at %, the crystal phase of the manufactured initial alloy may be crystalline, the already produced crystals in the initial alloy make the particle size of crystals to be produced during the heat treatment non-uniform, crystals grown to sizes at a target level or more may be included in the alloy, and accordingly, magnetic characteristics at a target level may not be exhibited, such as an increase in magnetic loss. Further, as the contents of the above-described elements Fe, B, and C are relatively decreased, the effects caused by the corresponding element may be decreased.

Meanwhile, an element Si contained in a typical Fe-based soft magnetic alloy is not contained in the composition of the Fe-based soft magnetic alloy according to the present invention. The element Si improves the amorphous forming ability of the Fe-based alloy and simultaneously helps to make the particle diameter of α-Fe crystals to be produced uniform. However, when Si is contained in the alloy, there is a problem in that the content of a metalloid other than Fe, for example, B, C, or Cu needs to be decreased or the content of Fe needs to be decreased, and a decrease in content of Fe makes it difficult to realize an Fe-based alloy having a high saturated magnetic flux density. Accordingly, the Fe-based alloy of the present invention realizes a high saturated magnetic flux density by increasing the content of the element Fe instead of including the element Si, but since the element Si is not included, it is very difficult to control the particle size of the crystals in the alloy, at the same time there is also a disadvantage in that the manufacture of an alloy having a uniform particle diameter is not very easy. In order to solve the disadvantage as described above, in the present invention, during heat treatment of an initial alloy manufactured by appropriately controlling the element B and the element C depending on the content of iron in the alloy, an Fe—C based compound may be produced at a suitable level, and as the element Si is not included through this, it is possible to achieve control of the particle size of the α-Fe crystals at a target level.

However, in the empirical formula, the relationship between a and the sum of the contents of b and c may vary at a boundary at which a, which is a content of iron, is 82 at %, and when a is 82 at % or more, that is, a is 82 to 86 at %, the sum of b and c is 13.5 to 17.5 at %, and a value according to the following Mathematical Formula 1 may be 0.38 to 28.5. In addition, in the empirical formula, when a is less than 82%, that is, a is 78.5 or more and less than 82.0 at %, the sum of b and c is more than 16.5 at % and 21 at %, and a value of the following Mathematical Formula 3 may be 0.67 or more.

First, describing when a is 82 to 86 at % in the empirical formula, if the sum of b and c exceeds 17.5 at % when a is 82 to 86 at %, the d value, which is the content of Cu, is relatively decreased, and as a result, even though an initial alloy to be manufactured is manufactured in an amorphous phase, it is difficult to produce small and uniform crystals during heat treatment of the manufactured initial alloy, and accordingly, there is a concern that the magnetic loss of the manufactured Fe-based soft magnetic alloy may be increased.

Furthermore, when a is 82 to 86 at %, the sum of b and c may be 13.5 to 17.5 at %, and simultaneously, a value according to the following Mathematic Formula 1 may be 0.38 to 28.5, and the crystal phase of an initial alloy manufactured through this is advantageously realized as an amorphous phase, and as the contents of intermetallic compounds formed between Fe and at least one element of B, C, and Cu and α-Fe among the crystals of the alloy produced after the heat treatment are appropriately adjusted, a large saturated magnetic flux density is exhibited, and simultaneously, a magnetic loss such as coercivity becomes small, so that high efficiency magnetic characteristics may be exhibited, and excellent magnetic characteristics may be exhibited at a high frequency.

$$\frac{b}{c\sqrt{c}} \qquad \text{[Mathematical Formula 1]}$$

If the value according to Mathematic Formula 1 is less than 0.38, the crystal phase of the manufactured initial alloy may be crystalline, and in this case, as coarse crystals are easily produced during heat treatment, the magnetic loss may be increased, and particularly, there is a concern that the magnetic loss is remarkably increased at a high frequency. Further, even though the initial alloy is not crystalline, it is possible to cause a deterioration in magnetic characteristics as the amount of the compound between Fe and C in the crystals produced after the heat treatment is excessively increased.

In addition, if the value according to Mathematical Formula 1 exceeds 28.5, it may be very difficult to control the heat treatment process as production of an Fe—B-based intermetallic compound in addition to the crystals of α-Fe during the heat treatment may be remarkably increased due to the deterioration in thermal stability of the initial alloy as the content of C is relatively greatly decreased as compared to B in the alloy, and since there is a problem in that the saturated magnetic flux density of the initial alloy or the alloy after the heat treatment may be increased, and it may be difficult to control the particle size of α-Fe crystals to be produced to a target level, a magnetic material containing α-Fe crystals having a uniform particle size may not be manufactured.

Meanwhile, the value according to Mathematical Formula 1 may be more preferably 0.65 to 16.1, and if the value according to Mathematical Formula 1 is less than 0.65, it is impossible to form the amorphous phase, and accordingly, there is a concern that characteristics of the soft magnetic material are lost.

Furthermore, when the value according to Mathematical Formula 1 exceeds 16.1, it may be difficult to manufacture the initial alloy in an amorphous phase, and even when the initial alloy is realized in the amorphous phase, crystals produced after heat treatment may be coarse, and characteristics of the soft magnetic material may be lost.

Further, when a is 82 to 86 at %, the element C may be contained at 1 to 4 at % in the alloy.

If the element C is contained at 1 at % or less in the alloy, it is difficult to manufacture the initial alloy in an amorphous phase, and when the above-described element B is increased for this purpose, it is possible to cause a secondary problem in that the thermal stability of the initial alloy deteriorates. In addition, it becomes difficult to control the particle size of α-Fe crystals to be produced during heat treatment of the manufactured initial alloy, so that a magnetic material having α-Fe crystals having a uniform particle size may not be manufactured. Furthermore, if the element C is contained at more than 4 at % in the alloy, the content of B is relatively decreased, so that there are problems in that α-Fe crystals having a particle diameter of 30 nm or more may be produced in the initial alloy, and the crystals of the aforementioned initial alloy make it difficult to control the particle size of the α-Fe crystals in the heat treatment process. Further, an intermetallic compound between Fe and C may be produced in the initial alloy, so that the amount of α-Fe crystals to be produced during the heat treatment in the alloy may be smaller than a target level.

In addition, as the magnetic loss is increased due to an increase in coercivity, magnetic characteristics at a target level are not exhibited, so that it may be difficult to apply the alloy to a miniaturized magnetic material.

Furthermore, when a is 82 to 86 at %, in the empirical formula, according to a and d, a value according to the following Mathematical Formula 2 may be 2.92 to 3.70, the initial alloy may be amorphous through this, and crystals produced after the heat treatment of the initial alloy are advantageous in being nanocrystal grains and simultaneously having a uniform particle size distribution. If a value according to the following Mathematical Formula 2 is less than 2.92, crystals are produced in the initial alloy, so that it becomes difficult to obtain crystals having a uniform particle size after the heat treatment, coarse crystals may be produced, and accordingly, magnetic characteristics at a target level may not be exhibited, such as a possibility of increasing the magnetic loss. Further, when a value according to the following Mathematical Formula 2 exceeds 3.70, the resistivity of an alloy to be manufactured may be greatly decreased, so that a magnetic loss due to the eddy current may be increased, nanocrystal grains of α-Fe are not produced at a target level in the heat-treated alloy, and when crystals are produced, the particle diameter of the produced crystals may not be easily controlled.

$$\sqrt[4]{\frac{a}{d}}$$ [Mathematical Formula 2]

Next, the case where a is 78.5 or more and less than 82.0 at % in the empirical formula will be described. When a is 78.5 or more and less than 82.0 at %, the sum of b and c is more than 16.5 at % and 21 at % or less, and if the sum of b and c is 16.5 at % or less, the initial alloy may be crystalline, crystals already produced in the initial alloy allow the particle size of crystals to be produced during the heat treatment to be non-uniform, the crystals grown to a size at a target level or more may be contained in the alloy, and accordingly, magnetic characteristics at a target level may not be exhibited, such as an increase in magnetic loss. Further, as the contents of the above-described elements Fe, B, and C are relatively decreased, the effects caused by the corresponding element may be decreased.

In addition, a value according to the following Mathematical Formula 3 may be 0.67 or more, more preferably, 0.85 to 200, an initial alloy manufactured through this is advantageously amorphous, the particle size of crystals to be produced after the heat treatment is uniform, and the content of α-Fe and the content of an intermetallic compound between Fe and B or C may be appropriately maintained, so that even though the content of Fe is a little low, excellent magnetic characteristics may be exhibited through low coercivity.

$$\frac{5b}{c\sqrt{c}}$$ [Mathematical Formula 3]

If the value of Mathematical Formula 3 is less than 0.67, the content of the compound between Fe and C in the initial alloy or the alloy after the heat treatment may be sharply increased, it may be difficult to produce crystals having a uniform particle size distribution after the heat treatment, and accordingly, magnetic characteristics may be inhibited by causing a decrease in saturated magnetic flux density and/or an increase in coercivity. However, if the value of Mathematical Formula 3 exceeds 200, it may be very difficult to control the heat treatment process as production of an Fe—B-based intermetallic compound in addition to the crystals of α-Fe may be remarkably increased during the heat treatment due to the deterioration in thermal stability of the initial alloy, and there is a problem in that the saturated magnetic flux density of the initial alloy or the alloy after the heat treatment may be decreased or the magnetic loss may be increased, and since it is difficult to control the particle size of α-Fe crystals to be produced to a target level, it may be difficult to produce α-Fe crystals having a uniform particle size.

Furthermore, when a is 78.5 or more and less than 82.0 at %, in the empirical formula, according to a and d, a value of the following Mathematical Formula 4 may be 8.3 to 12.8. Through this, the initial alloy may be in an amorphous phase, and crystals produced after the heat treatment of the initial alloy are advantageous in being nanocrystal grains and simultaneously having a uniform particle size distribution. If a value according to the following Mathematical Formula 4 is less than 8.3, there is a concern that crystals are produced in the initial alloy, it becomes difficult to obtain crystals having a uniform particle size after the heat treatment, coarse crystals may be produced, and accordingly, magnetic characteristics at a target level may not be exhibited, such as a possibility of increasing the magnetic loss. Further, when a value according to the following Mathematical Formula 4 exceeds 12.8, the resistivity of an alloy to be manufactured is greatly decreased even though a manufactured initial alloy is manufactured in an amorphous phase, so that the magnetic loss due to the eddy current may be increased, and when nanocrystal grains of α-Fe are not produced at a target level in the heat-treated alloy and crystals are produced, the particle diameter of the produced crystals is not easily controlled, so that it may be difficult to produce uniform crystals having a small particle diameter, and accordingly, there is a concern that the magnetic loss of the manufactured Fe-based soft magnetic alloy may be increased.

$$\sqrt{\frac{a}{d}}$$ [Mathematical Formula 4]

The above-described Fe-based soft magnetic alloy according to one embodiment of the present invention may have a crystal phase which is amorphous or crystalline, or may have a heterogeneous atomic arrangement structure including both an amorphous region and a crystalline region.

In this case, the Fe-based soft magnetic alloy having the amorphous phase may be an initial alloy which is not heat-treated. In addition, the Fe-based soft magnetic alloy having the crystalline phase may be an alloy after heat treatment of an initial alloy, the crystalline phase may be nanocrystal grains, and the nanocrystal grains may have an average particle diameter of 30 nm or less, preferably 25 nm or less, more preferably 22 nm or less, and even more preferably 16 to 22 nm. Furthermore, the heterogeneous atomic arrangement structure may be a structure in the initial alloy or the alloy after the heat treatment.

In this case, when the heterogeneous atomic arrangement structure is in the initial alloy state, the crystalline compound may have fine particle diameters with an average particle diameter of 10 nm or less. Further, when the heterogeneous atomic arrangement structure is in the alloy state after the heat treatment, the crystalline phase may be nanocrystal grains, and the nanocrystal grains may have an average particle diameter of 30 nm or less, preferably 25 nm or less, and more preferably 16 and 22 nm or less.

When the Fe-based soft magnetic alloy according to one embodiment of the present invention has a heterogeneous atomic arrangement structure, the amorphous region and the crystalline region may have a volume ratio of 5.5:4.5 to 1:9. If the amorphous region and the crystalline region have a volume ratio of more than 5.5:4.5, and as a result, the amorphous region is present in a larger volume, target magnetic characteristics such as a saturated magnetic flux density at a target level may not be exhibited. Further, if the amorphous region and the crystalline region have a volume ratio of less than 1:9, and as a result, the crystalline region is present in a larger volume, production of crystals of the compounds other than the α-Fe crystals among the produced crystals may be increased, and target magnetic characteristics may not be exhibited.

The form of the above-described Fe-based soft magnetic alloy in a state before heat treatment may be a powder, a strip, or a ribbon, but is not limited thereto, and may be appropriately modified in consideration of the form of a final magnetic material, heat treatment process, and the like. In addition, the form of the Fe-based soft magnetic alloy after the heat treatment may be a ribbon-type or rod-type, and the cross-section of the rod-type may be polygonal, circular, or elliptical, but is not limited thereto.

Meanwhile, an Fe-based soft magnetic alloy represented by empirical formula $Fe_aB_bC_cCu_d$ according to another embodiment of the present invention contains nanocrystal grains having an average particle diameter of 30 nm or less, and in the empirical formula, a, b, c and d are atomic percent (at %) of the corresponding element and respectively satisfy $78.5 \leq a \leq 86$, $13.5 \leq b+c \leq 21$ and $0.5 \leq d \leq 1.5$.

In the empirical formula $Fe_aB_bC_cCu_d$, the description on each element and the content thereof is the same as that described above. The Fe-based alloy having the aforementioned empirical formula and including nanocrystal grains may be an Fe-based alloy which is manufactured by using the amorphous initial alloy, and crystals produced after the heat treatment have an average particle diameter of 30 nm or less. If the nanocrystal grains have an average particle diameter of more than 30 nm, all the target magnetic characteristics such as an increase in coercivity may not be satisfied. The nanocrystal grains may have an average particle diameter of preferably 25 nm or less, and more preferably, 16 to 22 nm.

Meanwhile, an Fe-based soft magnetic alloy represented by empirical formula $Fe_aB_bC_cCu_d$ according to still another embodiment of the present invention contains α-Fe and metal compounds formed between Fe and at least one element of B, C, and Cu, and in the empirical formula, a, b, c and d are atomic percent (at %) of the corresponding element and are respectively $78.5 \leq a \leq 86$, $13.5 \leq b+c \leq 21$ and $0.5 \leq d \leq 1.5$.

In the empirical formula $Fe_aB_bC_cCu_d$, the description on each element and the content thereof is the same as that described above. The Fe-based alloy contains metal compounds formed between Fe and at least one element of B, C, and Cu in addition to α-Fe, and may be an Fe-based alloy in which the particle diameters of the crystals are controlled at a target level through the aforementioned metal compound. That is, the compound between Fe produced in a predetermined content and another metalloid in the alloy serves as a barrier which prevents α-Fe from exceeding a target particle diameter and becoming coarse, and thus an Fe-based alloy containing α-Fe with a more uniform particle diameter distribution may be realized.

The α-Fe and the metal compounds are contained at a suitable ratio, and through this, the particle diameter of α-Fe produced may be uniformly controlled at a target level, and coarse α-Fe may be suppressed from being produced. In addition, there is an advantage in that uniformity of the realized alloy is improved.

The metal compounds formed between Fe and at least one element of B, C and Cu may include one or more of an Fe—B compound and an Fe—C compound. However, as an Fe-based alloy containing an Fe—B compound may be thermally inferior to an Fe-based compound containing an Fe—C compound, and may be a metal in which the content of α-Fe in the produced crystals is low, there are problems in that a uniform alloy may not be manufactured, and all the target physical properties may not be exhibited. Accordingly, more preferably, an Fe—C compound may be included as a metal compound, and through this, the thermal stability of the alloy may be improved, thereby facilitating manufacture of an alloy having more uniform α-Fe. The Fe—C compound may include one or more of $Fe3C$, $Fe_{93}C_7$ and $Fe_4C_{0.63}$.

Furthermore, according to one embodiment of the present invention, in the Fe-based soft magnetic alloy, a crystallized area value according to the following Relationship Equation 1 may be 45 to 90%, more specifically, 53 to 83%.

[Relationship Equation 1]

$$\text{Crystallized area value (\%)} = \frac{\text{Area of crystlline region}}{\text{Area of crystlline region} + \text{Area of amorphous region}} \times 100$$

In this case, the area refers to an integral value for a crystalline region or an amorphous region measured during an X-ray diffraction (XRD) analysis of the Fe-based soft magnetic alloy at an angle $(2\theta)$ of 0 to 90°.

As crystals of α-Fe and a compound between Fe and another metal, for example, an Fe—C-based compound, are produced at an appropriate ratio by satisfying the crystallized area value to be 45 to 90%, it may be more advantageous for satisfying target physical properties. If the crystallized area value is less than 45%, there is a concern that it may be difficult to exhibit excellent magnetic characteristics due to the low saturated magnetic flux density, and magnetic characteristics may be changed at the time of manufacturing magnetic parts by using the alloy. Further, if the crystallized area value exceeds 90%, production of crystals of a compound between different metals such as an Fe—C-based compound is greatly increased, so that the saturated magnetic flux density may be lowered and the magnetic loss such as coercivity may be increased, and as a result, physical properties at a target level may not be exhibited.

The above-described Fe-based soft magnetic alloy according to one embodiment of the present invention may have a saturated magnetic flux density of 1.5 T or more in an initial alloy state, and a saturated magnetic flux density of 1.71 or more after appropriate heat treatment, and may have a coercivity of 500 A/m or less, more preferably 250 A/m or less, and even more preferably 185 A/m or less, which may be appropriate for making parts smaller due to the low magnetic loss.

The above-described Fe-based soft magnetic alloy included in one embodiment of the present invention may be manufactured by a manufacturing method to be described below, but the method is not limited thereto.

The Fe-based initial alloy included in one embodiment of the present invention may be manufactured by melting an Fe-based alloy forming composition or Fe-based master alloy in which base materials containing each element are weighed and mixed so as to satisfy the empirical formula of the above-described Fe-based alloy, and then rapidly cooling and solidifying the melt. The form of the Fe-based initial alloy to be manufactured may vary depending on the specific method used during the rapid cooling and solidification. The method used in the rapid cooling and solidification may employ a typical publicly-known method, and thus is not particularly limited thereto in the present invention. However, non-limiting examples of the rapid cooling and solidification include an atomizing method in which the melted Fe-based master alloy or Fe-based alloy forming composition is manufactured in a powder phase through a high pressure gas (for example, Ar, $N_2$, He, and the like) and/or high pressure water which is sprayed, a centrifugal method in which the melted metal is manufactured in a powder phase by using a rapidly rotating disk, a melt spinning method in which a ribbon is manufactured by a roll rotating at a fast speed, and the like. The form of the Fe-based initial alloy formed through these methods may be a powder, a strip, and a ribbon. In addition, the atomic arrangement in the Fe-based initial alloy may be in an amorphous phase.

Meanwhile, the form of the Fe-based initial alloy may also be bulk. When the form of the Fe-based initial alloy is bulk, a powder of an amorphous Fe-based alloy formed by the above-described methods may be manufactured as a bulk amorphous alloy through a typically known method, for example, a coalescence method, a solidification method, and the like. As a non-limiting method of the coalescence method, a method such as shock consolidation, explosive forming, powder sintering, and hot extrusion and hot rolling may be used. Among them, when describing the shock consolidation method, in the shock consolidation method, by adding a shock wave to a powder alloy polymer, a wave is transmitted along the particle boundary and energy is absorbed at the particle interface, and in this case, the absorbed energy may form a fine melt layer on the surface of the particle, thereby producing a bulk amorphous alloy. In this case, the produced melt layer needs to be sufficiently rapidly cooled such that the amorphous state may be maintained through heat transfer to the inside of the particle.

It is possible to manufacture a bulk amorphous alloy having a packing density which is up to 99% of the inherent density of the amorphous alloy through this method, and there is an advantage in that sufficient mechanical characteristics may be obtained. Furthermore, the hot extrusion and hot rolling method is a method using the fluidity of an amorphous alloy, and may manufacture a bulk amorphous alloy having a sufficient density and sufficient strength by heating an amorphous alloy powder to a temperature near Tg, rolling the powder, roll-molding the powder, and then rapidly cooling the resulting product. Meanwhile, examples of the solidification method include a copper alloy mold casting method, high pressure die casting, arc melting, unidirectional melting, squeeze casting, strip casting, and the like, and since the respective methods may employ publicly known methods and conditions, the method is not limited thereto in the present invention. As an example, the copper alloy mold casting method is a method which uses a suction method of injecting a melt into the inside of a copper mold having a high cooling ability by using the pressure difference between the inside and outside of the mold in the copper mold or a pressurization method of injecting a melt into a copper mold by externally applying a predetermined pressure, and the melt injected into the copper mold at a fast speed by pressurization or suction may be solidified at a high speed, thereby manufacturing an Fe-based initial alloy which is amorphous in a predetermined bulk form.

Next, heat treatment may be carried out on the manufactured Fe-based initial alloy.

The heat treatment is a step of transforming an atomic arrangement of an Fe-based initial alloy from amorphous to crystalline, and nanocrystal grains containing α-Fe may be produced through the heat treatment.

However, as the size of crystals generated by the temperature, the heating rate and/or the treatment time, and the like to be heat-treated in the second step may be grown at a target level or more, the adjustment of the heat treatment conditions is very important in the control of the crystal particle diameter. In particular, since the composition of the Fe-based initial alloy according to the present invention does not contain elements such as Nb which is responsible for the function of the barrier capable of preventing the growth of the size of crystals, under the typical heat treatment conditions, it may be very difficult to control the particle diameter of the nanocrystal grains so as to be, for example, 30 nm or less, preferably 25 nm or less, and it may be difficult to achieve mass production.

Specifically, the heat treatment may be carried out at a heat treatment temperature of 200 to 410° C., more preferably 280 to 410° C. for 40 to 100 seconds, the heat treatment conditions may vary depending on the composition, but when the heat treatment temperature is less than 200° C., nanocrystal grains may not be produced, or may be produced in a small amount, and in this case, an Fe-based soft magnetic alloy having low magnetic characteristics may be manufactured. Further, it the heat treatment temperature exceeds 410° C., the particle diameter of crystals produced in the alloy may become coarse, and the particle diameter distribution of crystals to be produced becomes very broad, so that the uniformity of the particle diameters deteriorates and crystals of a compound between Fe and another metal in addition to α-Fe are excessively produced, and as a result, the Fe-based alloy which is uniform nanocrystalline α-Fe may not be obtained.

In addition, according to one embodiment of the present invention, the heating rate to the heat treatment temperature also greatly affects the control of the particle diameter of nanocrystal grains to be produced, and for example, the heating rate from room temperature to the heat treatment temperature may be 90° C./min or less, more preferably 28 to 80° C./min or less. Typically, when the heating rate in a heat treatment process for transforming the alloy from an amorphous alloy to a crystalline alloy is a fast heating rate, for example, 100° C./min or more, it is known that crystals of a small and uniform particle diameter are obtained, but in the case of the Fe-based alloy according to the present invention, unlike the typical tendency, only when the heat treatment is carried out at a target heat treatment temperature after slowly heating the alloy at a heating rate of 90° C./min or less, is it advantageous in that crystals to be produced are uniformly produced so as to be close to the average particle diameter. If the heating rate to the temperature during the heat treatment exceeds 90° C./min, there is a problem in that the particle size distribution of crystals to be produced may not be controlled at a target level. However, when the heating rate is too low, the time taken for the heat treatment process may be prolonged, and as the time for the production and growth of the crystals is prolonged, the crystals may become coarse.

Meanwhile, when describing the fast heating rate in more detail, the case where the heating rate is high may be helpful for production of uniform particle diameter, but the Fe-based soft magnetic alloy according to the present invention does not contain an element which helps production of uniform nanocrystal grains, such as an element Si, or an element Nb, and the like which perform the role of a barrier for crystal growth, so that it may not be very easy to control the particle diameter. Accordingly, the heating at 90° C./min or less may be advantageous as compared to the heating at high temperature, and as the compound between Fe and C is produced in a suitable content and the size of α-Fe crystals is controlled, it is advantageous in manufacturing α-Fe having a target uniform particle diameter. Furthermore, as the heating at low temperature is carried out, the heating at low temperature may be more suitable for mass production, and there is a benefit of reducing manufacturing costs.

Further, the time for carrying out the heat treatment at the heat treatment temperature in the second step may be 40 to 100 seconds. The heat treatment time may be changed depending on the heat treatment temperature to be used, but there are problems in that if the heat treatment is carried out for less than 40 seconds, transformation to crystalline at a target level may not be achieved, and if the heat treatment is carried out for more than 100 seconds, the grain diameter of crystals to be produced is coarse.

Meanwhile, the second step may also be carried out by adding pressure and/or a magnetic field in addition to heat. Through the additional treatment as described above, it is possible to produce crystals having magnetic anisotropy in one specific direction. In this case, the degree of pressure or magnetic field to be applied may vary depending on the degree of a target physical property, and thus is not particularly limited in the present invention, and the additional treatment may be carried out by employing publicly known conditions.

Meanwhile, the Fe-based soft magnetic alloy according to another embodiment of the present invention is an alloy represented by empirical formula $X_aB_bC_cCu_d$, and a, b, c and d are atomic percent (at %) of the corresponding element in the alloy and are respectively $78.5 \leq a \leq 86.0$, $13.5 \leq b+c \leq 21$ and $0.5 \leq d \leq 1.5$.

X includes one or more elements of Co and Ni, and Fe. These elements are main elements of an alloy for exhibiting magnetism, and X is contained in the alloy at 78.5 at % or more in order to improve the saturated magnetic flux density. If X is contained at less than 78.5 at %, a saturated magnetic flux density at a target level may not be realized. Furthermore, X is contained at 86 at % or less in the alloy, and if X is contained at more than 86.0 at % in the alloy, it may be difficult to manufacture a crystal phase of an initial alloy as an amorphous phase during the rapid cooling of a liquid for manufacturing the initial alloy, and as crystals produced in the initial alloy interfere with the uniform crystal growth in a heat treatment process for changing characteristics and the size of the produced crystals is excessively increased, the magnetic loss such as an increase in coercivity may be increased.

In the soft magnetic alloy according to one embodiment of the present invention, X may be expressed as $Fe_mCo_n$, and in this case, m and n are atomic percent (at %) of the corresponding element in X and may respectively satisfy $49 \leq m \leq 95$ and $5 \leq n \leq 51$, more preferably, $64 \leq m \leq 92$ and $8 \leq n \leq 36$. That is, when Co among Co and Ni is contained along with Fe as an element for exhibiting magnetism, there are advantages in that the soft magnetism and corrosion resistance of an alloy to be manufactured may be simultaneously improved, high frequency characteristics may be improved at a frequency band of 100 MHz or less, magnetostriction is reduced, and as a result, the mechanical oscillations and the noise generation caused by the mechanical oscillations may be reduced, and the generation of an eddy current may be decreased. Further, there are advantages in that it is possible to more easily form an amorphous alloy with the elements B, C, and Cu and more easily manufacture a nanocrystalline alloy with a uniform particle diameter, a saturated magnetic flux density at a target level may be realized, and the iron loss through low coercivity may be reduced. If m in X is less than 50 at %, a saturated magnetic flux density at a target level may not be realized, and due to an increase in content of Co, manufacturing costs may be increased, or the coercivity may be increased. In addition, if m in X exceeds 95 at %, the magnetostriction of the alloy is increased, so that the oscillations and the noise caused by the oscillations may be increased, high frequency characteristics may deteriorate, and there may be a heat generation problem caused by an eddy current.

Meanwhile, in still another embodiment of the present invention, X is expressed as $Fe_pNi_q$, and p and q are atomic percent (at %) of the corresponding element in X and may be respectively $70 \leq p \leq 99$ and $1 \leq q \leq 30$, more preferably, $78 \leq p \leq 99$ and $1 \leq q \leq 22$. That is, Ni is contained along with Fe as an element for exhibiting magnetism, and there are advantages in that by lowering the coercivity of the soft magnetic alloy through this to decrease the magnetic loss, excellent magnetic characteristics may be exhibited and oxidation of Fe may be prevented.

If p in X is less than 72 at %, the coercivity may be lowered, but a saturated magnetic flux density at a target level may not be realized. In addition, when p in X exceeds 99 at %, an effect of decreasing the coercivity of the alloy through Ni may be insignificant.

Next, B and C in the empirical formula are elements having the amorphous forming ability, and the initial alloy may be formed in an amorphous phase through these elements. Furthermore, the combination of the element C with the element B facilitates control of the particle size of α-Fe, FeCo and FeNi crystals to be produced as compared to the case of containing only the element B, and has an advantage in obtaining uniform α-Fe, FeCo and FeNi crystals during heat treatment by improving the thermal stability of the initial alloy. If the total sum of the element B and the element C is less than 13.5 at % in the alloy, the manufactured initial alloy may be crystalline, the crystals in the initial alloy make it difficult to uniformly grow crystals produced during heat treatment for changing magnetic characteristics, and crystals having coarse particle diameters may be contained, thereby increasing the magnetic loss. Further, when the total sum of the element C and the element B in the alloy exceeds 21 at %, as the content of the element Cu to be described below needs to be further increased in order to manufacture an alloy of nanocrystal grains after heat treatment, the content of the element X for exhibiting magnetism in the alloy may be further relatively decreased, and accordingly, a saturated magnetic flux density at a target level may not be realized. In addition, any one element belonging to X in addition to α-Fe, FeCo and FeNi crystals easily forms a compound with B and/or C, and as the amount of formed compound is increased, magnetic characteristics such as a saturated magnetic flux density may be decreased.

Next, in the empirical formula, Cu is an element that plays a role as a nucleation site for producing α-Fe, FeCo and FeNi crystals in an alloy, and thus allows an amorphous initial alloy to be easily realized as a nanocrystalline grain alloy. The element Cu allows crystals produced after heat treatment to be nanocrystal grains even though the crystal phase of an initial alloy of the element Cu is amorphous, and the element Cu may be contained at 0.5 to 1.5 at %, preferably 0.5 to 1.1 at % in the alloy in order to remarkably exhibit target physical properties. If the element Cu is contained at less than 0.5 at %, the resistivity of an alloy to be manufactured may be greatly decreased to increase a magnetic loss due to the eddy current, nanocrystal grains of α-Fe are not produced at a target level in the heat-treated alloy, and when crystals are produced, the particle diameter of the produced crystals may not be easily controlled. Furthermore, if the element Cu is contained at more than 1.5 at %, the crystal phase of the manufactured initial alloy may be crystalline, the already produced crystals in the initial alloy make the particle size of crystals to be produced during the heat treatment non-uniform, crystals grown to sizes at a target level or more may be contained in the alloy, and accordingly, magnetic characteristics at a target level may not be exhibited, such as an increase in magnetic loss. Further, as the contents of the above-described elements X, B, and C are relatively decreased, the effects caused by the corresponding element may be decreased.

Meanwhile, the element Si usually contained in a typical soft magnetic alloy is not contained in the composition of the Fe-based soft magnetic alloy according to the present invention. The element Si improves the amorphous forming ability of the soft magnetic alloy and simultaneously helps to make the particle diameter of α-Fe, FeCo and FeNi crystals to be produced uniform. However, when Si is contained in the alloy, there is a problem in that the content of a metalloid for example, B, C, or Cu needs to be decreased or the content of Fe needs to be decreased, and a decrease in content of X makes it difficult to realize a soft magnetic alloy having a high saturated magnetic flux density. Accordingly, the soft magnetic alloy of the present invention realizes a high saturated magnetic flux density by increasing the content of an X element including Fe instead of including the element Si, but since the element Si is not included, and thus it is very difficult to control the particle size of the crystals in the alloy, at the same time, there is also a disadvantage in that the manufacture of an alloy having a uniform particle diameter is not very easy. In order to solve the disadvantage as described above, in the present invention, during heat treatment of an initial alloy manufactured by appropriately controlling the element B and the element C depending on the content of iron in the alloy, an Fe—C based compound may be produced at a suitable level, and as the element Si is not included through this, it is possible to achieve control of the particle size of the α-Fe, FeCo and FeNi crystals at a target level.

However, in the empirical formula, the relationship between a and the sum of the contents of b and c may vary at a boundary at which a, which is a content of X including Fe, is 82 at %, and when a is 82 at % or more, that is, a is 82 to 86 at %, the total of b and c is 13.5 to 17.5 at %, and a value according to the following Mathematical Formula 1 may be 0.38 to 28.5. In addition, in the empirical formula, when a is less than 82%, that is, a is 78.5 or more and less than 82.0 at %, the sum of b and c is more than 16.5 at % and 21 at % or less, and a value of the following Mathematical Formula 3 may be 0.67 or more.

First, describing when a is 82 to 86 at % in the empirical formula, if the sum of b and c exceeds 17.5 at % when a is 82 to 86 at %, the d value, which is the content of Cu, is relatively decreased, and as a result, even though an initial alloy to be manufactured is manufactured in an amorphous phase, the particle size is small and it is difficult to produce uniform crystals during heat treatment of the manufactured initial alloy, and accordingly, there is a concern that the magnetic loss of the manufactured soft magnetic alloy may be increased.

Furthermore, when a is 82 to 86 at %, the sum of b and c may be 13.5 to 17.5 at %, and simultaneously, a value according to the following Mathematic Formula 1 may be 0.38 to 28.5, and the crystal phase of an initial alloy manufactured through this is advantageously realized as an amorphous phase, and as the contents of intermetallic compounds formed between any one element belonging to X and at least one element of B, C, and Cu and α-Fe, FeCo and FeNi crystals among the crystals of the alloy produced after heat treatment are appropriately adjusted, a large saturated magnetic flux density is exhibited, and simultaneously, a magnetic loss such as coercivity becomes small, so that high efficiency magnetic characteristics may be exhibited, and excellent magnetic characteristics may be exhibited at a high frequency.

$$\frac{b}{c\sqrt{c}} \qquad \text{[Mathematical Formula 1]}$$

If the value according to Mathematic Formula 1 is less than 0.38, the crystal phase of the manufactured initial alloy may be crystalline, and in this case, as coarse crystals are easily produced during heat treatment, the magnetic loss may be increased, and particularly, there is a concern that the magnetic loss is remarkably increased at a high frequency. Further, even though the initial alloy is not crystalline, it is possible to cause a deterioration in magnetic characteristics as the amount of the metal compound between any one element belonging to X and C in the crystals produced after the heat treatment is excessively increased.

In addition, if the value according to Mathematical Formula 1 exceeds 28.5, it may be very difficult to control the heat treatment process as production of a metal compound between any one element belonging to X and B in addition to the crystals of α-Fe, FeCo and/or FeNi during the heat treatment may be remarkably increased due to the deterioration in thermal stability of the initial alloy as the content of C is relatively greatly decreased as compared to B in the alloy, and since there is a problem in that the saturated magnetic flux density of the initial alloy or the alloy after the heat treatment may be increased, and it may be difficult to control the particle size of α-Fe, FeCo and/or FeNi crystals to be produced to a target level, a magnetic material containing crystals having a uniform particle size may not be manufactured.

Meanwhile, the value according to Mathematical Formula 1 may be more preferably 0.65 to 16.1, and if the value according to Mathematical Formula 1 is less than 0.65, it is impossible to form the amorphous phase, and accordingly, there is a concern that characteristics of the soft magnetic material are lost.

Furthermore, when the value according to Mathematical Formula 1 exceeds 16.1, it may be difficult to manufacture the initial alloy in an amorphous phase, and even when the initial alloy is realized in the amorphous phase, crystals produced after heat treatment may be coarse, and characteristics of the soft magnetic material may be lost.

Further, when a is 82 to 86 at %, the element C may be contained at 1 to 4 at % in the alloy. If the element C is contained at 1 at % or less in the alloy, it is difficult to manufacture the initial alloy in an amorphous phase, and when the above-described element B is increased for this purpose, it is possible to cause a secondary problem in that the thermal stability of the initial alloy deteriorates. In addition, it becomes difficult to control the particle size of α-Fe crystals to be produced during heat treatment of the manufactured initial alloy, so that a magnetic material having α-Fe, FeCo and/or FeNi crystals having a uniform particle size may not be manufactured. Furthermore, if the element C is contained at more than 4 at % in the alloy, the content of B is relatively decreased, so that there are problems in that α-Fe, FeCo and/or FeNi crystals having a particle diameter of 30 nm or more may be produced in the initial alloy, and the crystals of the aforementioned initial alloy make it difficult to control the particle size of the α-Fe, FeCo and/or FeNi crystals in the heat treatment process. Further, an intermetallic compound between any one element belonging to X and C may be produced in the initial alloy, so that the amount of α-Fe, FeCo and/or FeNi crystals to be produced during the heat treatment in the alloy may be smaller than a target level. In addition, as the magnetic loss is increased due to an increase in coercivity, magnetic characteristics at a target level are not exhibited, so that it may be difficult to apply the alloy to a miniaturized magnetic material.

Furthermore, when a is 82 to 86 at %, in the empirical formula, according to a and d, a value according to the following Mathematical Formula 2 may be 2.92 to 3.70, the initial alloy may be amorphous through this, and crystals produced after the heat treatment of the initial alloy are advantageous in being nanocrystal grains and simultaneously having a uniform particle size distribution. If a value according to the following Mathematical Formula 2 is less than 2.92, crystals are produced in the initial alloy, so that it becomes difficult to obtain crystals having a uniform particle size after the heat treatment, coarse crystals may be produced, and accordingly, magnetic characteristics at a target level may not be exhibited, such as a possibility of increasing the magnetic loss. Further, when a value according to the following Mathematical Formula 2 exceeds 3.70, the resistivity of an alloy to be manufactured may be greatly decreased, so that a magnetic loss due to the eddy current may be increased, nanocrystal grains of α-Fe, FeCo and/or FeNi crystals are not produced at a target level in the heat-treated alloy, and when crystals are produced, the particle diameter of the produced crystals may not be easily controlled.

$$\sqrt[4]{\frac{a}{d}} \qquad \text{[Mathematical Formula 2]}$$

Next, the case where a is 78.5 and less than 82.0 at % in the empirical formula will be described. When a is 78.5 and less than 82.0 at %, the sum of b and c is more than 16.5 at % and 21 at %, and if the sum of b and c is 16.5 at % or less, the initial alloy may be crystalline, crystals already produced in the initial alloy allow the particle size of crystals to be produced during the heat treatment to be non-uniform, the crystals grown to a size at a target level or more may be contained in the alloy, and accordingly, magnetic characteristics at a target level may not be exhibited, such as an increase in magnetic loss. Further, as the contents of the above-described elements X, B, and C are relatively decreased, the effects caused by the corresponding element may be decreased.

In addition, a value according to the following Mathematical Formula 3 may be 0.67 or more, more preferably, 0.85 to 200, an initial alloy manufactured through this is advantageously amorphous, the particle size of crystals to be produced after the heat treatment is uniform, the content of α-Fe, FeCo and/or FeNi crystals and the content of a compound between any one element belonging to X and a metal may be appropriately maintained, so that even though the content of X is a little low, excellent magnetic characteristics may be exhibited through low coercivity.

$$\frac{5b}{c\sqrt{c}} \qquad \text{[Mathematical Formula 3]}$$

If the value of Mathematical Formula 3 is less than 0.67, the content of a compound between any one element belonging to X and C in the initial alloy or the alloy after the heat treatment may be sharply increased, it may be difficult to produce crystals having a uniform particle size distribution after the heat treatment, and accordingly, magnetic characteristics may be inhibited by causing a decrease in saturated magnetic flux density and/or an increase in coercivity. However, if the value of Mathematical Formula 3 exceeds 200, it may be very difficult to control the heat treatment process as production of an intermetallic compound between any one element belonging to X and B in addition to α-Fe, FeCo and/or FeNi crystals may be remarkably increased during the heat treatment due to the deterioration in thermal stability of the initial alloy, and there is a problem in that the saturated magnetic flux density of the initial alloy or the alloy after the heat treatment may be decreased or the magnetic loss may be increased, and since it is difficult to control the particle size of α-Fe crystals to be produced to a target level, it may be difficult to produce α-Fe crystals having a uniform particle size.

Furthermore, when a is 78.5 or more and less than 82.0 at %, in the empirical formula, according to a and d, a value of the following Mathematical Formula 4 may be 8.3 to 12.8. Through this, the initial alloy may be in an amorphous phase, and crystals produced after the heat treatment of the initial alloy are advantageous in being nanocrystal grains and simultaneously having a uniform particle size distribution. If a value according to the following Mathematical Formula 4 is less than 8.3, there is a concern that crystals are produced in the initial alloy, it becomes difficult to obtain crystals having a uniform particle size after the heat treatment, coarse crystals may be produced, and accordingly, magnetic characteristics at a target level may not be exhibited, such as a possibility of increasing the magnetic loss. Further, when a value according to the following Mathematical Formula 4 exceeds 12.8, the resistivity of an alloy to be manufactured is greatly decreased even though a manufactured initial alloy is manufactured in an amorphous phase, so that the magnetic loss due to the eddy current may be increased, and when nanocrystal grains of α-Fe, FeCo and/or FeNi are not produced at a target level in the heat-treated alloy and crystals are produced, the particle diameter of the produced crystals is not easily controlled, so that it may be difficult to produce uniform crystals having a small particle diameter, and accordingly, there is a concern that the magnetic loss of the manufactured soft magnetic alloy may be increased.

$$\sqrt{\frac{a}{d}} \qquad \text{[Mathematical Formula 4]}$$

The above-described soft magnetic alloy according to one embodiment of the present invention may have a crystal phase which is amorphous or crystalline, or may have a heterogeneous atomic arrangement structure including both an amorphous region and a crystalline region.

In this case, the soft magnetic alloy having the amorphous phase may be an initial alloy which is not heat-treated. In addition, the soft magnetic alloy having the crystalline phase may be an alloy after heat treatment of an initial alloy, the crystalline phase may be nanocrystal grains, and the nanocrystal grains may have an average particle diameter of 30 nm or less, preferably 27 nm or less, and more preferably 18 to 27 nm. Furthermore, the heterogeneous atomic arrangement structure may be a structure in the initial alloy or the alloy after the heat treatment. In this case, when the heterogeneous atomic arrangement structure is in the initial alloy state, the crystalline compound may have fine particle diameters with an average particle diameter of 10 nm or less. Further, when the heterogeneous atomic arrangement structure is in the alloy state after the heat treatment, the crystalline phase may be nanocrystal grains, and the nanocrystal grains may have an average particle diameter of 30 nm or less, preferably 27 nm or less, and more preferably 18 to 27 nm.

The form of the above-described soft magnetic alloy in a state before a heat treatment may be a powder, a strip, or a ribbon, but is not limited thereto, and may be appropriately modified in consideration of the form of a final magnetic material, heat treatment process, and the like. In addition, the form of the soft magnetic alloy after the heat treatment may be a ribbon-type or rod-type, and the cross-section of the rod-type may be polygonal, circular, or elliptical, but is not limited thereto.

Furthermore, according to one embodiment of the present invention, in the soft magnetic alloy containing Fe and Co as X, the crystallized area value according to the above-described Relationship Equation 1 may be 50 to 78%, more specifically, 58 to 78%.

In this case, the area refers to an integral value for a crystalline region or an amorphous region measured during an X-ray diffraction (XRD) analysis of the soft magnetic alloy at an angle (2θ) of 0 to 90°.

As crystals of α-Fe, FeCo, and a compound between another metal and Fe or Co, for example, an Fe—C-based compound are produced at an appropriate ratio by the crystallized area value satisfying 50 to 78%, it may be more advantageous for satisfying target physical properties. If the crystallized area value is less than 50%, there is a concern that it may be difficult to exhibit excellent magnetic characteristics, such as the low saturated magnetic flux density or insignificant improvement in magnetostrictive characteristics, and magnetic characteristics may be changed at the time of manufacturing magnetic parts by using the alloy. Further, if the crystallized area value exceeds 78%, production of crystals of a compound between another metal and Fe or Co, such as an Fe—C-based compound is greatly increased, so that the saturated magnetic flux density may be lowered and the magnetic loss such as coercivity may be increased, and as a result, physical properties at a target level may not be exhibited.

Meanwhile, according to another embodiment of the present invention, in the soft magnetic alloy containing Fe and Co as X, the crystallized area value according to Relationship Equation 1 may be 50 to 70%, more specifically, 60 to 70%. There is a concern that if the crystallized area value is less than 50%, the saturated magnetic flux density is reduced, and as a result, magnetic characteristics may be decreased, and if the crystallized area value exceeds 70%, the effect of lowering coercivity may be insignificant.

The above-described soft magnetic alloy according to one embodiment of the present invention may have a saturated magnetic flux density of 1.7 T or more in an initial alloy state, 1.8 T or more after appropriate heat treatment, and the coercivity is 300 A/m or less, which may be suitable for making parts small due to the low magnetic loss.

The above-described soft magnetic alloy included in one embodiment of the present invention may be manufactured by a manufacturing method to be described below, but the method is not limited thereto.

The soft magnetic alloy according to the present invention is manufactured by manufacturing a soft magnetic initial alloy having the empirical formula according to the present invention as a first step, and then carrying out heat treatment on the manufactured soft magnetic initial alloy as a second step.

The description on the first step and the second step may correspond to the first step and the second step described above, and the specific description thereof will be omitted.

The above-described Fe-based soft magnetic alloy according to one embodiment of the present invention may be realized as a magnetic core such as a wound magnetic core, a laminated core, and a dust magnetic core, or may be realized as an electromagnetic wave shielding member.

In addition, the magnetic core may be realized as a coil part along with a coil to be wound on the outside of the magnetic core in order to carry out the function of a magnetic core, and the coil part may be applied as a part of a laser, a transformer, an inductor, a motor, or a power generator.

EXAMPLES

The present invention will be described in more detail through the following Examples, but the following Examples are not intended to limit the scope of the present invention, and it should be interpreted as assisting the understanding of the present invention.

Example 1

After raw materials of Fe, B, C and Cu were weighed such that an Fe master alloy represented by empirical formula $Fe_{85.3}B_{13}C_1Cu_{0.7}$ was manufactured, the Fe master alloy was manufactured by using an arc melting method. Thereafter, the manufactured Fe master alloy was melted, and then an Fe-based soft magnetic initial alloy having a ribbon form with a thickness of about 20 μm and a width of about 2 mm was manufactured by rapidly cooling the melted master alloy at a rate of $10^6$ K/sec through melt spinning at a rate of 60 m/s under an Ar atmosphere.

Thereafter, an Fe-based soft magnetic alloy as shown in the following Table 1 was manufactured by heat-treating the manufactured Fe-based soft magnetic initial alloy at a heating rate of 80° C./min at room temperature and maintaining the heat-treated initial alloy at 350° C. for 1 minute.

Examples 2 to 52

Fe-based soft magnetic initial alloys and Fe-based soft magnetic alloys as shown in the following Tables 1 to 5 were manufactured by carrying out a process in the same manner as in Example 1, and changing the composition of the empirical formula and/or the heat treatment conditions as in the following Tables 1 to 5.

Comparative Examples 1 to 9

Fe-based soft magnetic initial alloys and Fe-based soft magnetic alloys as shown in the following Table 6 were manufactured by carrying out a process in the same manner as in Example 1, and changing the composition of the empirical formula and/or the heat treatment conditions as in the following Table 6.

Experimental Example 1

For the compositions of the manufactured initial alloys and the alloys after the heat treatment in Examples 1 to 52, the following Mathematical Formulae 1 and 2 or Mathematical Formulae 3 and 4 were calculated according to the content of Fe, and the values thereof are shown in the following Tables 1 to 5.

(1) In the empirical formula, when a is 82 to 86 at %, Mathematical Formulae 1 and 2

$$\frac{b}{c\sqrt{c}}$$ [Mathematical Formula 1]

$$\sqrt[4]{\frac{a}{d}}$$ [Mathematical Formula 2]

(2) In the empirical formula, when a is 78.5 at % or more and less than 82.0 at %, Mathematical Formulae 3 and 4

$$\frac{5b}{c\sqrt{c}}$$ [Mathematical Formula 3]

$$\sqrt{\frac{a}{d}}$$ [Mathematical Formula 4]

Experimental Example 2

For the manufactured initial alloys and the alloys after the heat treatment in Examples 1 to 52 and Comparative Examples 1 to 9, the following physical properties were each evaluated, and are shown in the following Tables 1 to 6.

1. Analysis of Crystal Structure

In order to verify the crystal phase for the manufactured initial alloys and the alloys after the heat treatment and the average particle diameter and crystallized area values of the produced crystals, the XRD patterns and TEM photographs were analyzed.

Figure 2:
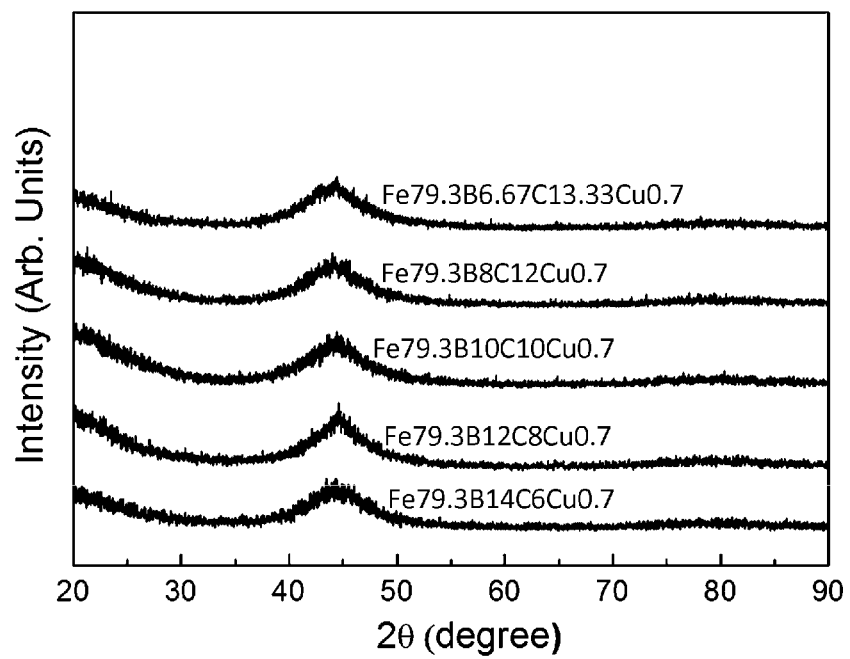
Figure 3:
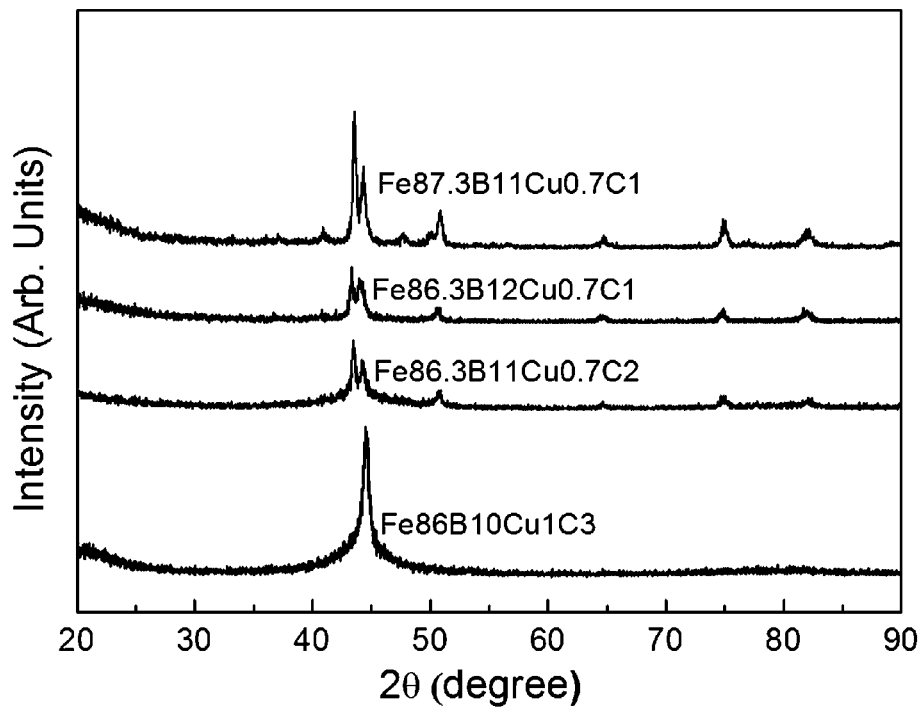
FIG. 3 illustrates XRD patterns in an initial alloy state before heat treatment of Fe-based soft magnetic alloys according to the Comparative Example of the present invention.
Figure 4A:
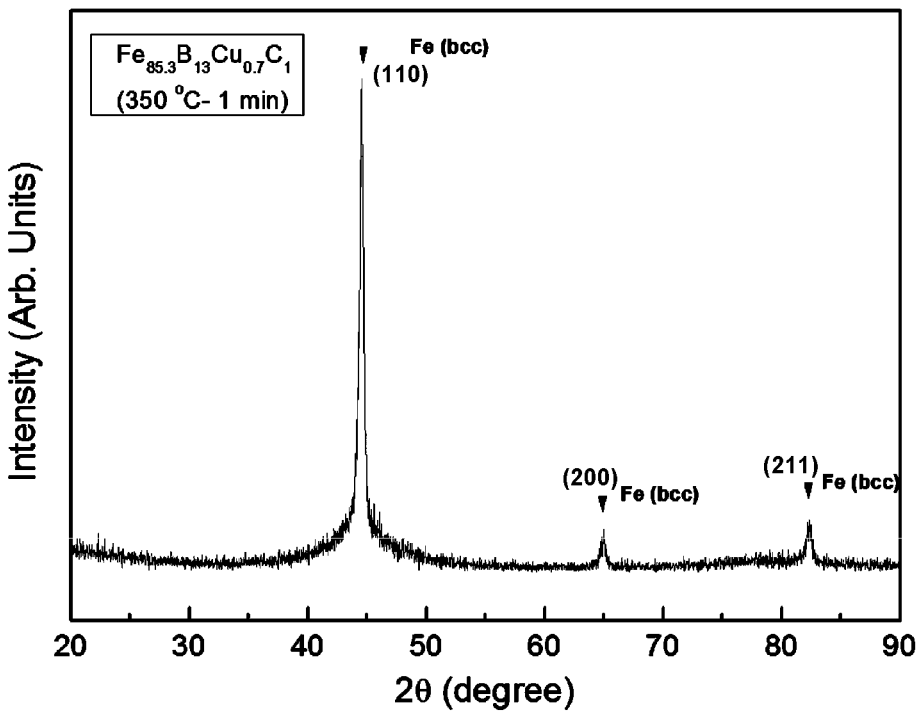
FIGS. 4A and 4B are XRD patterns after heat treatment of an Fe-based soft magnetic alloy according to one embodiment of the present invention.
Figure 4B:
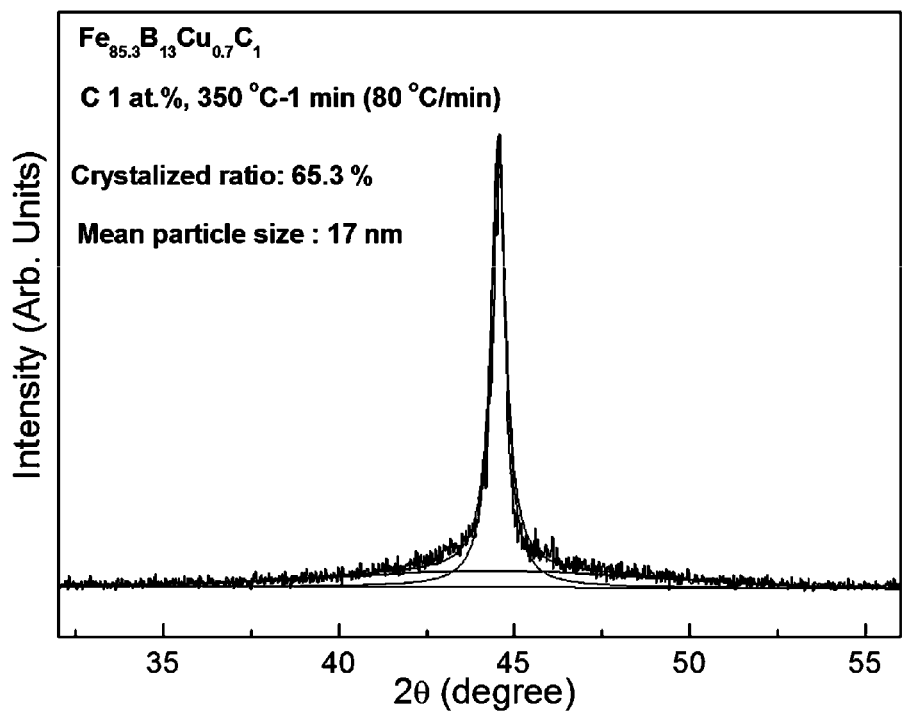
Figure 5A:
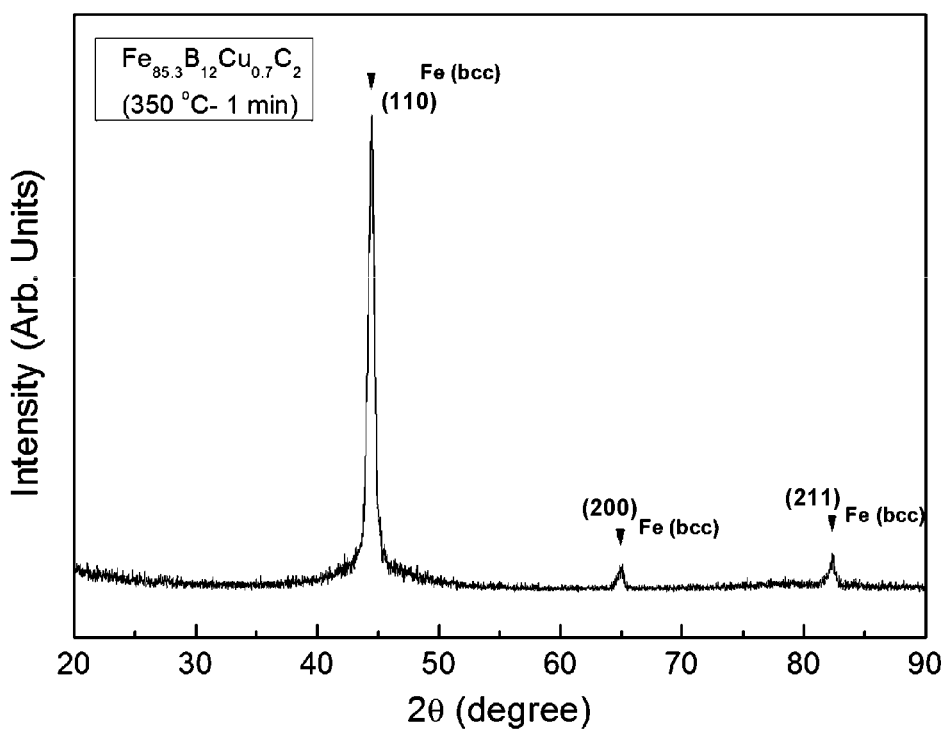
FIGS. 5A and 5B are XRD patterns after heat treatment of an Fe-based soft magnetic alloy according to another embodiment of the present invention.
Figure 5B:
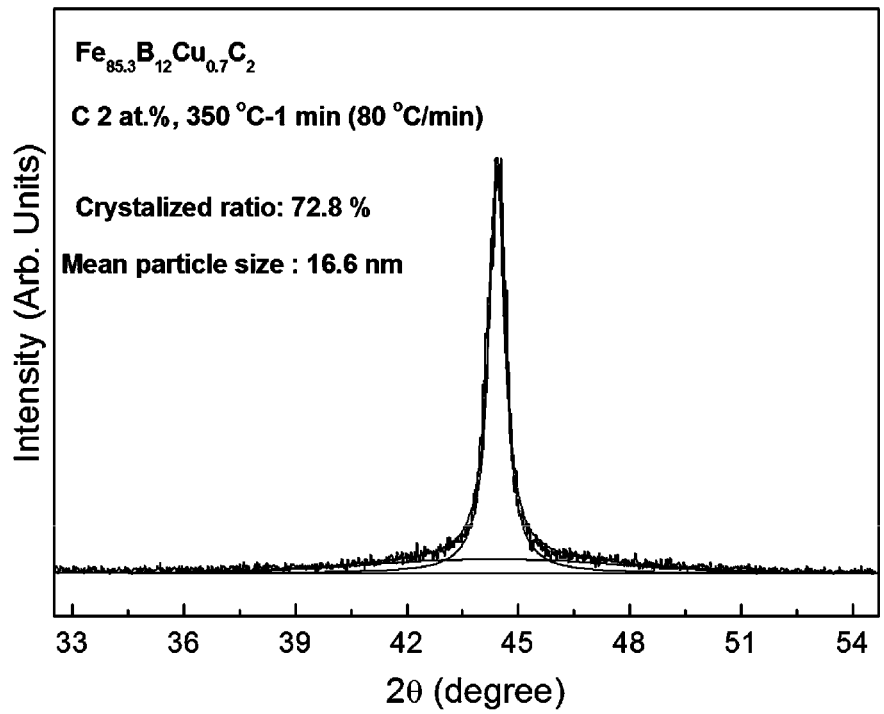
Figure 6A:
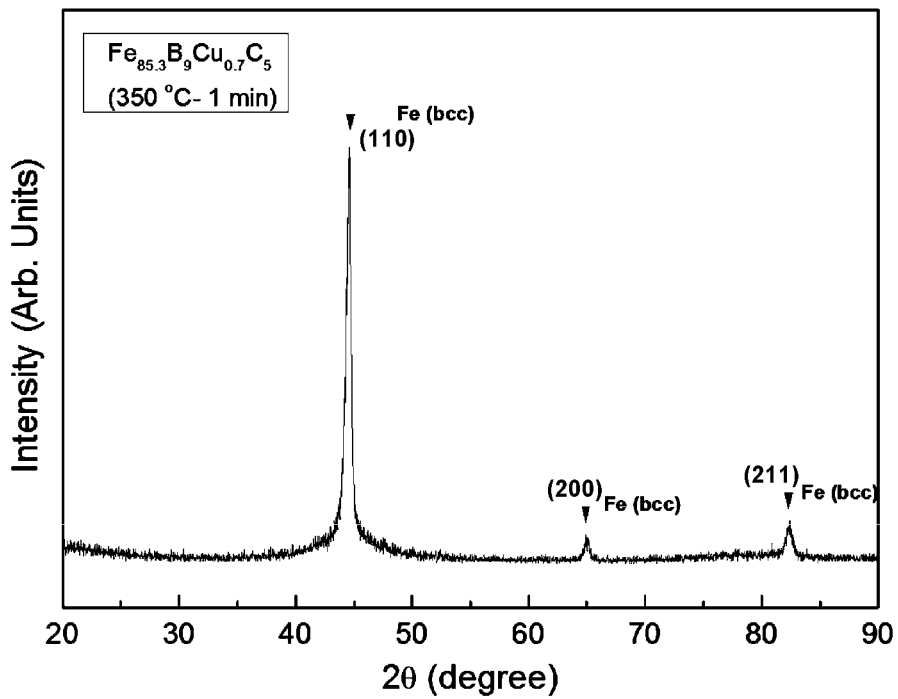
FIGS. 6A and 6B are XRD patterns after heat treatment of an Fe-based soft magnetic alloy according to still another embodiment of the present invention.
Figure 6B:
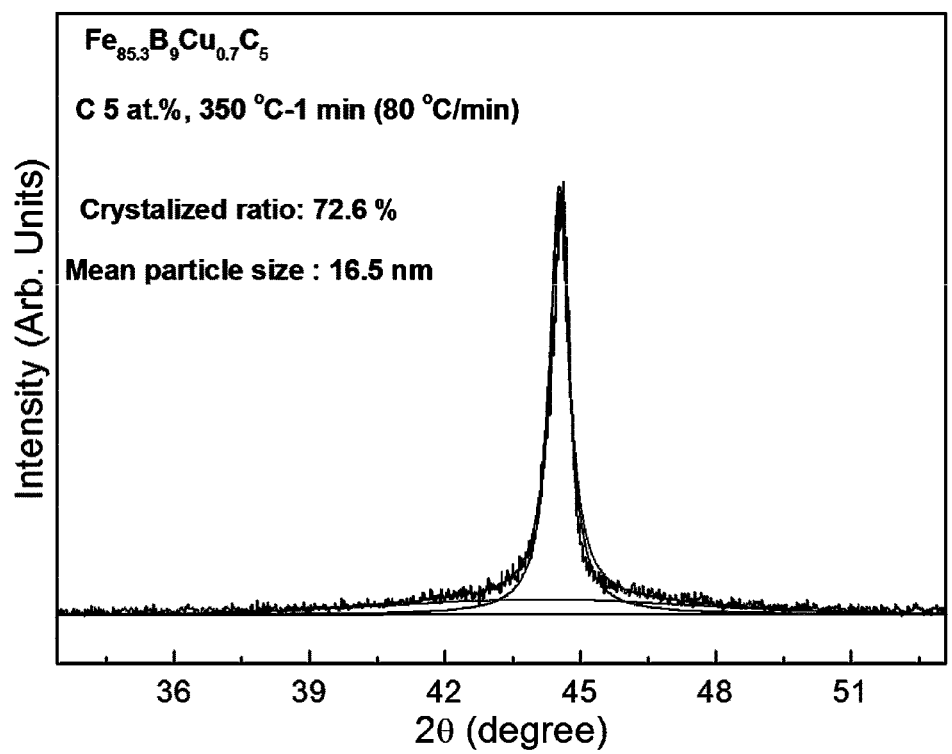
Figure 7A:
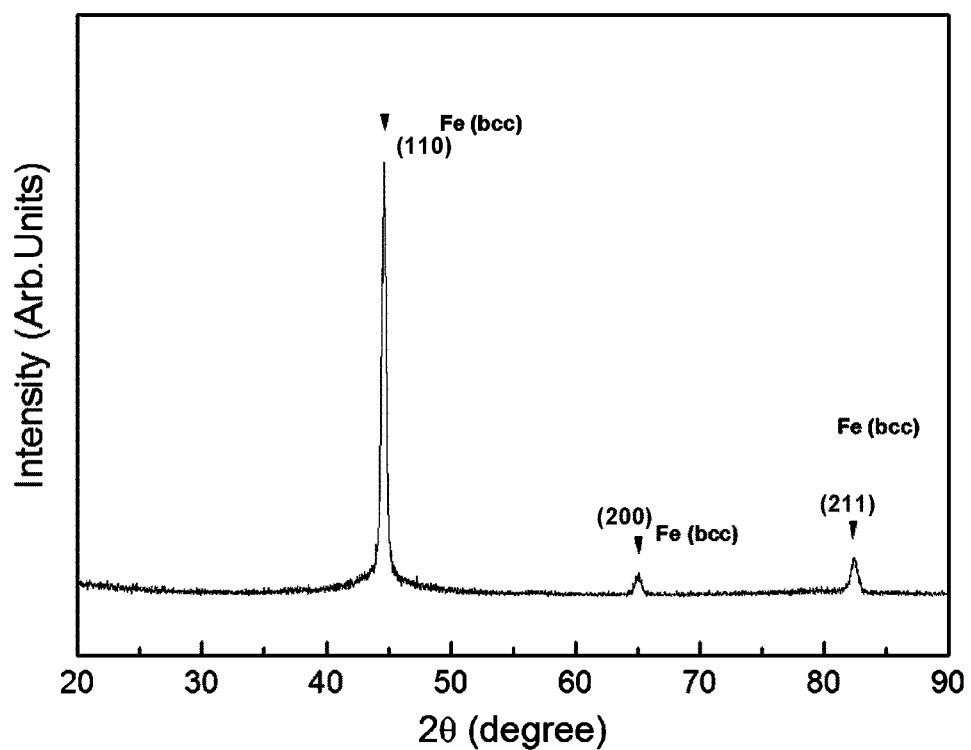
FIGS. 7A and 7B are XRD patterns after heat treatment of an Fe-based soft magnetic alloy according to yet another embodiment of the present invention.
Figure 7B:
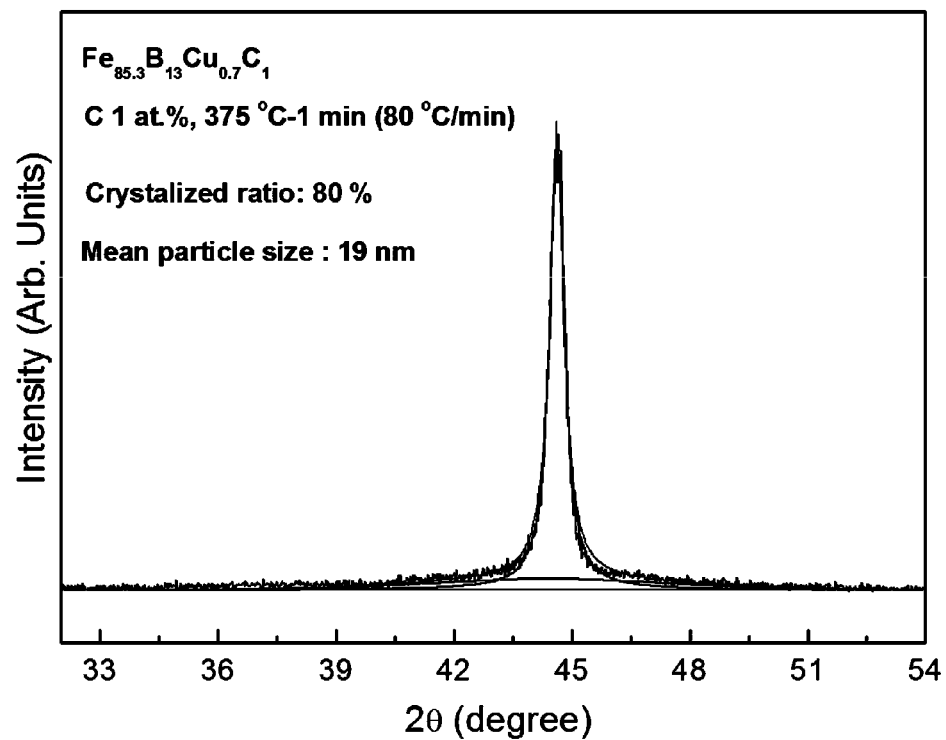
Figure 8A:
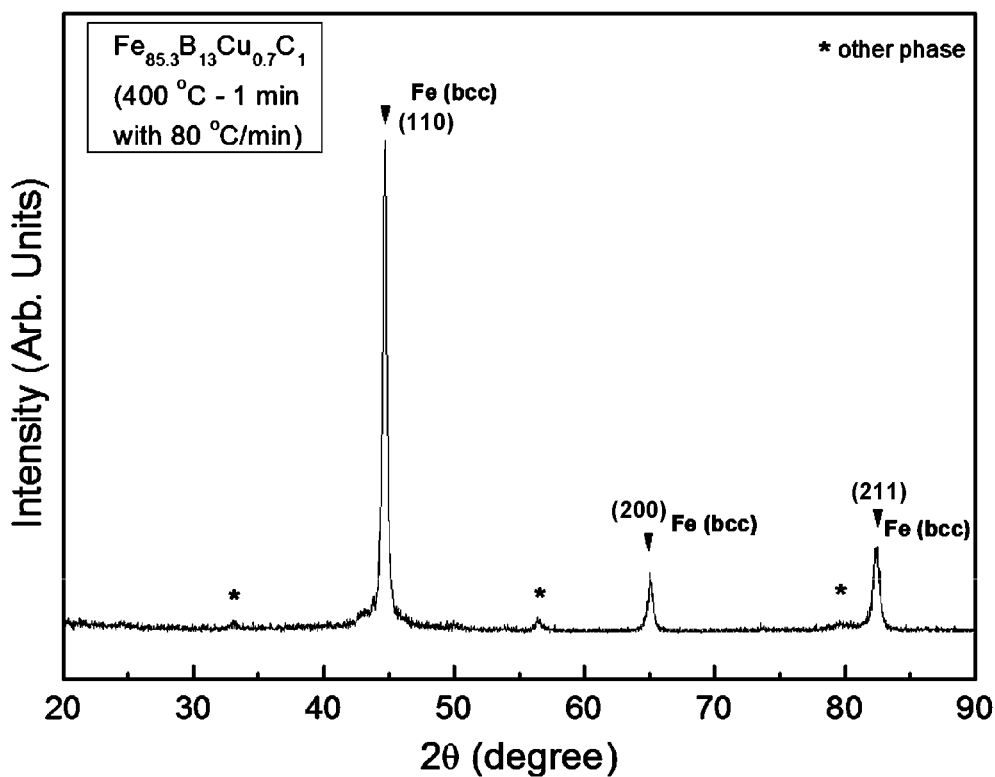
FIGS. 8A and 8B are XRD patterns after heat treatment of an Fe-based soft magnetic alloy according to yet another embodiment of the present invention.
Figure 8B:
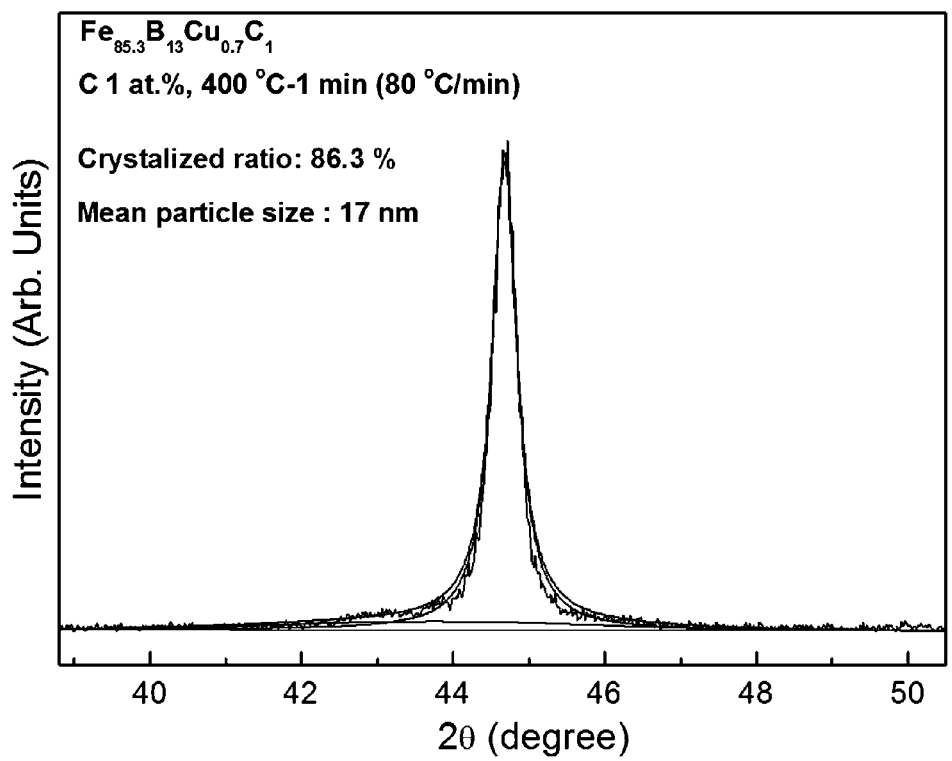
Figure 9A:
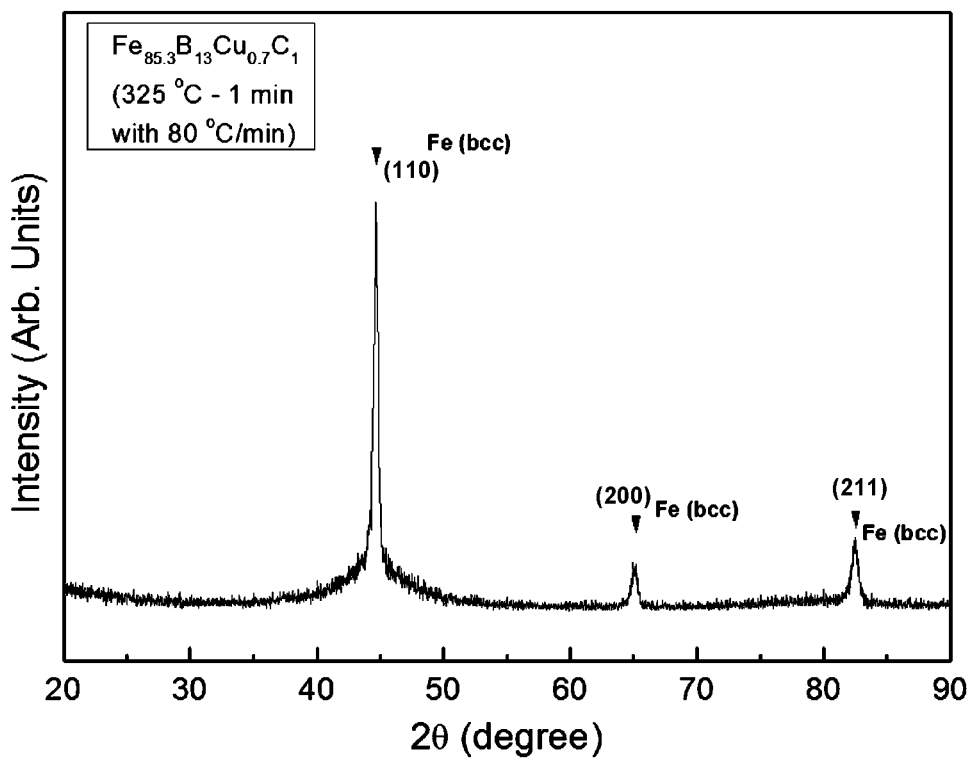
FIGS. 9A and 9B are XRD patterns after heat treatment of an Fe-based soft magnetic alloy according to yet another embodiment of the present invention.
Figure 9B:
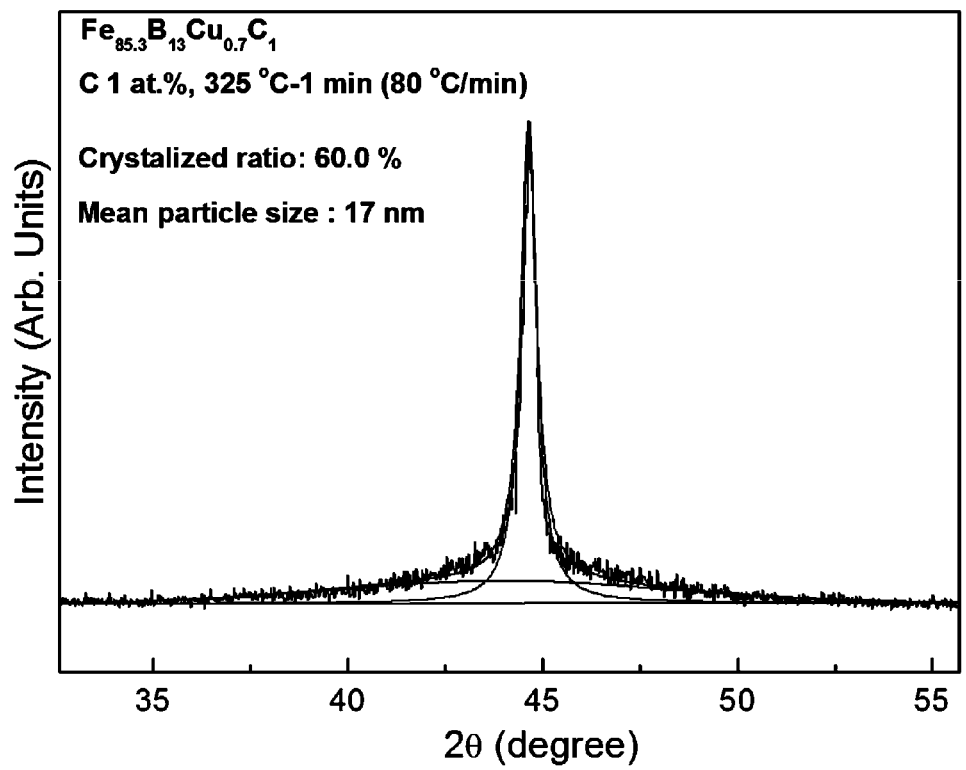
Figure 10A:
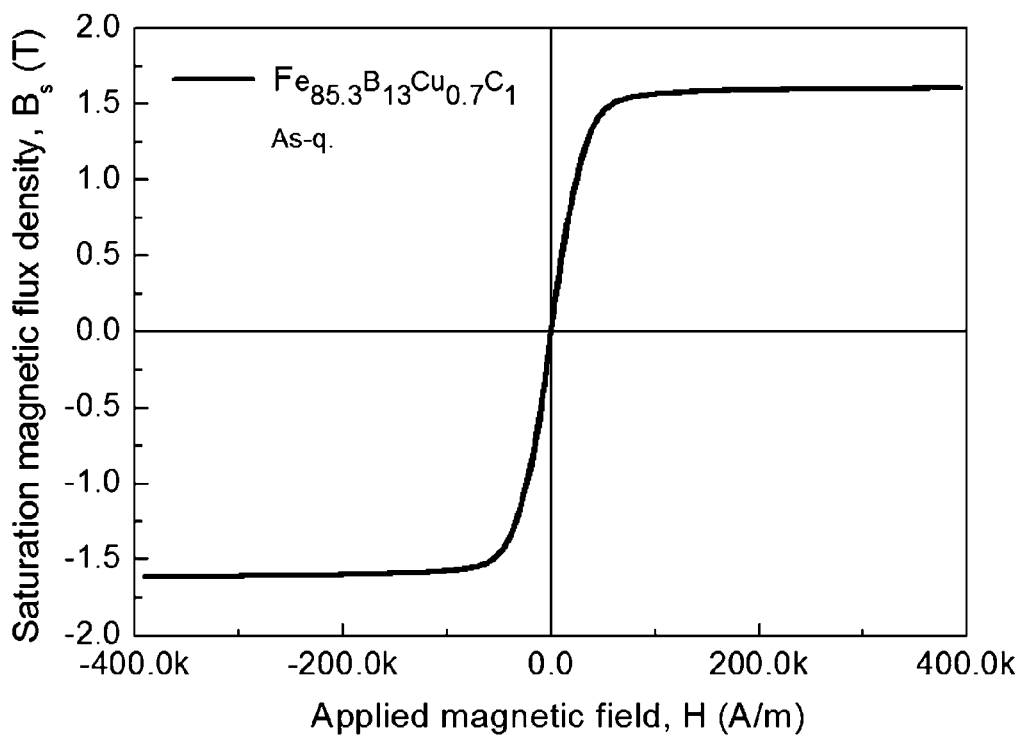
FIGS. 10A to 10E are VSM graphs in an initial alloy state before heat treatment of the Fe-based soft magnetic alloys during the manufacturing process in various embodiments of the present invention.
Figure 10B:
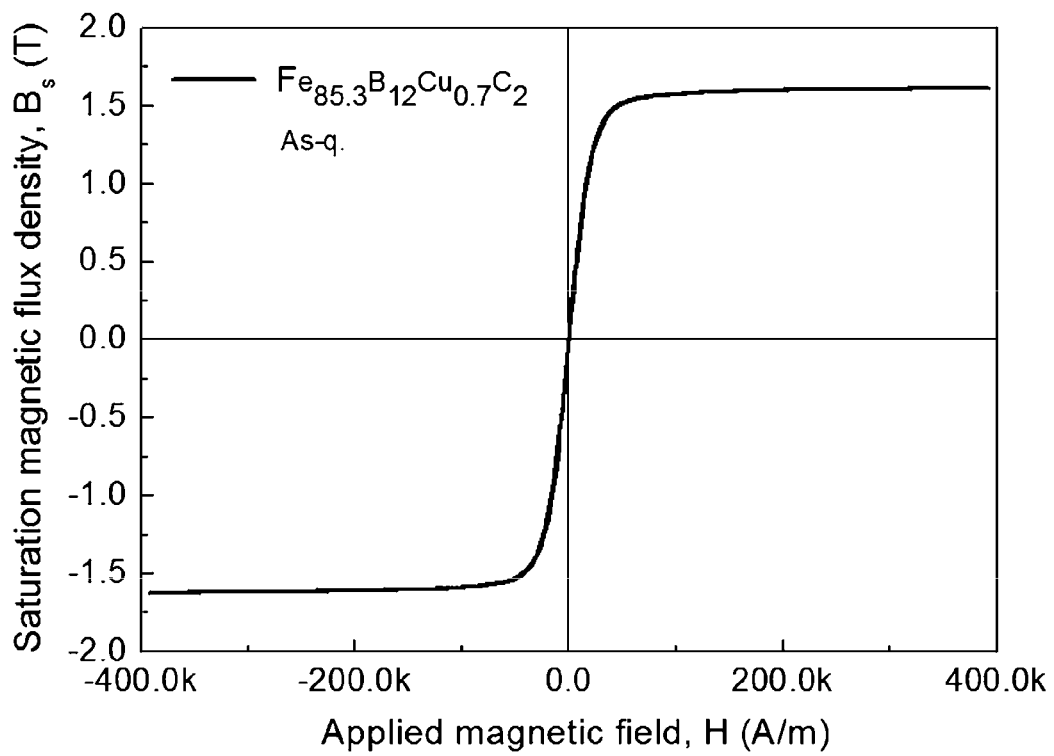
Figure 10C:
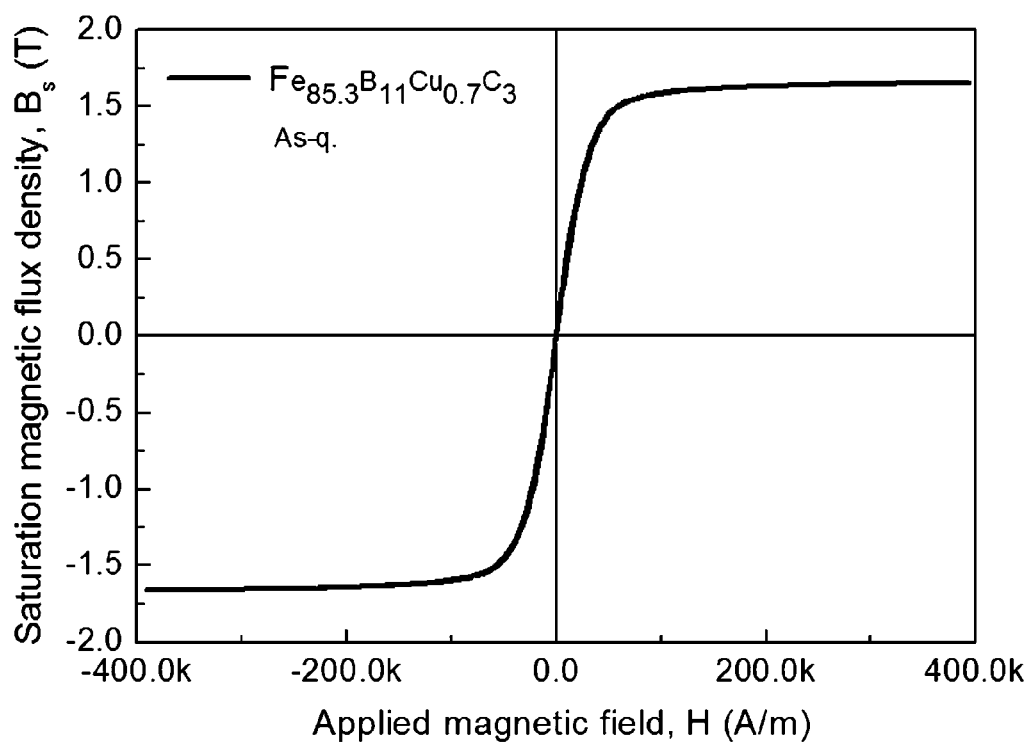
Figure 10D:
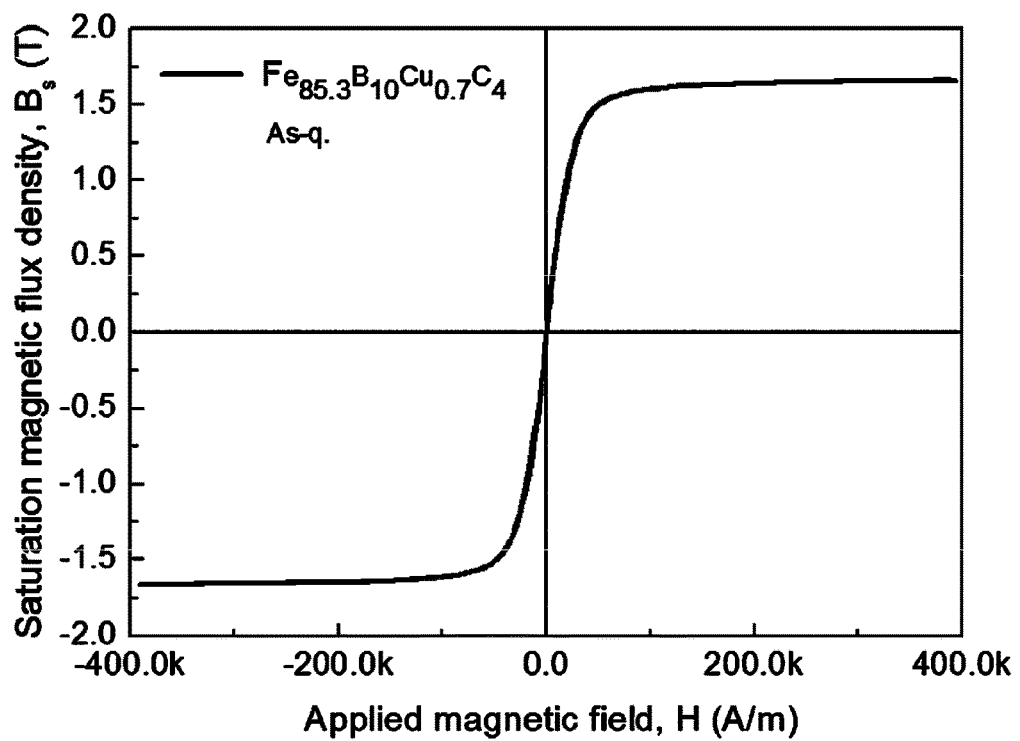
Figure 10E:
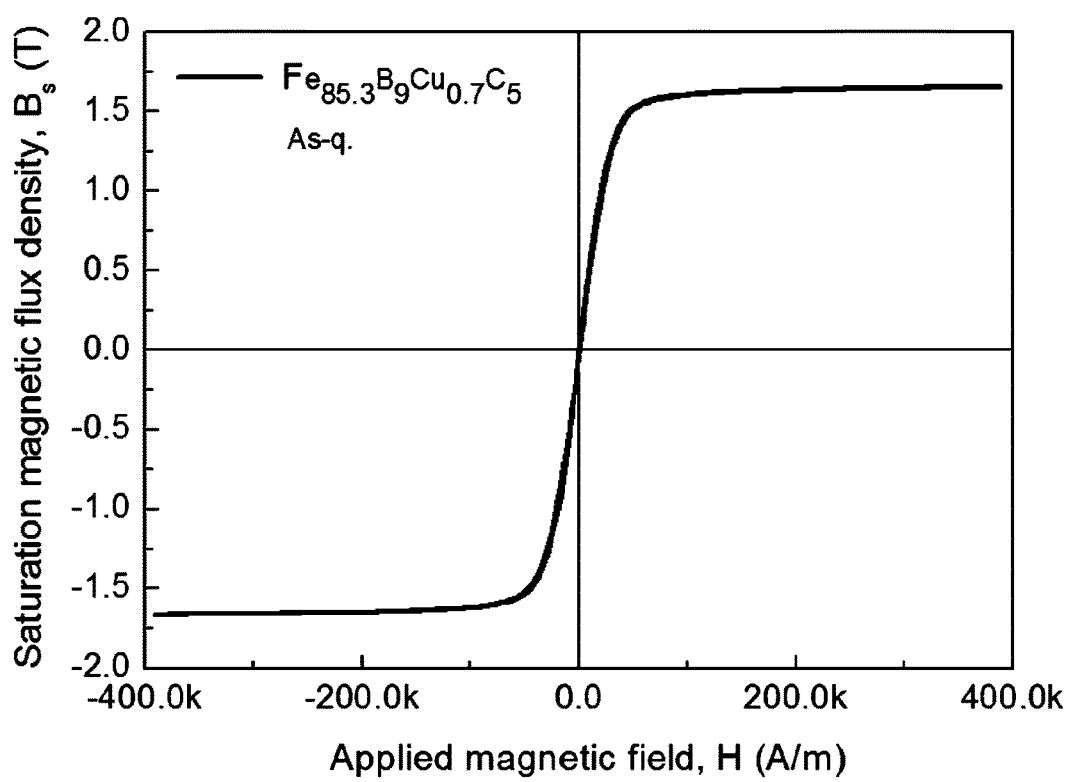
Figure 11A:
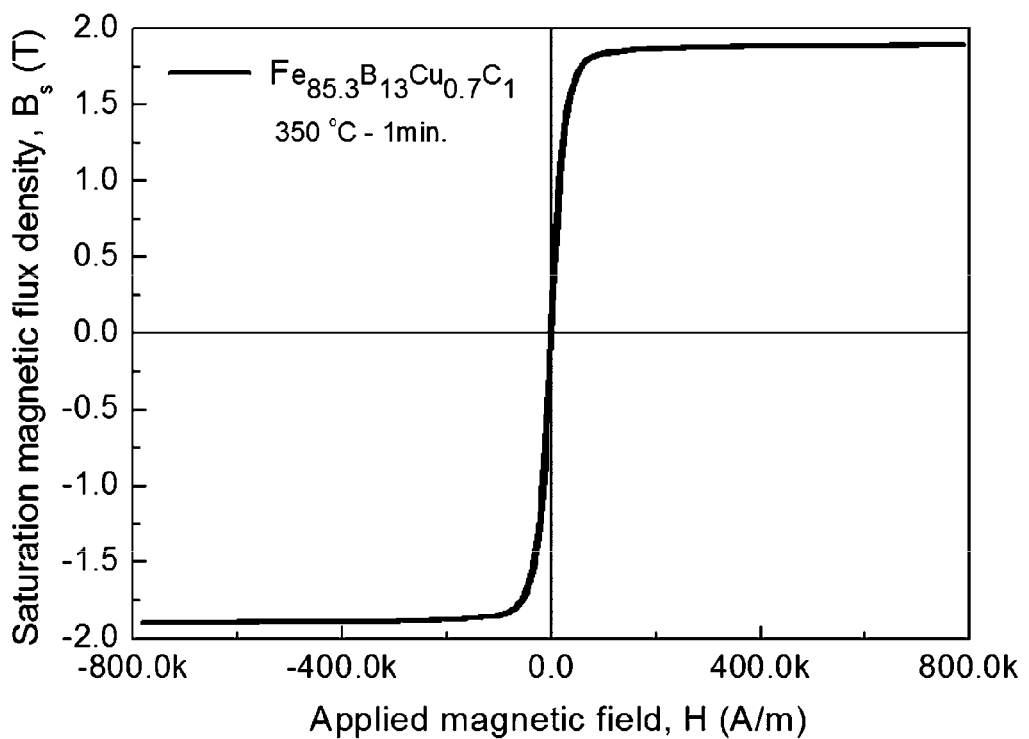
FIGS. 11A to 11E are VSM graphs after heat treatment of the Fe-based soft magnetic alloys according to various embodiments of the present invention
Figure 11B:
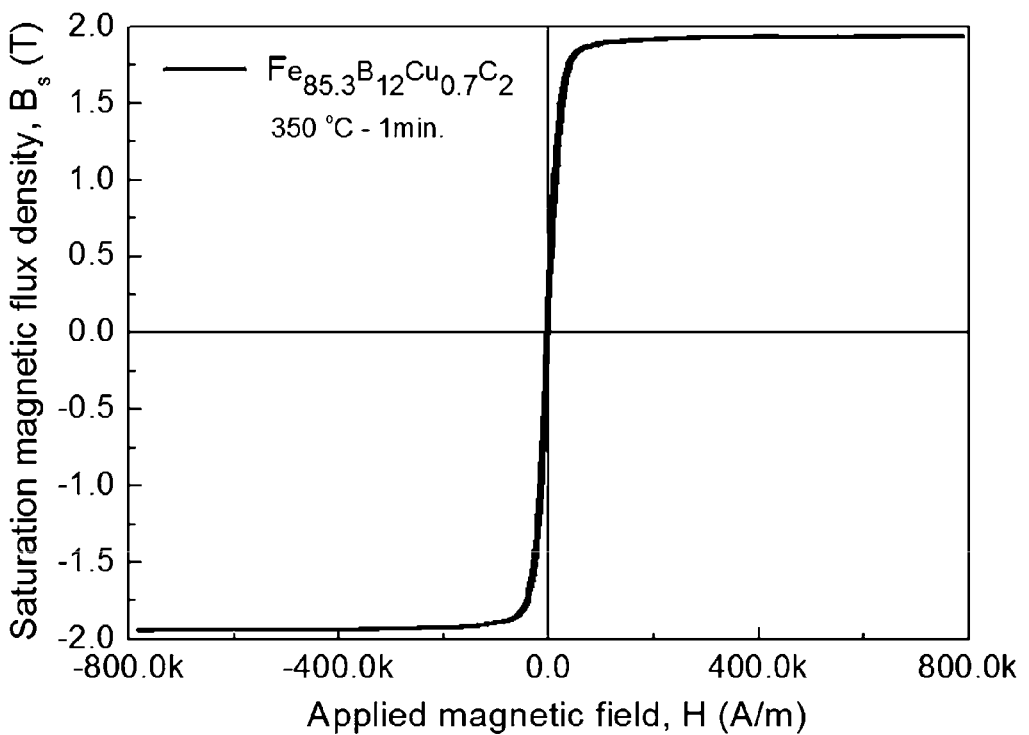
Figure 11C:
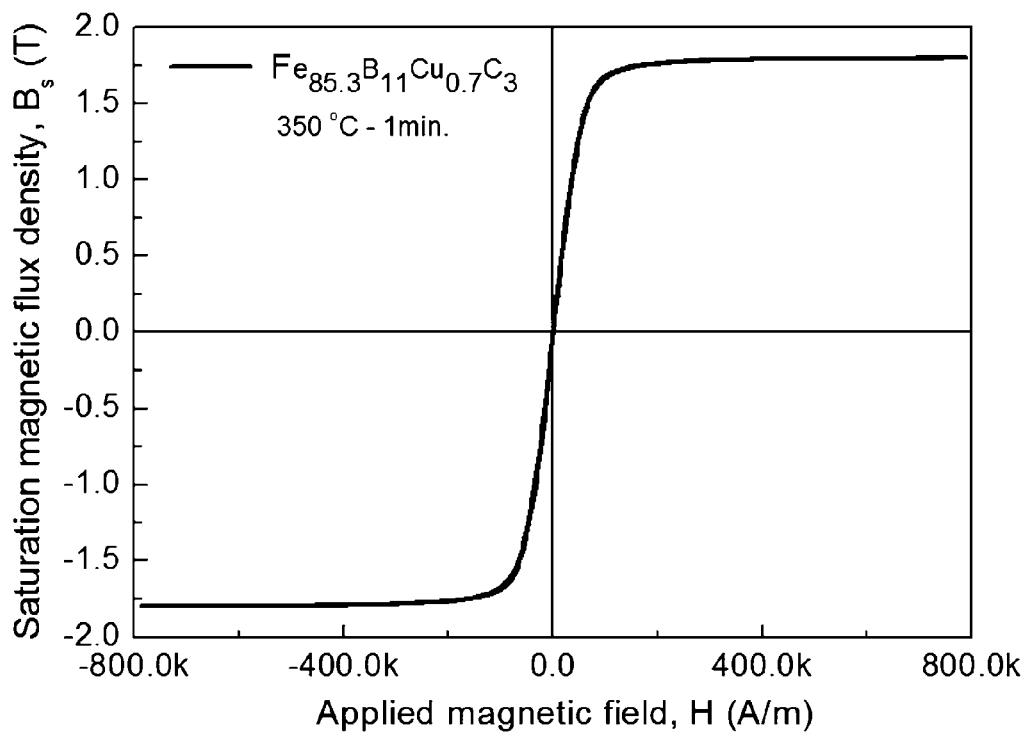
Figure 11D:
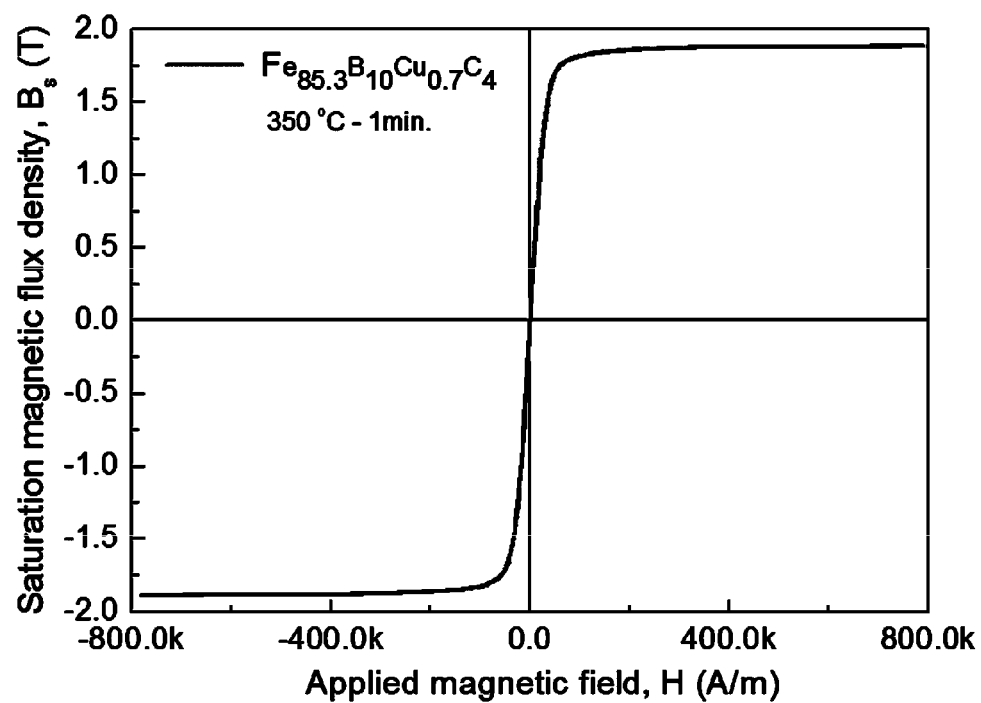
Figure 11E:
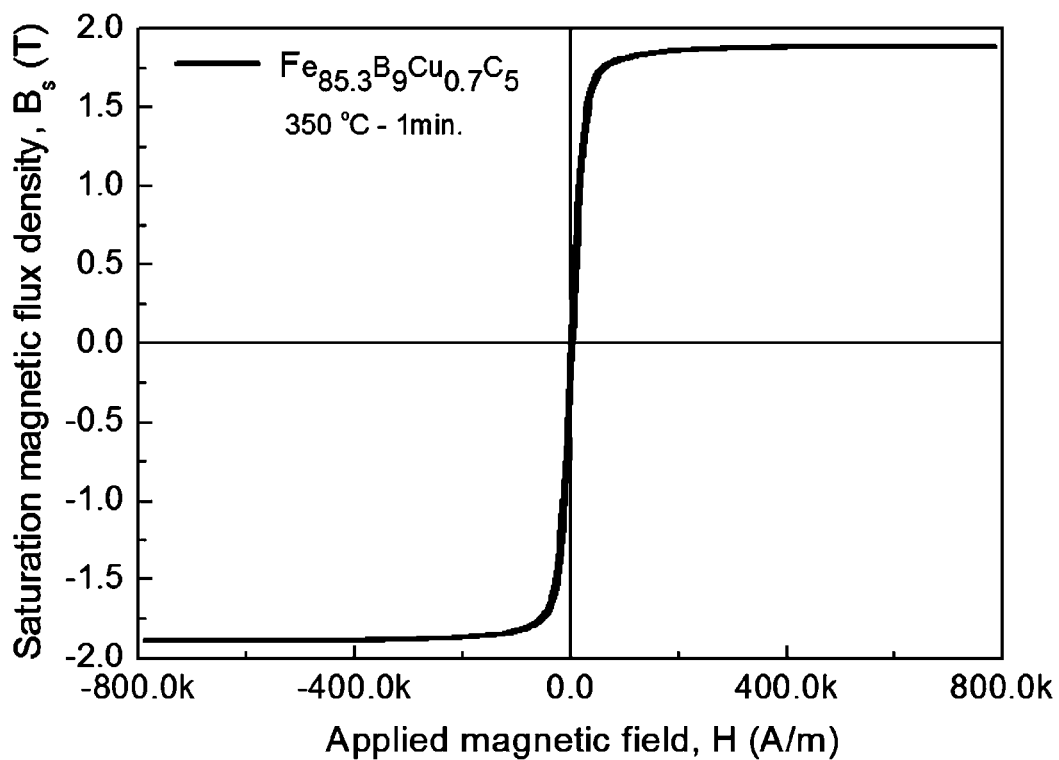

Among the analyzed results, the XRD patterns of the initial alloys in Examples 1 to 5, the XRD patterns of the initial alloys in Examples 6 to 10, and the XRD patterns of the initial alloys in Comparative Examples 1 to 5 are illustrated in FIG. 1, FIG. 2, and FIG. 3, respectively. Further, the XRD pattern of the heat-treated Fe-based soft magnetic alloy in Example 1, the XRD pattern of the heat-treated Fe-based soft magnetic alloy in Example 2, the XRD pattern of the heat-treated Fe-based soft magnetic alloy in Example 5, the XRD pattern of the heat-treated Fe-based soft magnetic alloy in Example 38, the XRD pattern of the heat-treated Fe-based soft magnetic alloy in Example 42, and the XRD pattern of the heat-treated Fe-based soft magnetic alloy in Example 51 are illustrated in FIGS. 4A and 4B, FIGS. 5A and 5B, FIGS. 6A and 6B, FIGS. 7A and 7B, FIGS. 8A and 8B, and FIGS. 9A and 8B, respectively.

In this case, the crystallized area value was calculated by the following Relationship Equation 1.

$$\text{Crystallized area value (\%)} = \frac{\text{Area of crystlline region}}{\text{Area of crystlline region} + \text{Area of amorphous region}} \times 100$$ [Relationship Equation 1]

In addition, the average particle diameter was derived through the Scherrer Formula as shown in the following Relationship Equation 2.

$$D = \frac{0.9\lambda}{\beta \cos\theta}$$ [Relationship Equation 2]

Here, D refers to an average particle diameter of crystals, β refers to a full width at half maximum, and θ refers to an angle having a peak with the highest intensity.

As confirmed through FIGS. 1 to 3, it can be confirmed that amorphous initial alloys are produced in Examples 1 to 10, but it can be confirmed that crystalline initial alloys are produced in Comparative Examples 1 to 5.

Furthermore, it can be confirmed that through FIGS. 4B to 9B for the XRD patterns of the Fe-based soft magnetic alloys after the heat treatment, the average particle diameter of the produced crystals calculated by Relationship Equation 2 is 16.5 nm to 19 nm, and that the crystallized area value calculated by Relationship Equation 1 is 60.1 to 86.3%.

2. Evaluation of Magnetic Properties

Figure 12:
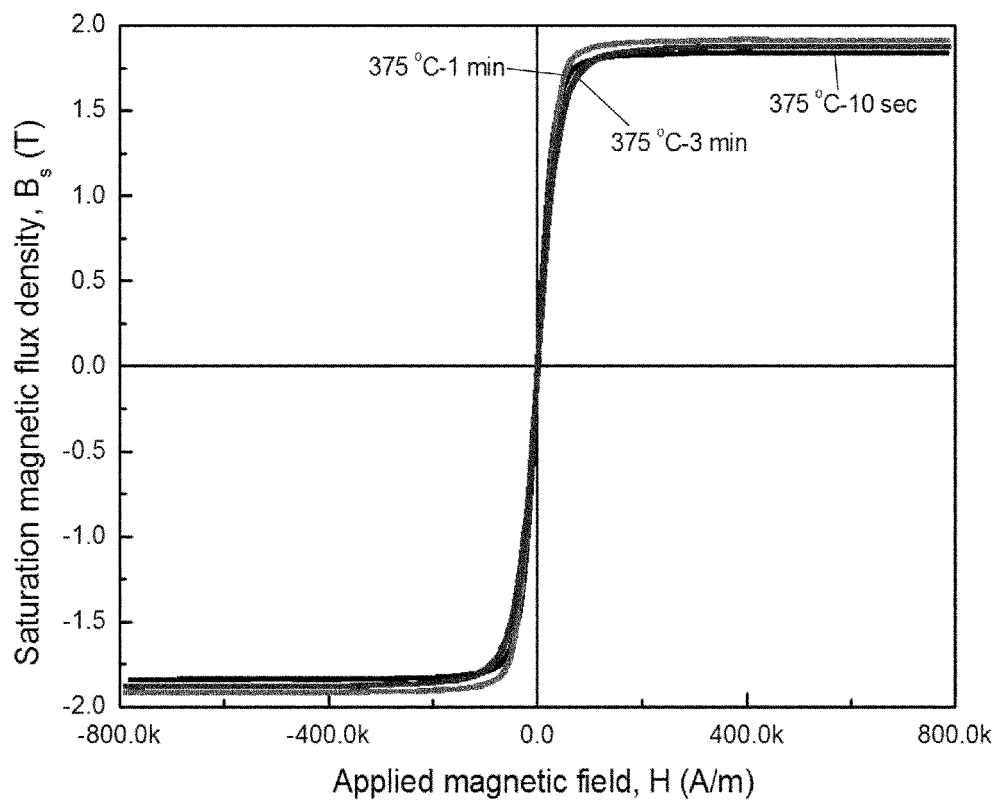
FIG. 12 is a VSM graph after heat treatment of the Fe-based soft magnetic alloys manufactured by varying the heat treatment time according to various embodiments of the present invention.
Figure 13A:
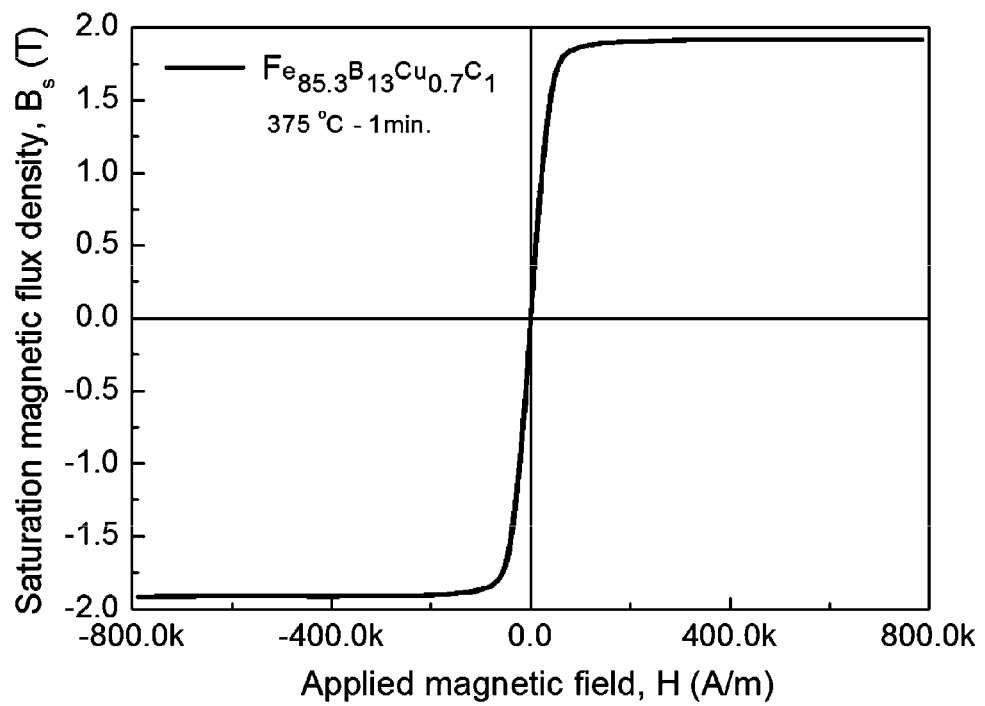
FIGS. 13A to 13C are VSM graphs of the Fe-based soft magnetic alloys manufactured by varying the heat treatment time according to various embodiments of the present invention.

In order to calculate the coercivity and saturated magnetization values, magnetic properties were evaluated at 800 kA/m through a vibrating sample magnetometer (VSM). Among them, the VSM graphs of the initial alloys in Examples 1 to 5 are illustrated in FIGS. 10A to 10E, respectively, and the VSM graphs of the Fe-based soft magnetic alloys after the heat treatment of Examples 1 to 5 are illustrated in FIGS. 11A to 11E, respectively. Further, the VSM graphs for Examples 35, 38, and 41 manufactured by varying the heat treatment time at a heat treatment temperature of 375° C. are illustrated in FIG. 12. In addition, the VSM graphs for Examples 38, 42 and 43 manufactured by varying the heat treatment temperature are illustrated in FIGS. 13A and 13C, and the VSM graphs for Examples 49, 50 and 51 manufactured by varying the heating rate are illustrated in FIGS. 14A and 14C.

Through the VSM results of the initial alloys in FIGS. 10A to 10E, it can be confirmed that an alloy exhibiting excellent magnetic properties such as a saturated magnetic flux density of 1.6 T (FIG. 10A) to 1.65 T (FIGS. 10C to 10E) or more and a coercivity of 83.34 A/m or less is realized even in the initial alloy before heat treatment.

In addition, through the VSM results of the heat-treated alloys in FIGS. 11A to 11E, it can be confirmed that through the heat treatment, the saturated magnetic flux density is 1.80 T (FIG. 11C) to 1.93 T (FIG. 11B), the coercivity is 163.37 A/m or less, and the alloys exhibiting more improved magnetic characteristics than the initial alloys are realized.

Meanwhile, as can be confirmed through FIG. 12, it can be confirmed that Example 38 where the heat treatment is carried out for 60 seconds has a higher saturated magnetic flux density and/or a lower coercivity than those in Example 35 where the heat treatment time is short (10 seconds) and Example 41 where the heat treatment time is excessively long (180 seconds).

Figure 13B:
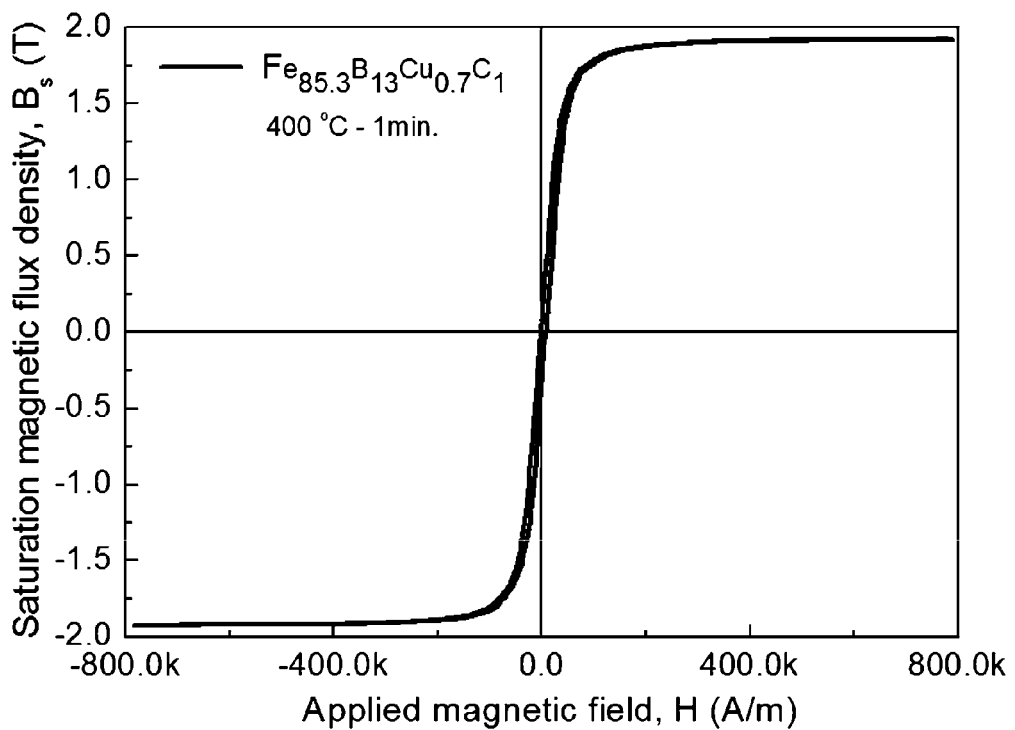
Figure 13C:
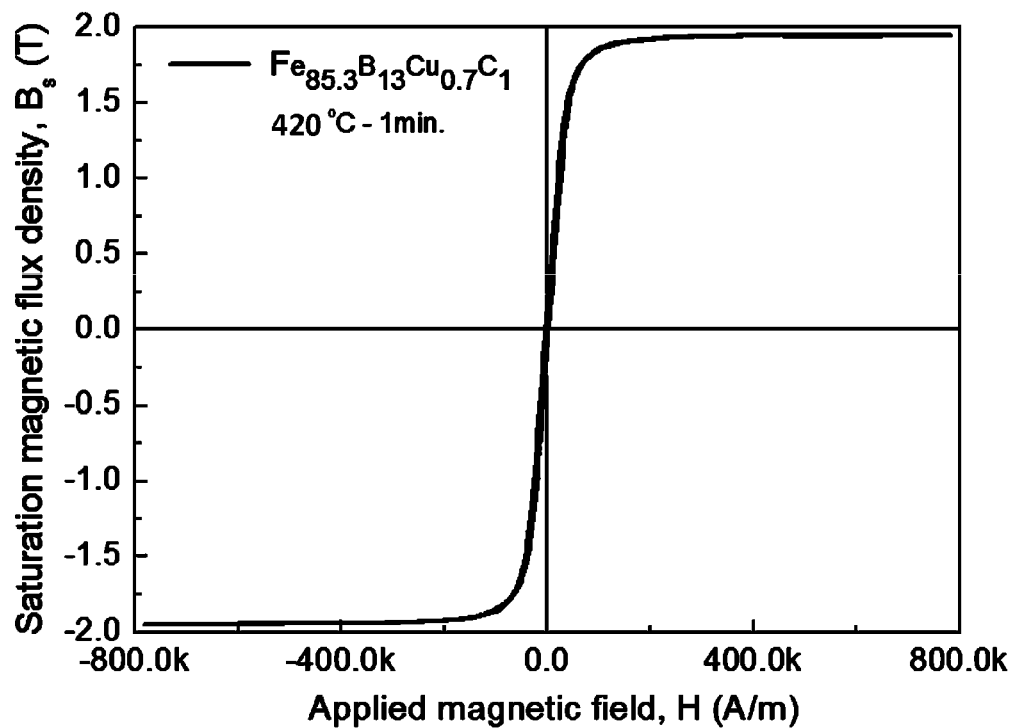
Figure 14A:
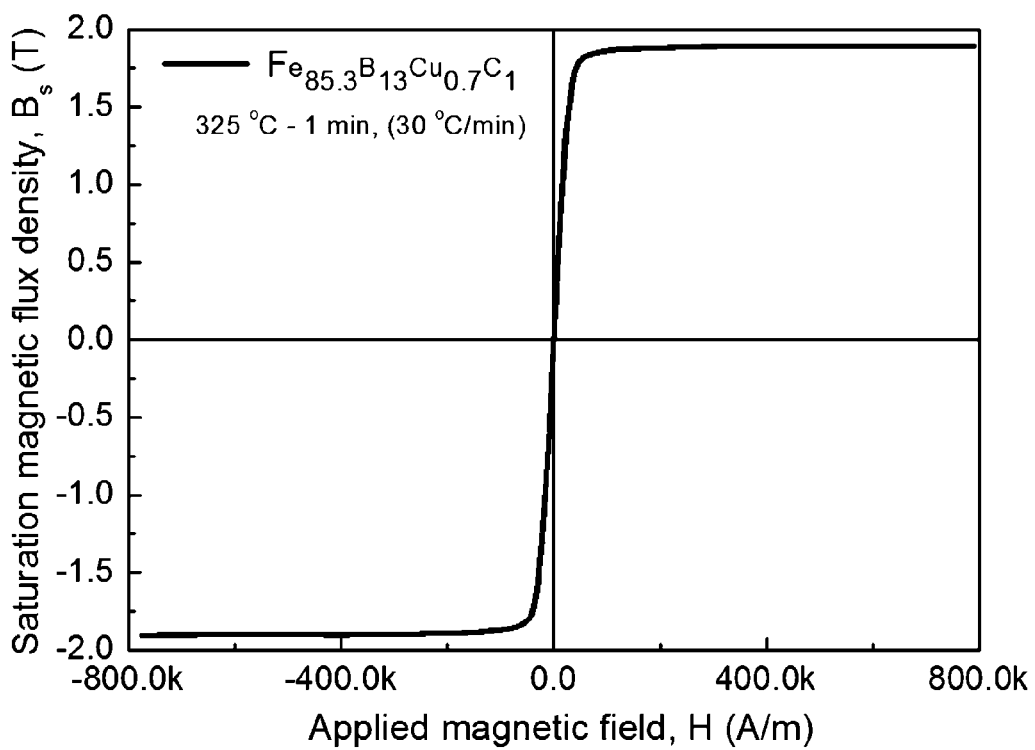
FIGS. 14A to 14C are VSM graphs of the Fe-based soft magnetic alloys manufactured by varying the heating rate according to various embodiments of the present invention.

Furthermore, as can be confirmed through FIGS. 13A to 13C, it can be confirmed that the coercivity in the case of Example 43 in FIG. 13C in which the heat treatment is carried out at high temperature is increased as compared to that in Example 42 in FIG. 13B.

Figure 14B:
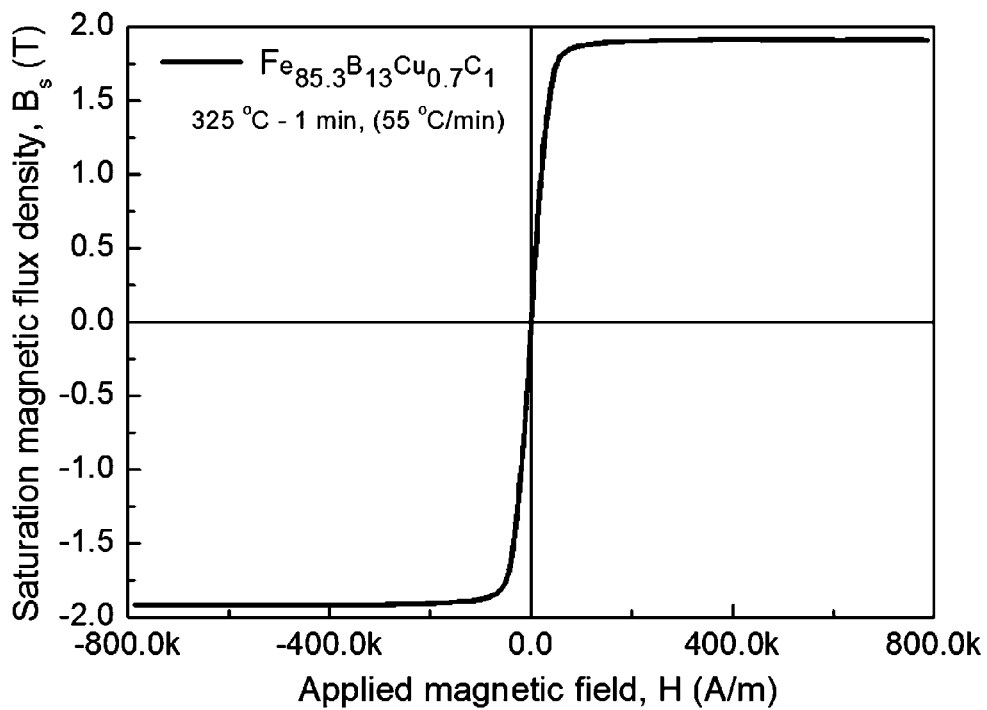
Figure 14C:
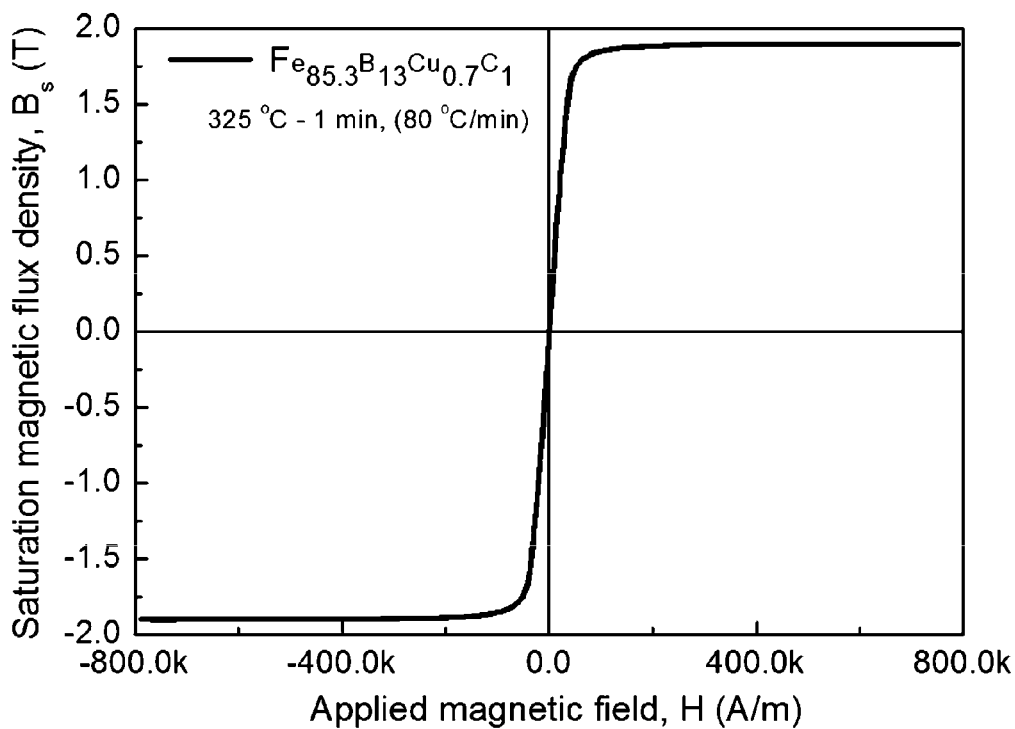

Further, as can be confirmed through FIGS. 14A to 14C, it can be confirmed that the Fe-based soft magnetic alloys having high saturated flux densities and low coercivities at a heating rate of 30° C./m, 55° C./m, and 80° C./m, respectively are manufactured.

3. Observation of Crystal Particle Diameter

Figure 15A:
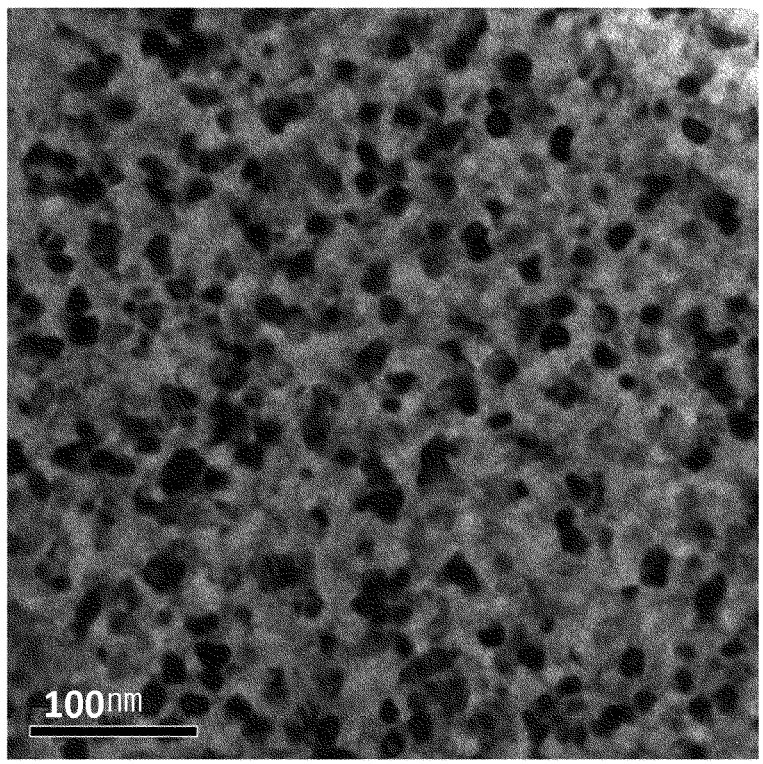
FIGS. 15A and 15B are TEM photographs of an Fe-based soft magnetic alloy according to one embodiment of the present invention.
Figure 15B:
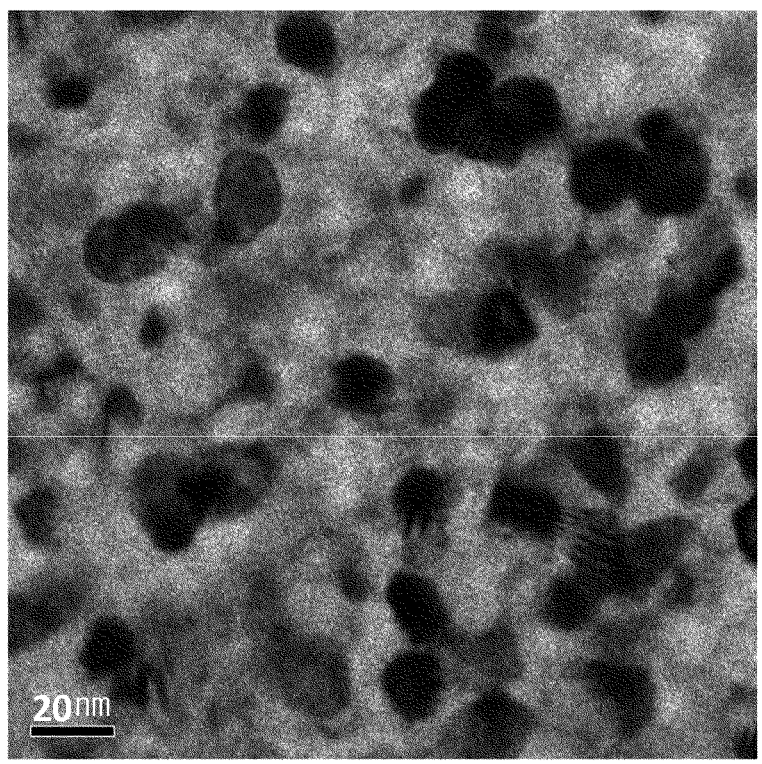
Figure 16A:
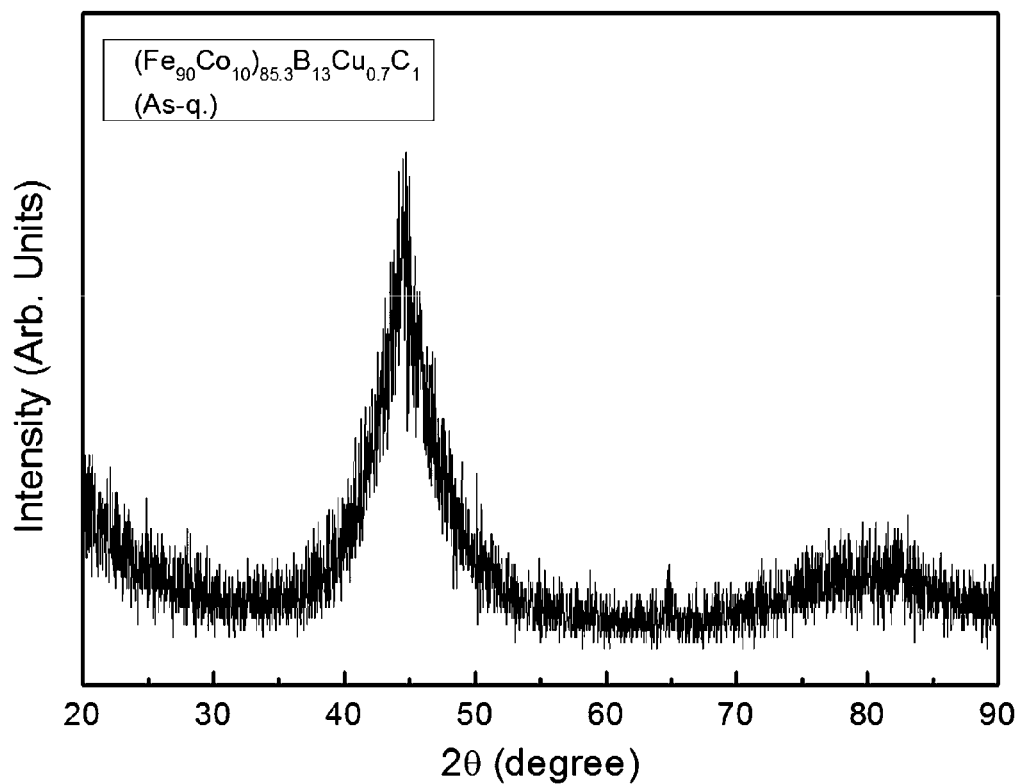
FIGS. 16A to 16D are XRD patterns of the initial alloys before heat treatment of the soft magnetic alloys manufactured by varying the contents of Fe and Co according to various embodiments of the present invention.
Figure 16B:
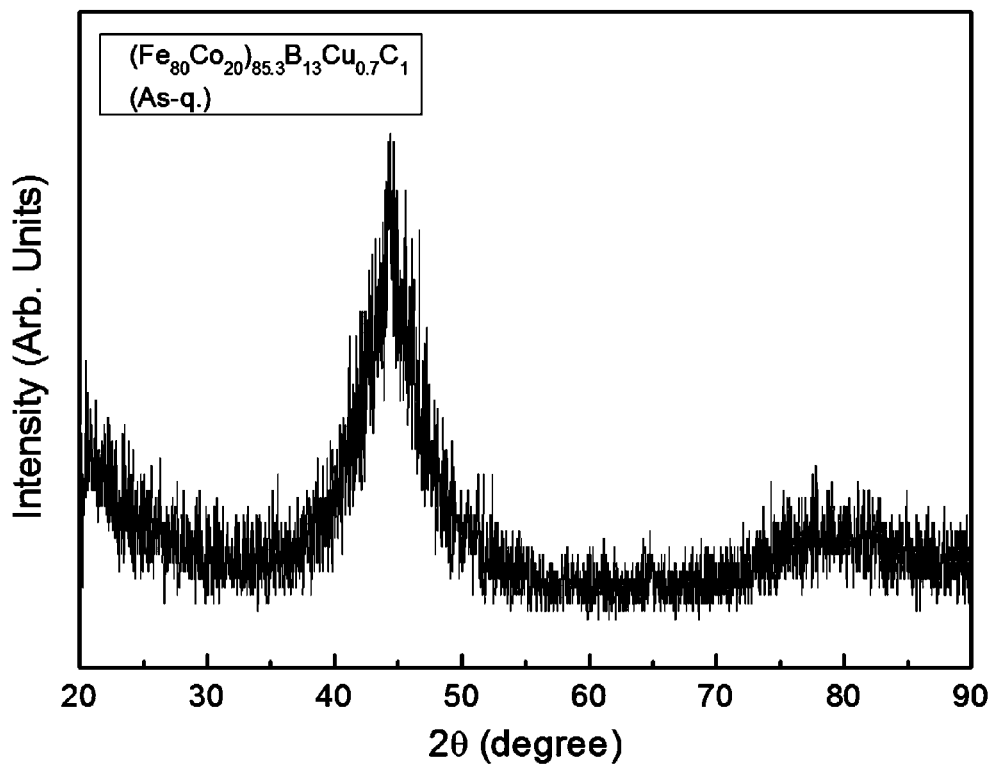
Figure 16C:
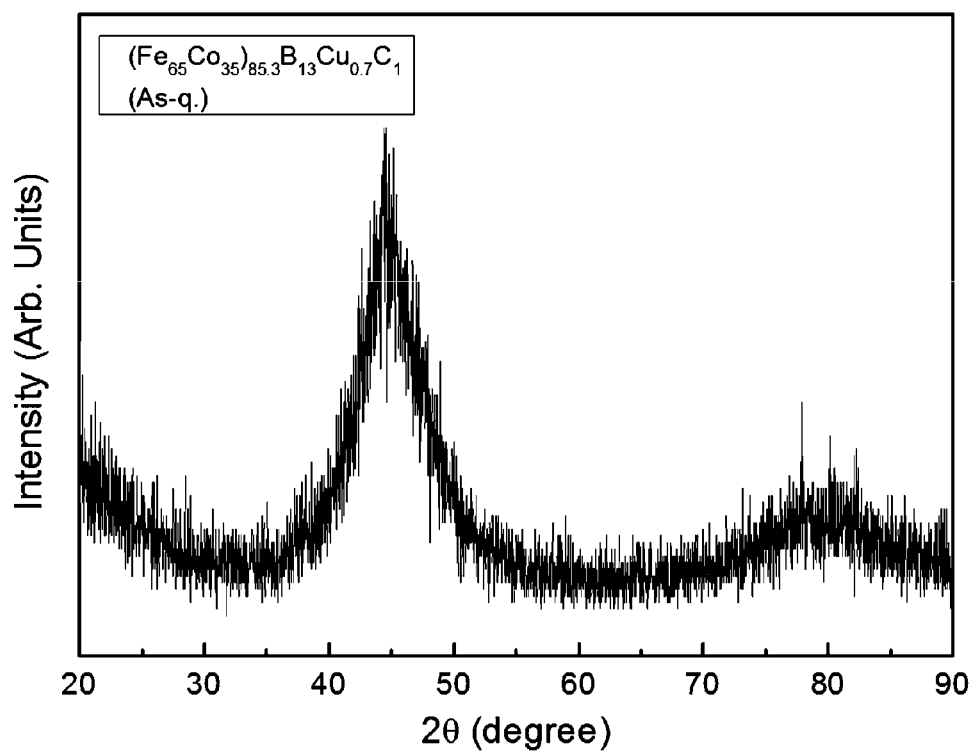
Figure 16D:
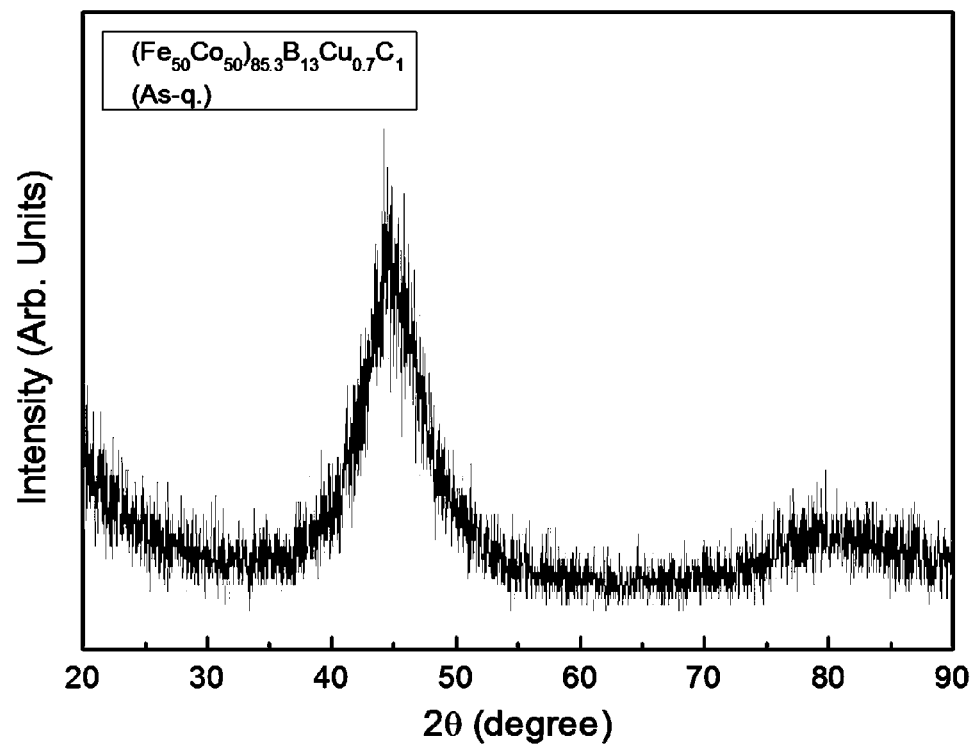
Figure 17A:
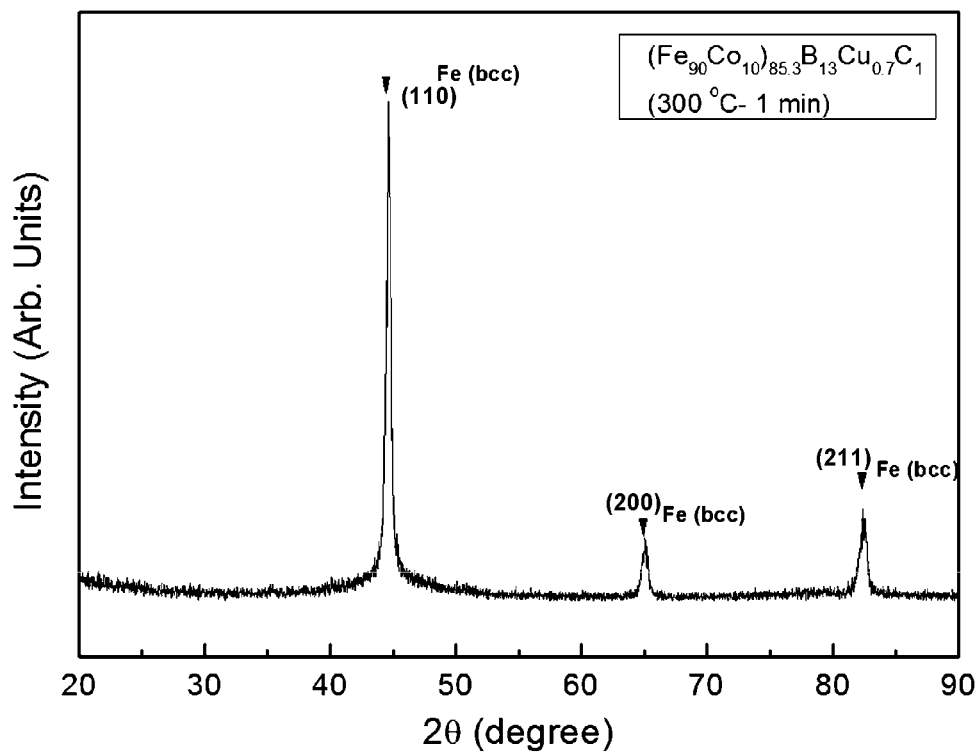
FIGS. 17A to 17D are XRD patterns of soft magnetic alloys obtained by heat-treating the initial alloys in FIGS. 16A to 16D.
Figure 17B:
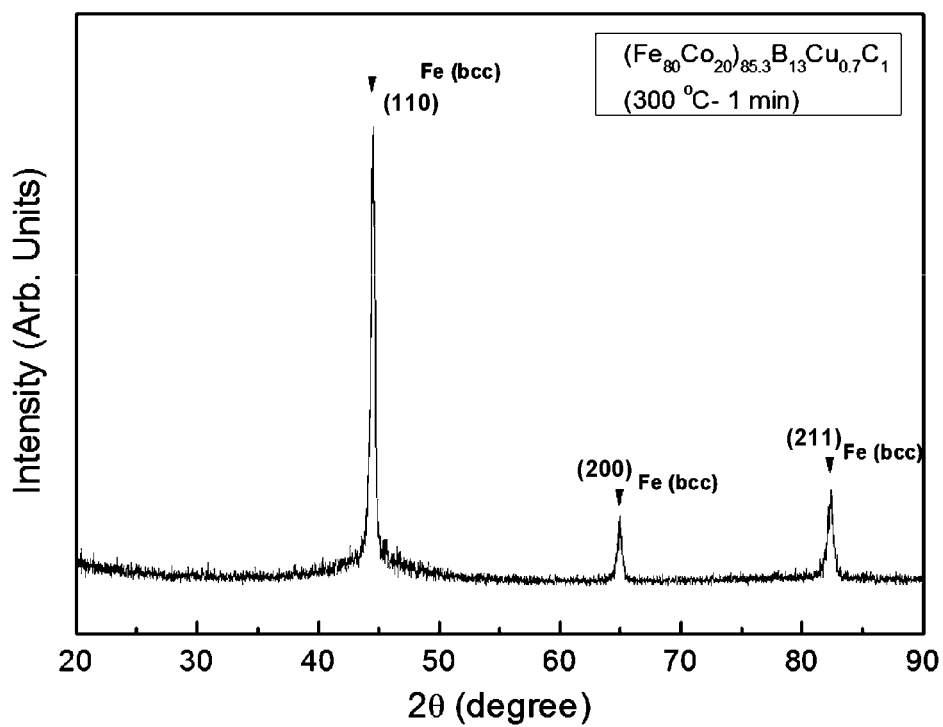
Figure 17C:
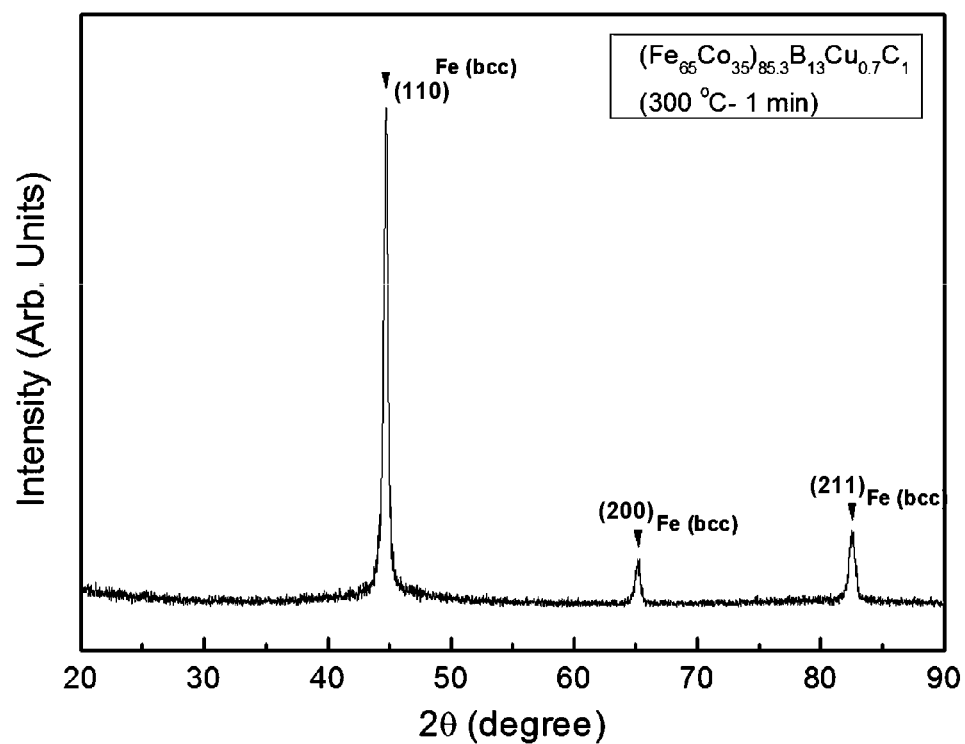
Figure 17D:
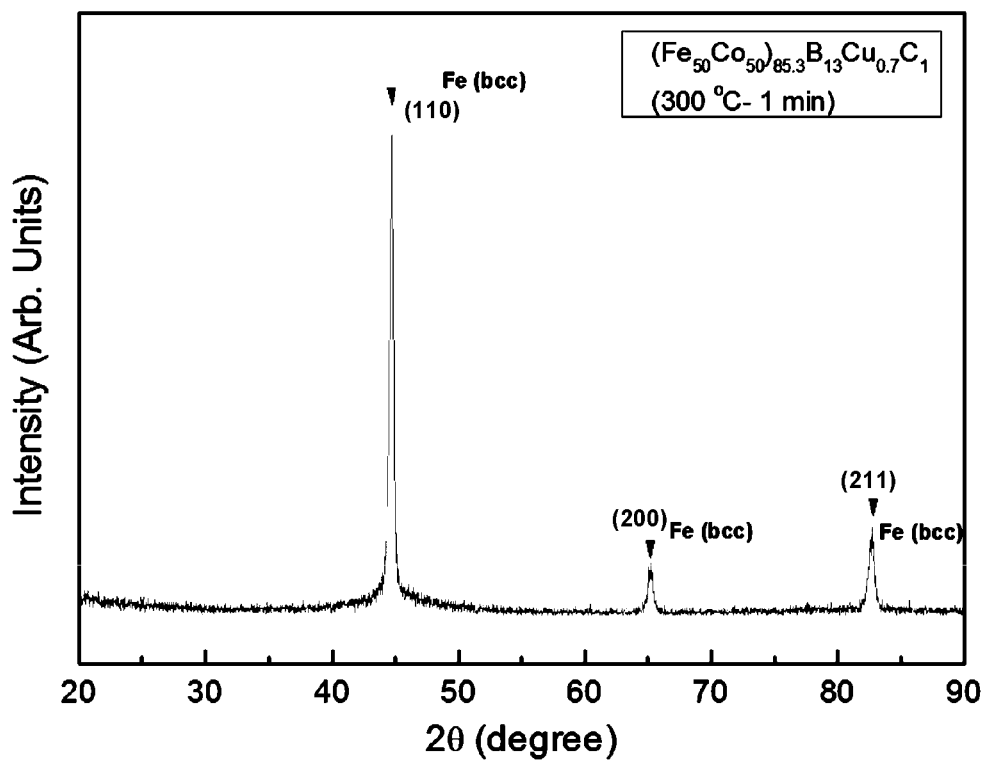
Figure 18A:
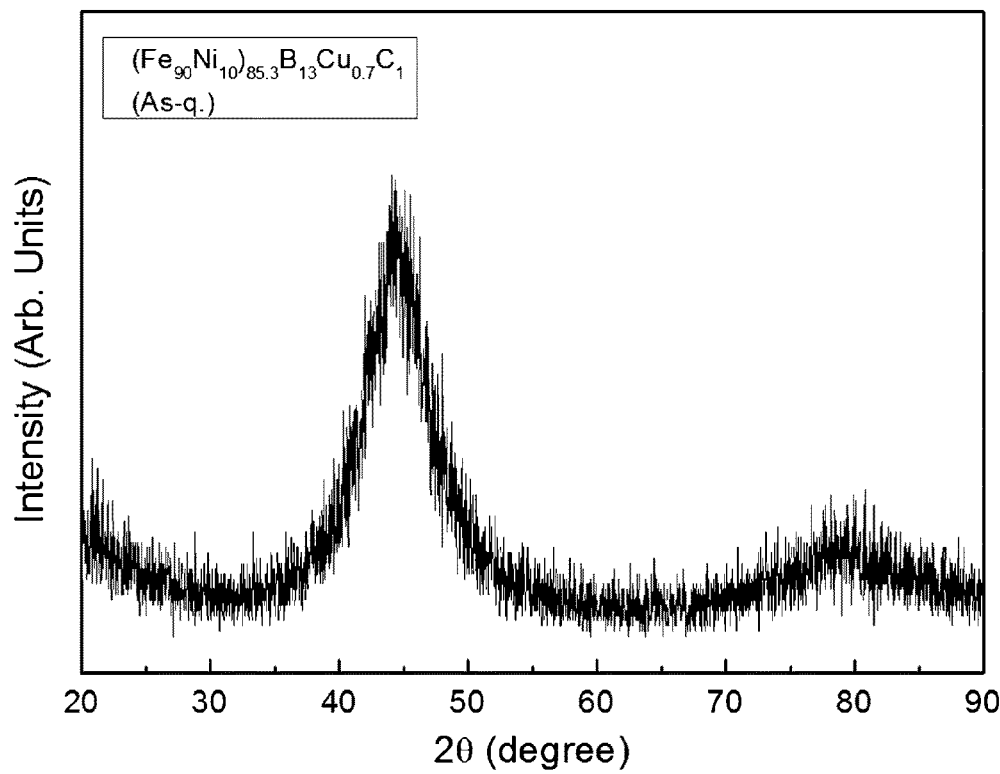
FIGS. 18A to 18D are XRD patterns of the initial alloys before heat treatment of the soft magnetic alloys manufactured by varying the contents of Fe and Ni according to various embodiments of the present invention.
Figure 18B:
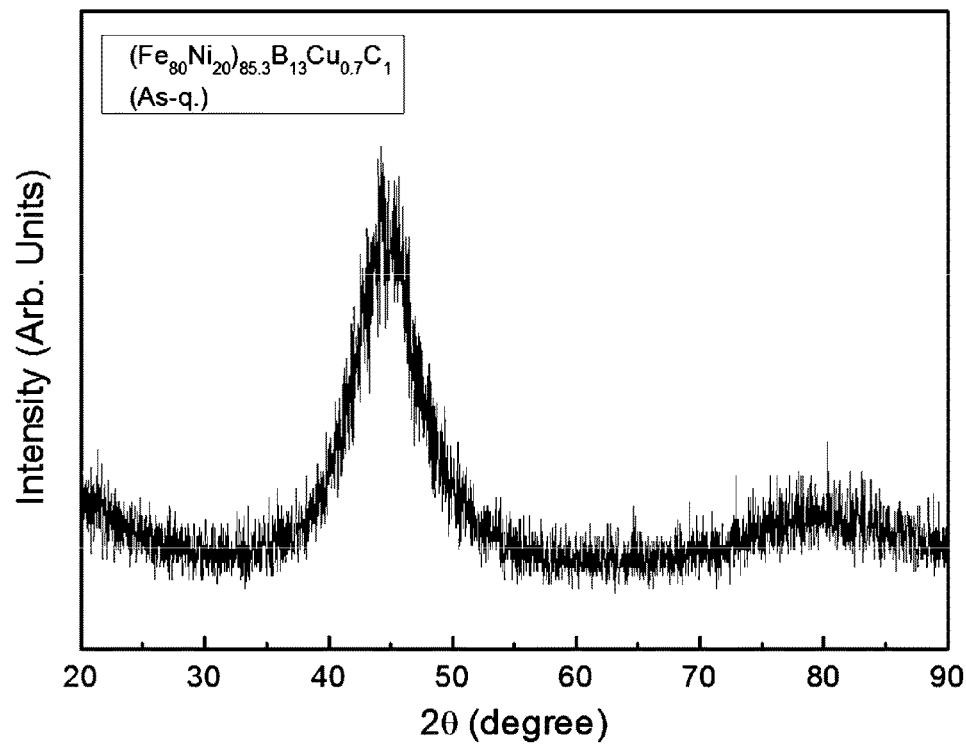
Figure 18C:
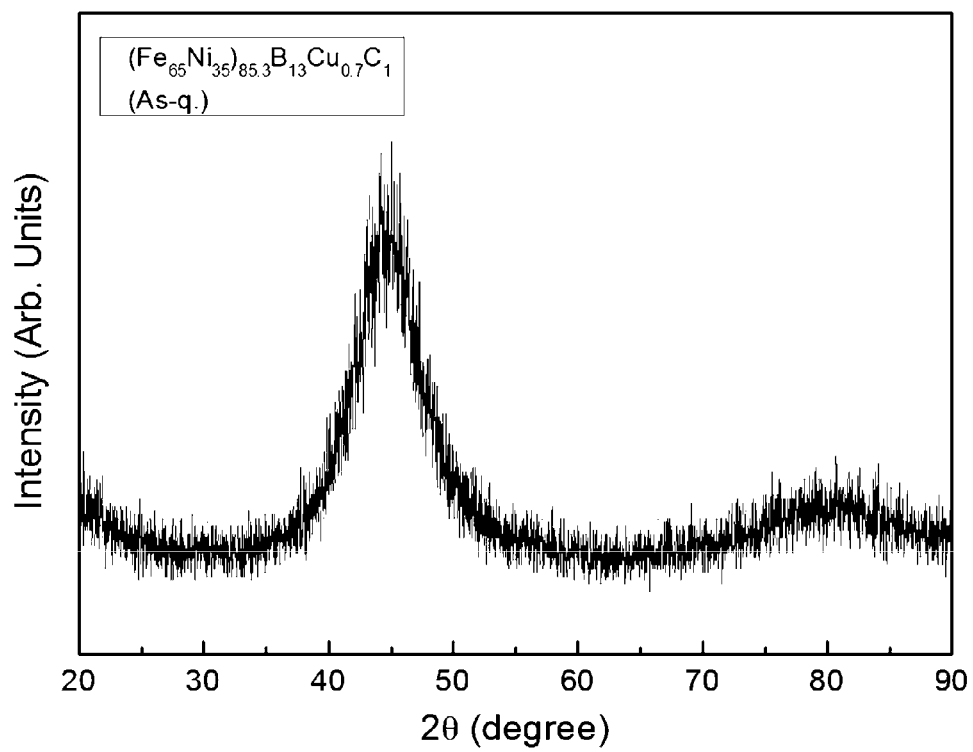
Figure 18D:
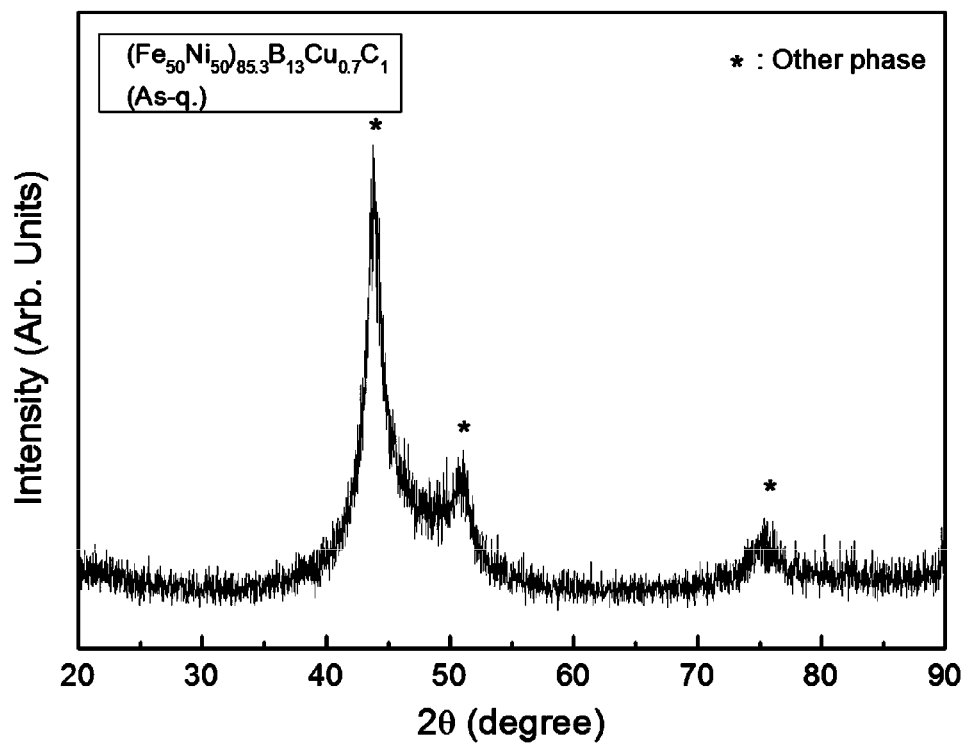

The heat-treated alloy in Example 1 was captured by TEM, and is illustrated in FIGS. 15A and 15B.

As a result of observation, it can be confirmed that nanocrystal grains were produced, and the particle diameters of crystals were uniform.

TABLE 1

| | | | Example 1 | Example 2 | Example 3 | Example 4 | Example 5 |
|---|---|---|---|---|---|---|---|
| Initial alloy | Empirical formula $Fe_aB_bC_cCu_d$ | a (at %) | 85.3 | 85.3 | 85.3 | 85.3 | 85.3 |
| | | b (at %) | 13 | 12 | 11 | 10 | 9 |
| | | c (at %) | 1 | 2 | 3 | 4 | 5 |
| | | d (at %) | 0.7 | 0.7 | 0.7 | 0.7 | 0.7 |
| | | b + c (at %) | 14 | 14 | 14 | 14 | 14 |
| | | Mathematical Equation 1 | 13 | 4.24 | 2.12 | 1.25 | 0.80 |
| | | Mathematical Equation 2 | 3.32 | 3.32 | 3.32 | 3.32 | 3.32 |
| | | Mathematical Equation 3 | — | — | — | — | — |
| | | Mathematical Equation 4 | — | — | — | — | — |
| | | Crystal phase | Amorphous | Amorphous | Amorphous | Amorphous | Amorphous |
| | | Bs (T) | 1.60 | 1.61 | 1.65 | 1.65 | 1.65 |
| | | Hc (A/m) | 43.89 | 38.04 | 78.05 | 55.38 | 83.34 |
| Heat treatment temperature (° C.)/Heat treatment time (sec)/Heating rate (° C./m) | | | 350/60/80 | 350/60/80 | 350/60/80 | 350/60/80 | 350/60/80 |
| Alloy after heat treatment | | Crystal phase | Crystalline + Amorphous | Crystalline + Amorphous | Crystalline + Amorphous | Crystalline + Amorphous | Crystalline + Amorphous |
| | | Crystal average particle diameter (nm) | 17 | 16.6 | 17.2 | 17.6 | 16.5 |
| | | Crystallized area value (%) | 65.3 | 72.8 | 71.8 | 72.3 | 72.6 |
| | | Bs (T) | 1.89 | 1.93 | 1.80 | 1.88 | 1.88 |
| | | Hc (A/m) | 65.49 | 67.07 | 157.42 | 142.70 | 163.37 |

| | | | Example 6 | Example 7 | Example 8 | Example 9 | Example 10 |
|---|---|---|---|---|---|---|---|
| Initial alloy | Empirical formula $Fe_aB_bC_cCu_d$ | a (at %) | 79.3 | 79.3 | 79.3 | 79.3 | 79.3 |
| | | b (at %) | 14 | 12 | 10 | 8 | 6.67 |
| | | c (at %) | 6 | 8 | 10 | 12 | 13.33 |
| | | d (at %) | 0.7 | 0.7 | 0.7 | 0.7 | 0.7 |
| | | b + c (at %) | 20 | 20 | 20 | 20 | 20 |
| | | Mathematical Equation 1 | — | — | — | — | — |
| | | Mathematical Equation 2 | — | — | — | — | — |
| | | Mathematical Equation 3 | 4.76 | 2.65 | 1.85 | 0.96 | 0.68 |
| | | Mathematical Equation 4 | 10.64 | 10.64 | 10.64 | 10.64 | 10.64 |
| | | Crystal phase | Amorphous | Amorphous | Amorphous | Amorphous | Amorphous |
| | | Bs (T) | 1.65 | 1.61 | 1.58 | 1.64 | 1.58 |
| | | Hc (A/m) | 44.28 | 37.74 | 52.74 | 104.53 | 64.07 |
| Heat treatment temperature (° C.)/Heat treatment time (sec)/Heating rate (° C./m) | | | 360/60/80 | 360/60/80 | 360/60/80 | 360/60/80 | 360/60/80 |
| Alloy after heat treatment | | Crystal phase | Crystalline + Amorphous | Crystalline + Amorphous | Crystalline + Amorphous | Crystalline + Amorphous | Crystalline + Amorphous |
| | | Crystal average particle diameter (nm) | 15.2 | 15.4 | 17.0 | 16.3 | 15.9 |
| | | Crystallized area value (%) | 52.8 | 53.7 | 52.4 | 53.1 | 54.8 |
| | | Bs (T) | 1.69 | 1.67 | 1.66 | 1.68 | 1.68 |
| | | Hc (A/m) | 68.46 | 59.20 | 166.94 | 53.14 | 59.13 |

TABLE 2

| | | | Example 11 | Example 12 | Example 13 | Example 14 | Example 15 |
|---|---|---|---|---|---|---|---|
| Initial alloy | Empirical formula $Fe_aB_bC_cCu_d$ | a (at %) | 85.1 | 85.6 | 82.5 | 84.5 | 85.8 |
| | | b (at %) | 7.1 | 6.6 | 9 | 8 | 8 |
| | | c (at %) | 7.1 | 7.1 | 8 | 7 | 5.5 |

TABLE 2-continued

|  |  | | | | | |
|---|---|---|---|---|---|---|
| | d (at %) | 0.7 | 0.7 | 0.5 | 0.5 | 0.7 |
| | b + c (at %) | 14.2 | 13.7 | 17 | 15 | 13.5 |
| | Mathematical Equation 1 | 0.375 | 0.349 | 0.397 | 0.431 | 0.62 |
| | Mathematical Equation 2 | 3.32 | 3.33 | 3.58 | 3.61 | 3.32 |
| | Mathematical Equation 3 | — | — | — | — | — |
| | Mathematical Equation 4 | — | — | — | — | — |
| | Crystal phase | Crystalline + Amorphous | Crystalline + Amorphous | Amorphous | Amorphous | Amorphous |
| | Bs (T) | 1.78 | 1.83 | 1.62 | 1.64 | 1.65 |
| | Hc (A/m) | 321.4 | 297.6 | 68.42 | 59.38 | 62.74 |
| Heat treatment temperature (° C.)/Heat treatment time (sec)/Heating rate (° C./m) | | 350/60/80 | 350/60/80 | 350/60/80 | 350/60/80 | 350/60/80 |
| Alloy after heat treatment | Crystal phase | Crystalline + Amorphous | Crystalline + Amorphous | Crystalline + Amorphous | Crystalline + Amorphous | Crystalline + Amorphous |
| | Crystal average particle diameter (nm) | 54.7 | 61.9 | 17.9 | 17.5 | 16.6 |
| | Crystallized area value (%) | 93.1 | 92.4 | 72.4 | 70.8 | 79.4 |
| | Bs (T) | 1.89 | 1.96 | 1.75 | 1.81 | 1.94 |
| | Hc (A/m) | 1953.4 | 2017.90 | 80.41 | 73.14 | 78.41 |

|  |  | Example 16 | Example 17 | Example 18 | Example 19 | Example 20 |
|---|---|---|---|---|---|---|
| Initial alloy | Empirical formula $Fe_aB_bC_cCu_d$ a (at %) | 83.3 | 82.3 | 82.5 | 82.01 | 82.2 |
| | b (at %) | 10 | 16.0 | 16 | 16 | 16.6 |
| | c (at %) | 6 | 1.0 | 0.99 | 0.99 | 0.7 |
| | d (at %) | 0.7 | 1.0 | 0.5 | 1.0 | 0.5 |
| | b + c (at %) | 16 | 17 | 16.99 | 16.99 | 17.3 |
| | Mathematical Equation 1 | 0.68 | 16.0 | 16.24 | 16.24 | 28.34 |
| | Mathematical Equation 2 | 3.30 | 3.29 | 3.58 | 3.00 | 3.58 |
| | Mathematical Equation 3 | — | | | | |
| | Mathematical Equation 4 | — | | | | |
| | Crystal phase | Amorphous | Amorphous | Amorphous | Amorphous | Amorphous |
| | Bs (T) | 1.63 | 1.62 | 1.62 | 1.61 | 1.62 |
| | Hc (A/m) | 54.31 | 52.67 | 68.91 | 55.74 | 57.87 |
| Heat treatment temperature (° C.)/Heat treatment time (sec)/Heating rate (° C./m) | | 350/60/80 | 350/60/80 | 350/60/80 | 350/60/80 | 350/60/80 |
| Alloy after heat treatment | Crystal phase | Crystalline + Amorphous | Crystalline + Amorphous | Crystalline + Amorphous | Crystalline + Amorphous | Crystalline + Amorphous |
| | Crystal average particle diameter (nm) | 15.2 | 16.5 | 17.0 | 18.9 | 25.9 |
| | Crystallized area value (%) | 69.4 | 75.4 | 74.9 | 72.6 | 83.1 |
| | Bs (T) | 1.79 | 1.73 | 1.71 | 1.70 | 1.71 |
| | Hc (A/m) | 50.68 | 46.48 | 56.47 | 65.47 | 67.48 |

TABLE 3

|  |  | | Example 21 | Example 22 | Example 23 | Example 24 | Example 25 |
|---|---|---|---|---|---|---|---|
| Initial alloy | Empirical formula $Fe_aB_bC_cCu_d$ | a (at %) | 82.0 | 83.8 | 82.9 | 85.51 | 78.7 |
| | | b (at %) | 16.8 | 14 | 13 | 13 | 6.8 |
| | | c (at %) | 0.7 | 1 | 3 | 0.99 | 14 |
| | | d (at %) | 0.5 | 1.2 | 1.1 | 0.5 | 0.5 |
| | | b + c (at %) | 17.5 | 15 | 16 | 13.99 | 20.8 |
| | | Mathematical Equation 1 | 28.69 | 14 | 2.50 | 13.19 | — |
| | | Mathematical Equation 2 | 3.58 | 2.89 | 2.94 | 3.62 | — |
| | | Mathematical Equation 3 | — | — | — | — | 0.65 |
| | | Mathematical Equation 4 | — | — | — | — | 12.55 |
| | | Crystal phase | Amorphous | Amorphous | Amorphous | Amorphous | Amorphous |
| | | Bs (T) | 1.63 | 1.64 | 1.63. | 1.64 | 1.59 |
| | | Hc (A/m) | 68.434 | 57.688 | 54.626 | 49.644 | 38.415 |
| Heat treatment temperature (° C.)/Heat treatment time (sec)/Heating rate (° C./m) | | | 350/60/80 | 350/60/80 | 350/60/80 | 350/60/80 | 350/60/80 |
| Alloy after heat treatment | Crystal phase | | Crystalline + Amorphous | Crystalline + Amorphous | Crystalline + Amorphous | Crystalline + Amorphous | Crystalline + Amorphous |
| | Crystal average particle diameter (nm) | | 28.4 | 19.2 | 19.1 | 18.6 | 17.7 |
| | Crystallized area value (%) | | 90.5 | 77.4 | 81.6 | 75.4 | 70.4 |
| | Bs (T) | | 1.74 | 1.78 | 1.75 | 1.87 | 1.68 |
| | Hc (A/m) | | 265.96 | 134.98 | 51.22 | 58.64 | 89.42 |

TABLE 3-continued

|  |  |  | Example 26 | Example 27 | Example 28 | Example 29 | Example 30 |
|---|---|---|---|---|---|---|---|
| Initial alloy | Empirical formula $Fe_aB_bC_cCu_d$ | a (at %) | 78.6 | 78.5 | 79.0 | 78.51 | 81.9 |
|  |  | b (at %) | 7 | 7.8 | 8 | 20.3 | 17.1 |
|  |  | c (at %) | 13.9 | 13.2 | 12.5 | 0.69 | 0.5 |
|  |  | d (at %) | 0.5 | 0.5 | 0.5 | 0.5 | 0.5 |
|  |  | b + c (at %) | 20.9 | 21 | 20.5 | 20.99 | 17.6 |
|  |  | Mathematical Equation 1 | — | — | — | — | — |
|  |  | Mathematical Equation 2 | — | — | — | — | — |
|  |  | Mathematical Equation 3 | 0.675 | 0.813 | 0.905 | 177.09 | 241.83 |
|  |  | Mathematical Equation 4 | 12.54 | 12.53 | 12.57 | 12.53 | 12.79 |
|  |  | Crystal phase | Amorphous | Amorphous | Amorphous | Amorphous | Amorphous |
|  |  | Bs (T) | 1.59 | 1.60 | 1.61 | 1.57 | 1.62 |
|  |  | Hc (A/m) | 37.36 | 46.98 | 34.18 | 42.68 | 51.84 |
| Heat treatment temperature (° C.)/Heat treatment time (sec)/Heating rate (° C./m) |  |  | 350/60/80 | 350/60/80 | 350/60/80 | 350/60/80 | 350/60/80 |
| Alloy after heat treatment | Crystal phase |  | Crystalline + Amorphous | Crystalline + Amorphous | Crystalline + Amorphous | Crystalline + Amorphous | Crystalline + Amorphous |
|  | Crystal average particle diameter (nm) |  | 16.5 | 16.3 | 18.1 | 19.0 | 18.0 |
|  | Crystallized area value (%) |  | 68.4 | 62.4 | 70.4 | 67.2 | 61.3 |
|  | Bs (T) |  | 1.67 | 1.69 | 1.69 | 1.66 | 1.72 |
|  | Hc (A/m) |  | 68.31 | 69.79 | 73.42 | 80.64 | 88.80 |

TABLE 4

|  |  |  | Example 31 | Example 32 | Example 33 | Example 34 | Example 35 | Example 36 |
|---|---|---|---|---|---|---|---|---|
| Initial alloy | Empirical formula $Fe_aB_bC_cCu_d$ | a (at %) | 81.9 | 78.5 | 78.5 | 81.9 | 85.3 | 85.3 |
|  |  | b (at %) | 8 | 7.4 | 19.4 | 16 | 13 | 13 |
|  |  | c (at %) | 8.9 | 13 | 1 | 1.6 | 1 | 1 |
|  |  | d (at %) | 1.2 | 1.1 | 1.1 | 0.5 | 0.7 | 0.7 |
|  |  | b + c (at %) | 20.4 | 20.4 | 20.4 | 17.6 | 14 | 14 |
|  |  | Mathematical Equation 1 | — | — | — | — | 13 | 13 |
|  |  | Mathematical Equation 2 | — | — | — | — | 3.32 | 3.32 |
|  |  | Mathematical Equation 3 | 1.51 | 0.79 | 97 | 39.5 | — | — |
|  |  | Mathematical Equation 4 | 8.26 | 8.45 | 8.45 | 12.79 | — | — |
|  |  | Crystal phase | Crystalline + Amorphous | Amorphous | Amorphous | Amorphous | Amorphous | Amorphous |
|  |  | Bs (T) | 1.81 | 1.62 | 1.64 | 1.66 | 1.60 | 1.60 |
|  |  | Hc (A/m) | 241.32 | 38.9 | 48.5 | 51.6 | 43.89 | 43.89 |
| Heat treatment temperature (° C.)/Heat treatment time (sec)/Heating rate (° C./m) |  |  | 350/60/80 | 350/60/80 | 350/60/80 | 350/60/80 | 375/10/80 | 375/35/80 |
| Alloy after heat treatment | Crystal phase |  | Crystalline + Amorphous | Crystalline + Amorphous | Crystalline + Amorphous | Crystalline + Amorphous | Crystalline + Amorphous | Crystalline + Amorphous |
|  | Crystal average particle diameter (nm) |  | 40.8 | 17.7 | 17.4 | 16.8 | 18 | 18 |
|  | Crystallized area value (%) |  | 89.8 | 72.9 | 68.4 | 65.8 | 65.4 | 73.8 |
|  | Bs (T) |  | 1.84 | 1.68 | 1.69 | 1.73 | 1.79 | 1.80 |
|  | Hc (A/m) |  | 1683.42 | 102.6 | 94.62 | 73.8 | 132 | 138 |

|  |  |  | Example 37 | Example 38 | Example 39 | Example 40 | Example 41 |
|---|---|---|---|---|---|---|---|
| Initial alloy | Empirical formula $Fe_aB_bC_cCu_d$ | a (at %) | 85.3 | 85.3 | 85.3 | 85.3 | 85.3 |
|  |  | b (at %) | 13 | 13 | 13 | 13 | 13 |
|  |  | c (at %) | 1 | 1 | 1 | 1 | 1 |
|  |  | d (at %) | 0.7 | 0.7 | 0.7 | 0.7 | 0.7 |
|  |  | b + c (at %) | 14 | 14 | 14 | 14 | 14 |
|  |  | Mathematical Equation 1 | 13 | 13 | 13 | 13 | 13 |
|  |  | Mathematical Equation 2 | 3.32 | 3.32 | 3.32 | 3.32 | 3.32 |
|  |  | Mathematical Equation 3 | — | — | — | — | — |

TABLE 4-continued

|  |  |  |  |  |  |  |
|---|---|---|---|---|---|---|
|  | Mathematical Equation 4 | — | — | — | — | — |
|  | Crystal phase | Amorphous | Amorphous | Amorphous | Amorphous | Amorphous |
|  | Bs (T) | 1.60 | 1.60 | 1.60 | 1.60 | 1.60 |
|  | Hc (A/m) | 43.89 | 43.89 | 43.89 | 43.89 | 43.89 |
|  | Heat treatment temperature (° C.)/Heat treatment time (sec)/Heating rate (° C./m) | 375/45/80 | 375/60/80 | 375/95/80 | 375/110/80 | 375/180/80 |
| Alloy after heat treatment | Crystal phase | Crystalline + Amorphous | Crystalline + Amorphous | Crystalline + Amorphous | Crystalline + Amorphous | Crystalline + Amorphous |
|  | Crystal average particle diameter (nm) | 19 | 19 | 20 | 22 | 20 |
|  | Crystallized area value (%) | 76.5 | 80.0 | 82.4 | 85.6 | 85.9 |
|  | Bs (T) | 1.87 | 1.91 | 1.91 | 1.91 | 1.88 |
|  | Hc (A/m) | 141 | 140 | 145 | 160 | 159 |

TABLE 5

|  |  |  | Example 42 | Example 43 | Example 44 | Example 45 | Example 46 | Example 47 |
|---|---|---|---|---|---|---|---|---|
| Initial alloy | Empirical formula $Fe_aB_bC_cCu_d$ | a (at %) | 85.3 | 85.3 | 85.3 | 85.3 | 85.3 | 85.3 |
|  |  | b (at %) | 13 | 13 | 13 | 13 | 13 | 13 |
|  |  | c (at %) | 1 | 1 | 1 | 1 | 1 | 1 |
|  |  | d (at %) | 0.7 | 0.7 | 0.7 | 0.7 | 0.7 | 0.7 |
|  |  | b + c (at %) | 14 | 14 | 14 | 14 | 14 | 14 |
|  | Mathematical Equation 1 |  | 13 | 13 | 13 | 13 | 13 | 13 |
|  | Mathematical Equation 2 |  | 3.32 | 3.32 | 3.32 | 3.32 | 3.32 | 3.32 |
|  | Mathematical Equation 3 |  | — | — | — | — | — | — |
|  | Mathematical Equation 4 |  | — | — | — | — | — | — |
|  | Crystal phase |  | Amorphous | Amorphous | Amorphous | Amorphous | Amorphous | Amorphous |
|  | Bs (T) |  | 1.60 | 1.60 | 1.60 | 1.60 | 1.60 | 1.60 |
|  | Hc (A/m) |  | 43.89 | 43.89 | 43.89 | 43.89 | 43.89 | 43.89 |
| Heat treatment temperature (° C.)/Heat treatment time (sec)/Heating rate (° C./m) |  |  | 400/60/80 | 420/60/80 | 190/60/80 | 210/60/80 | 270/60/80 | 285/60/80 |
| Alloy after heat treatment | Crystal phase |  | Crystalline + Amorphous | Crystalline + Amorphous | Crystalline + Amorphous | Crystalline + Amorphous | Crystalline + Amorphous | Crystalline + Amorphous |
|  | Crystal average particle diameter (nm) |  | 22 | 29 | — | — | 16 | 19 |
|  | Crystallized area value (%) |  | 82.8 | 86.8 | — | — | 59.3 | 62.4 |
|  | Bs (T) |  | 1.91 | 1.94 | 1.63 | 1.72 | 1.75 | 1.83 |
|  | Hc (A/m) |  | 167 | 179 | 89 | 91 | 132 | 147 |

|  |  |  | Example 48 | Example 49 | Example 50 | Example 51 | Example 52 |
|---|---|---|---|---|---|---|---|
| Initial alloy | Empirical formula $Fe_aB_bC_cCu_d$ | a (at %) | 85.3 | 85.3 | 85.3 | 85.3 | 85.3 |
|  |  | b (at %) | 13 | 13 | 13 | 13 | 13 |
|  |  | c (at %) | 1 | 1 | 1 | 1 | 1 |
|  |  | d (at %) | 0.7 | 0.7 | 0.7 | 0.7 | 0.7 |
|  |  | b + c (at %) | 14 | 14 | 14 | 14 | 14 |
|  | Mathematical Equation 1 |  | 13 | 13 | 13 | 13 | 13 |
|  | Mathematical Equation 2 |  | 3.32 | 3.32 | 3.32 | 3.32 | 3.32 |
|  | Mathematical Equation 3 |  | — | — | — | — | — |
|  | Mathematical Equation 4 |  | — | — | — | — | — |
|  | Crystal phase |  | Amorphous | Amorphous | Amorphous | Amorphous | Amorphous |
|  | Bs (T) |  | 1.60 | 1.60 | 1.60 | 1.60 | 1.60 |
|  | Hc (A/m) |  | 43.89 | 43.89 | 43.89 | 43.89 | 43.89 |
| Heat treatment temperature (° C.)/Heat treatment time (sec)/Heating rate (° C./m) |  |  | 325/60/25 | 325/60/30 | 325/60/55 | 325/60/80 | 325/60/95 |

TABLE 5-continued

| Alloy after heat treatment | Crystal phase | Crystalline + Amorphous | Crystalline + Amorphous | Crystalline + Amorphous | Crystalline + Amorphous | Crystalline + Amorphous |
|---|---|---|---|---|---|---|
| | Crystal average particle diameter (nm) | 24 | 21 | 20 | 17 | 17 |
| | Crystallized area value (%) | 48.7 | 53.4 | 63.0 | 60.1 | 58.2 |
| | Bs (T) | 1.88 | 1.89 | 1.914 | 1.90 | 1.91 |
| | Hc (A/m) | 180 | 157 | 143 | 140 | 151 |

TABLE 6

| | | | Comparative Example 1 | Comparative Example 2 | Comparative Example 3 | Comparative Example 4 | Comparative Example 5 |
|---|---|---|---|---|---|---|---|
| Initial alloy | Empirical formula $Fe_aB_bC_cCu_d$ | a (at %) | 86.3 | 86.3 | 86.0 | 87.3 | 86.2 |
| | | b (at %) | 11.0 | 12.0 | 10.0 | 11 | 8.7 |
| | | c (at %) | 2.0 | 1.0 | 3.0 | 1.0 | 4.6 |
| | | d (at %) | 0.7 | 0.7 | 1.0 | 0.7 | 0.5 |
| | | b + c (at %) | 13 | 13 | 13 | 12 | 13.3 |
| | Crystal phase | | Crystalline | Crystalline | Crystalline | Crystalline | Crystalline |
| | Bs (T) | | 1.87 | 1.85 | 1.83 | 1.91 | 1.83 |
| | Hc (A/m) | | 541.64 | 592.16 | 618.48 | 528.64 | 604.84 |
| | Heat treatment temperature (° C.)/Heat treatment time (sec)/Heating rate (° C./m) | | 350/60/80 | 350/60/80 | 350/60/80 | 350/60/80 | 350/60/80 |
| Alloy after heat treatment | Crystal phase | | Crystalline | Crystalline | Crystalline | Crystalline | Crystalline |
| | Crystal average particle diameter (nm) | | 50.49 | 50.82 | 51.21 | 49.76 | 53.69 |
| | Bs (T) | | 1.91 | 1.94 | 1.93 | 1.95 | 1.89 |
| | Hc (A/m) | | 2234.12 | 2164.85 | 2264.34 | 1986.42 | 2354.56 |

| | | | Comparative Example 6 | Comparative Example 7 | Comparative Example 8 | Comparative Example 9 |
|---|---|---|---|---|---|---|
| Initial alloy | Empirical formula $Fe_aB_bC_cCu_d$ | a (at %) | 78.2 | 85.6 | 84.4 | 78.5 |
| | | b (at %) | 15.0 | 9.0 | 9 | 18.9 |
| | | c (at %) | 6.3 | 5.0 | 15 | 1 |
| | | d (at %) | 0.5 | 0.4 | 1.6 | 1.6 |
| | | b + c (at %) | 21.3 | 14 | 16.6 | 19.9 |
| | Crystal phase | | Amorphous | Amorphous | Crystalline + Amorphous | Crystalline + Amorphous |
| | Bs (T) | | 1.57 | 1.67 | 1.70 | 1.58 |
| | Hc (A/m) | | 52.41 | 62.18 | 242.64 | 217.84 |
| | Heat treatment temperature (° C.)/Heat treatment time (sec)/Heating rate (° C./m) | | 350/60/80 | 350/60/80 | 350/60/80 | 350/60/80 |
| Alloy after heat treatment | Crystal phase | | Crystalline + Amorphous | Crystalline + Amorphous | Crystalline | Crystalline |
| | Crystal average particle diameter (nm) | | 20.64 | 21.39 | 30.4 | 30.6 |
| | Bs (T) | | 1.64 | 1.86 | 1.80 | 1.72 |
| | Hc (A/m) | | 124.18 | 196.5 | 1246.34 | 1126.76 |

Through Tables 1 to 5, it can be confirmed that as the Fe-based soft magnetic alloys according to the Examples exhibit higher saturated magnetic flux densities and/or lower coercivities than those of the Fe-based soft magnetic alloys according to the Comparative Examples, the magnetic properties are excellent.

Further, referring to Examples 11 to 24 in which a in the empirical formula satisfies 82 to 86 at %, it can be confirmed that in the case of Examples 11 and 12, as the value of Mathematical Formula 1 is less than 0.38, crystals are produced in the initial alloys, and accordingly, the coercivities are increased as compared to Examples 13 to 20 which satisfy Mathematical Formula 1, and particularly, it can be seen that the coercivities after the heat treatment are remarkably increased.

In addition, it can be confirmed that the particle diameter of produced crystals also exceeds 30 nm and becomes coarse. Furthermore, it can be confirmed that in the case of Example 21 in which the value of Mathematical Formula 1 exceeds 28.5, an amorphous alloy in the initial alloy is realized, but the coercivity after the heat treatment is remarkably increased. From this, the crystal phase is nanocrystal grains and the crystals have an average particle diameter of 28.4 nm, but as crystals having a coarse particle diameter are included, it is expected that the coercivity is increased by about 4 times as compared to that in Example 20, and it can be seen that when the content of B in the alloy is in excess, the particle diameter is not easily controlled.

Further, it can be expected that in the case of Example 22 in which the value of Mathematical Formula 2 is less than 2.92, the magnetic loss is increased because the coercivity is larger than that in Example 23.

In addition, referring to Examples 25 to 34 in which a in the empirical formula satisfies 78.5 or more and less than 82.0 at %, it can be confirmed that in the case of Example 25 in which the value of Mathematical Formula 3 is less than 0.67, the coercivity is larger than that in Example 26.

Furthermore, it can be confirmed that in the case of Example 31 in which the value of Mathematical Formula 4 is less than 8.3, crystals are produced in the initial alloy and the coercivity after the heat treatment is remarkably large, as compared to Examples 32 to 34.

Further, in Examples 35 to 41 in which the alloy is manufactured by varying the heat treatment time at a heat treatment temperature of 375° C., it can be confirmed that in the case of Examples 35 and 36 in which the heat treatment time is set at less than 40 seconds, the saturated magnetic flux density of the alloy after the heat treatment is lower than that in Example 37, and it can be confirmed that in the case of Examples 40 and 41 in which the heat treatment is carried out for more than 100 seconds, the coercivity is increased as compared to that in Example 39.

In addition, in Examples 38 and 42 to 47 in which the alloy is manufactured by varying the heat treatment temperature during the heat treatment, it can be confirmed that in Example 44 in which the heat treatment temperature is less than 200° C., an Fe-based soft magnetic alloy having a lower saturated magnetic flux density than that in Example 45 is realized. Furthermore, it can be confirmed that in the case of Example 43 in which the heat treatment temperature exceeds 410° C., the coercivity is increased as compared to Example 42.

Further, in Examples 48 to 52 in which the alloy is manufactured by varying the heating rate during the heat treatment, it can be confirmed that in the case of Example 48 in which the heating rate is 25° C./m, the coercivity is higher than that in Example 49. In addition, in the case of Example 52 in which the heating rate is 95° C./m, the coercivity is increased as compared to that in Example 51, and the crystal average particle diameter is 17 nm, which is similar to that in Example 51, but it is expected that the difference in particle size distribution of crystals is responsible for the increase in coercivity, and it is expected that Example 51 has a more uniform crystal particle size distribution.

Example 53

After raw materials of Fe, Co, B, C and Cu were weighed such that a master alloy represented by empirical formula $(Fe_{80}Co_{20})_{85.3}B_{13}C_1Cu_{0.7}$ was manufactured, the master alloy was manufactured by using an arc melting method. Thereafter, the manufactured master alloy was melted, and then a soft magnetic initial alloy having a ribbon form with a thickness of about 20 μm and a width of about 2 mm was manufactured by rapidly cooling the melted master alloy at a rate of $10^6$ K/sec through melt spinning at a rate of 60 m/s under an Ar atmosphere.

Thereafter, a soft magnetic alloy as shown in the following Table 7 was manufactured by heat-treating the manufactured soft magnetic initial alloy at a heating rate of 80° C./min at room temperature and carrying out heat treatment at 350° C. for 1 minute.

Examples 54 to 102

The soft magnetic initial alloys and the soft magnetic alloys as shown in the following Tables 7 to 11 were manufactured in the same manner as in Example 53, except that the composition of the empirical formula was changed as shown in the following Tables 7 to 11.

Comparative Examples 10 to 19

The soft magnetic initial alloys and the soft magnetic alloys as shown in the following Table 12 were manufactured in the same manner as in Example 53, except that the composition of the empirical formula was changed as shown in the following Table 12.

Experimental Example 3

For the compositions of the manufactured initial alloys and the alloys after the heat treatment in Examples 53 to 102, the following Mathematical Formulae 1 and 2 or Mathematical Formulae 3 and 4 were calculated according to the content of X, and the values thereof are shown in the following Tables 7 to 12.

(1) In the empirical formula, when a is 82 to 86 at %, Mathematical Formulae 1 and 2

$$\frac{b}{c\sqrt{c}} \quad \text{[Mathematical Formula 1]}$$

$$\sqrt[4]{\frac{a}{d}} \quad \text{[Mathematical Formula 2]}$$

(2) In the empirical formula, when a is 78.5 or more and less than 82.0 at %, Mathematical Formulae 3 and 4

$$\frac{5b}{c\sqrt{c}} \quad \text{[Mathematical Formula 3]}$$

$$\sqrt{\frac{a}{d}} \quad \text{[Mathematical Formula 4]}$$

Experimental Example 4

For the manufactured initial alloys and the alloys after the heat treatment in Examples 53 to 102 and Comparative Examples 10 to 19, the following physical properties were each evaluated, and are shown in the following Tables 7 to 12.

1. Analysis of Crystal Structure

In order to verify the crystal phase for the manufactured initial alloys and the alloys after the heat treatment and the average particle diameter and crystallized area values of the produced crystals, the XRD patterns and TEM photographs were analyzed.

Among the analyzed results, the XRD patterns of the initial alloys in Examples 53, 89, 90 and 91 are illustrated in FIGS. 16A to 16D, and the XRD patterns of the heat-treated soft magnetic alloys in these Examples are illustrated in FIGS. 17A to 17D.

Figure 19A:
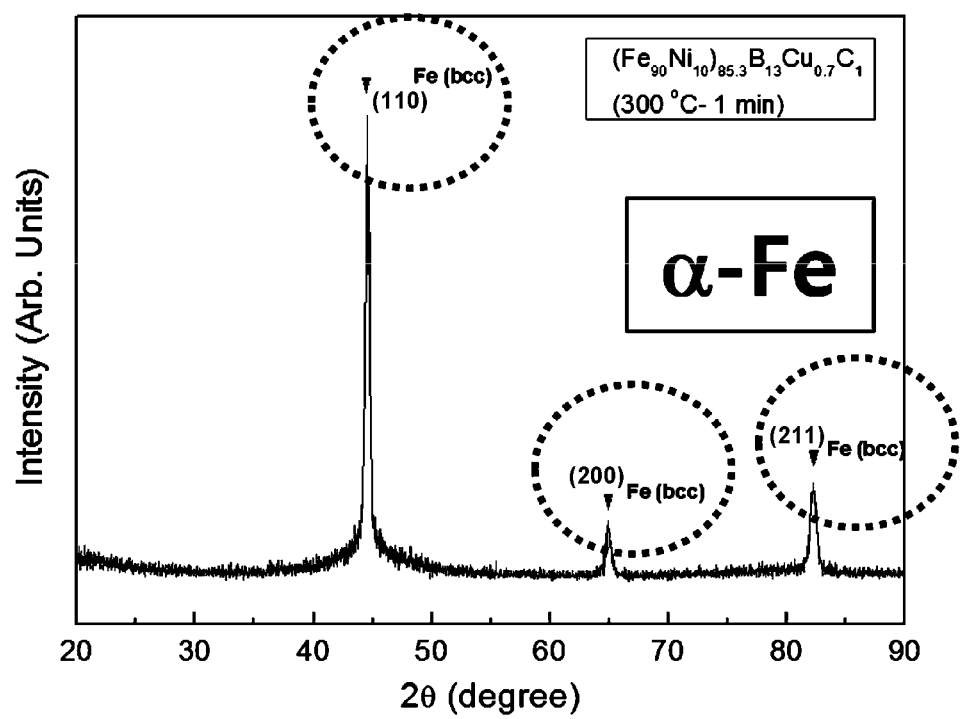
FIGS. 19A to 19C are XRD patterns of soft magnetic alloys obtained by heat-treating the initial alloys in FIGS. 18A to 18C.
Figure 19B:
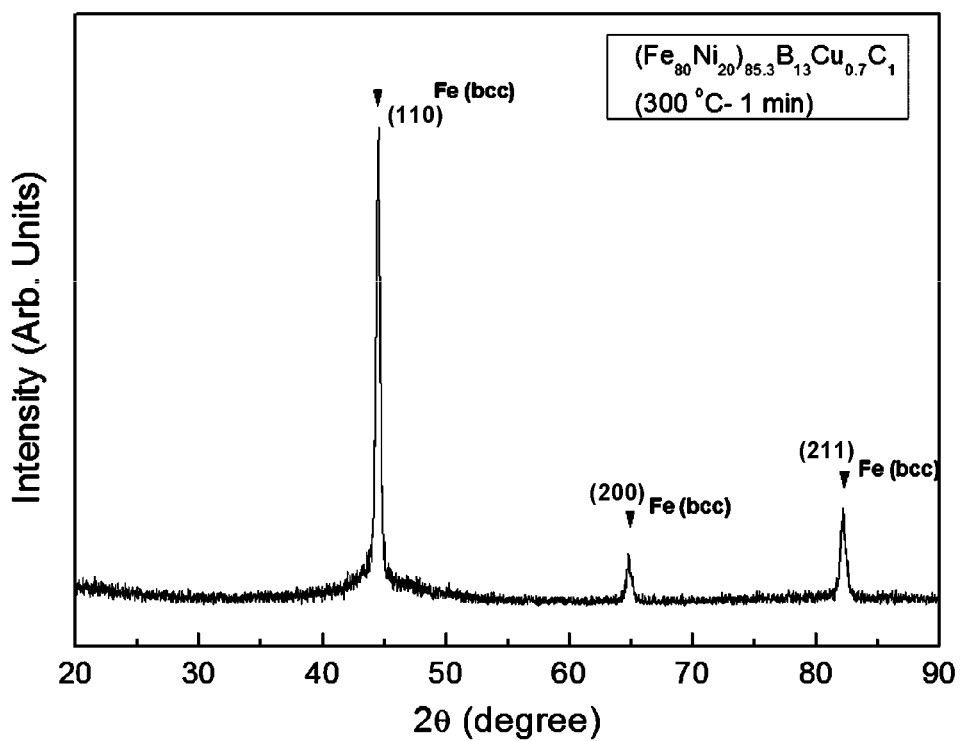
Figure 19C:
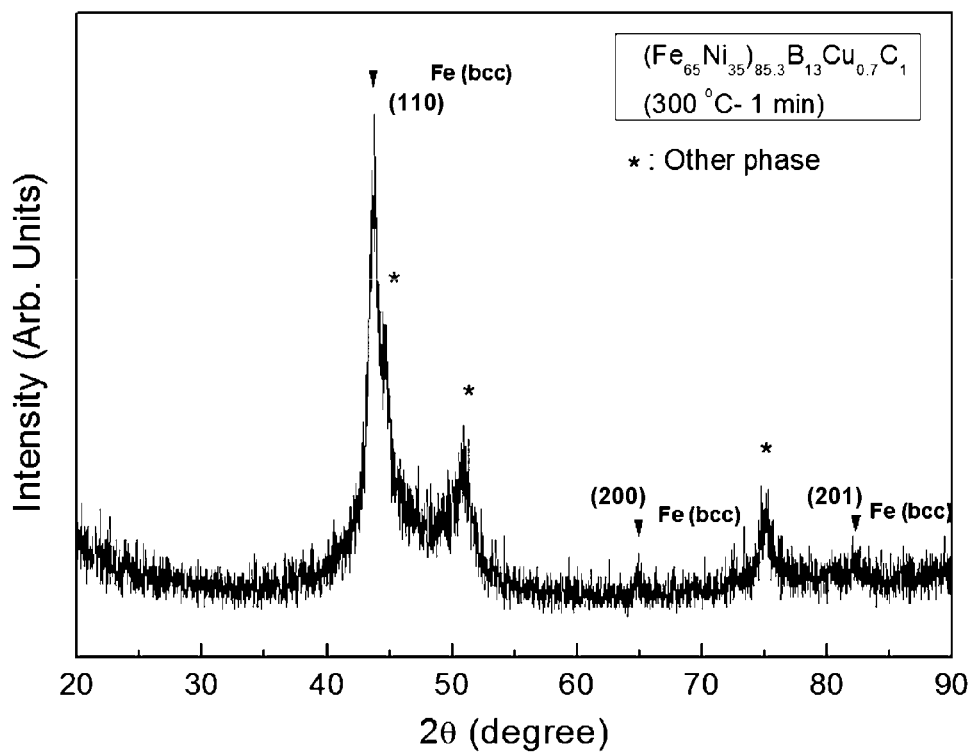
Figure 20A:
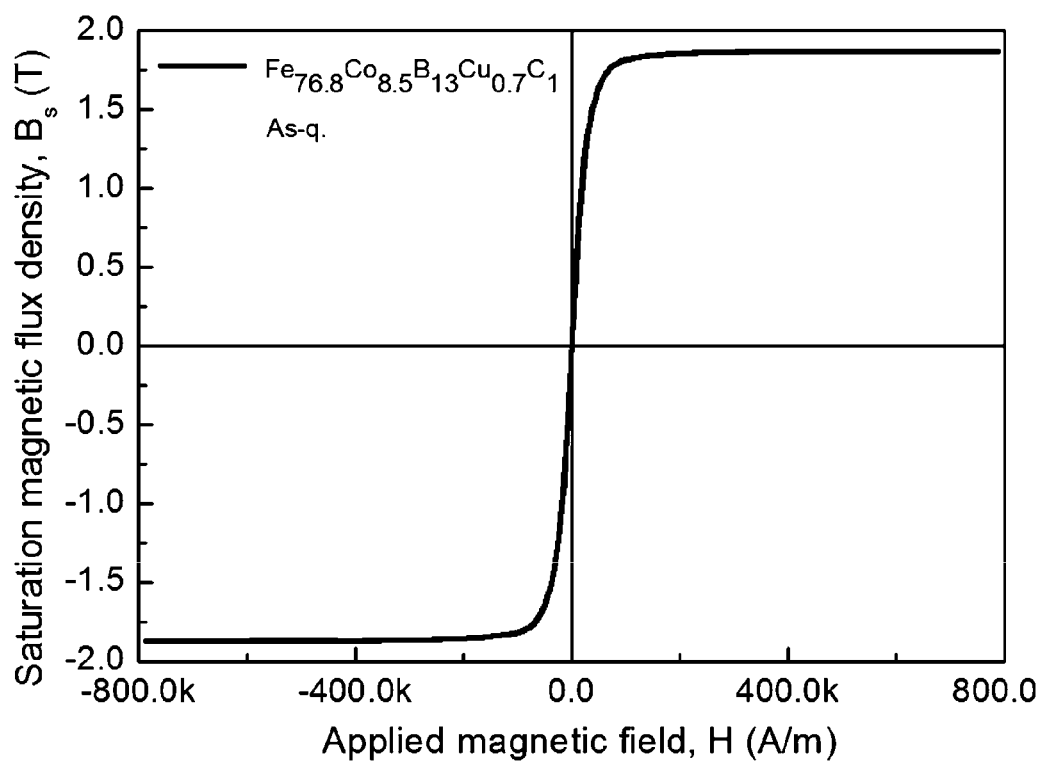
FIGS. 20A to 20D are VSM graphs for the initial alloys in FIGS. 16A to 16D.
Figure 20B:
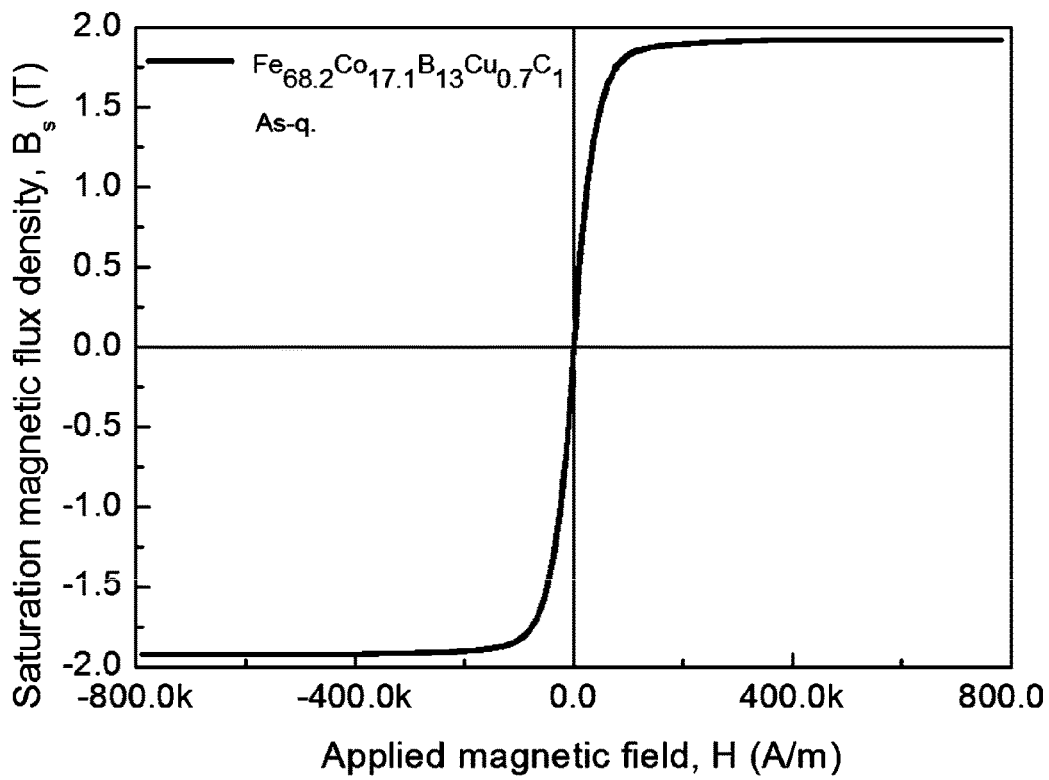
Figure 20C:
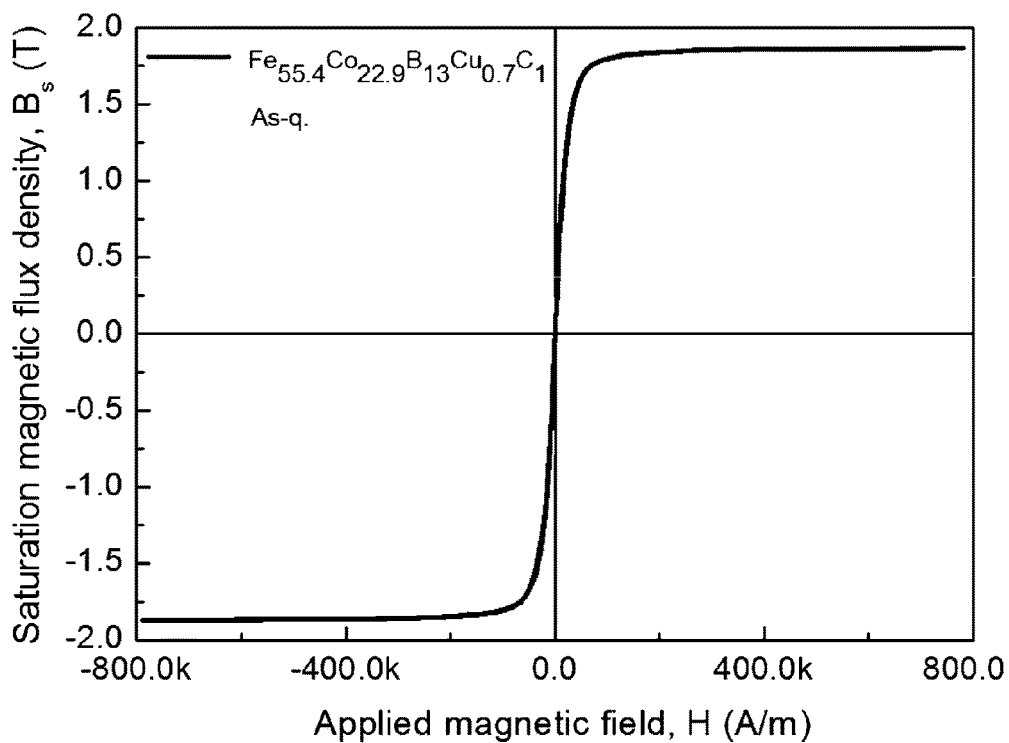
Figure 20D:
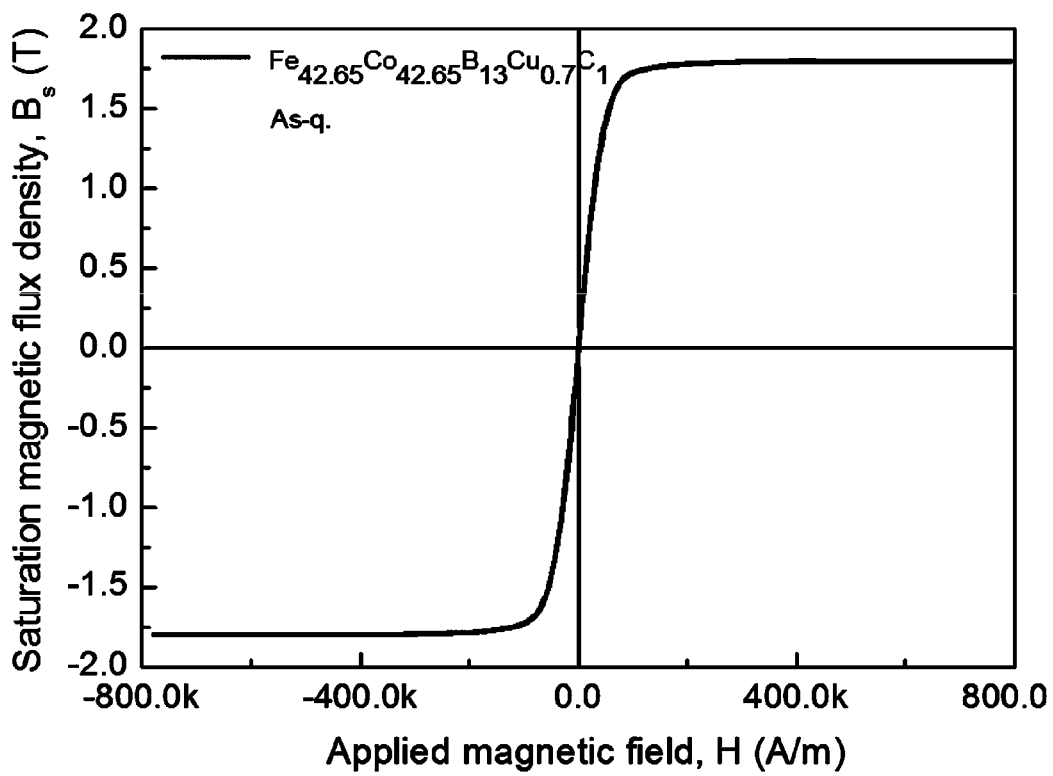
Figure 21A:
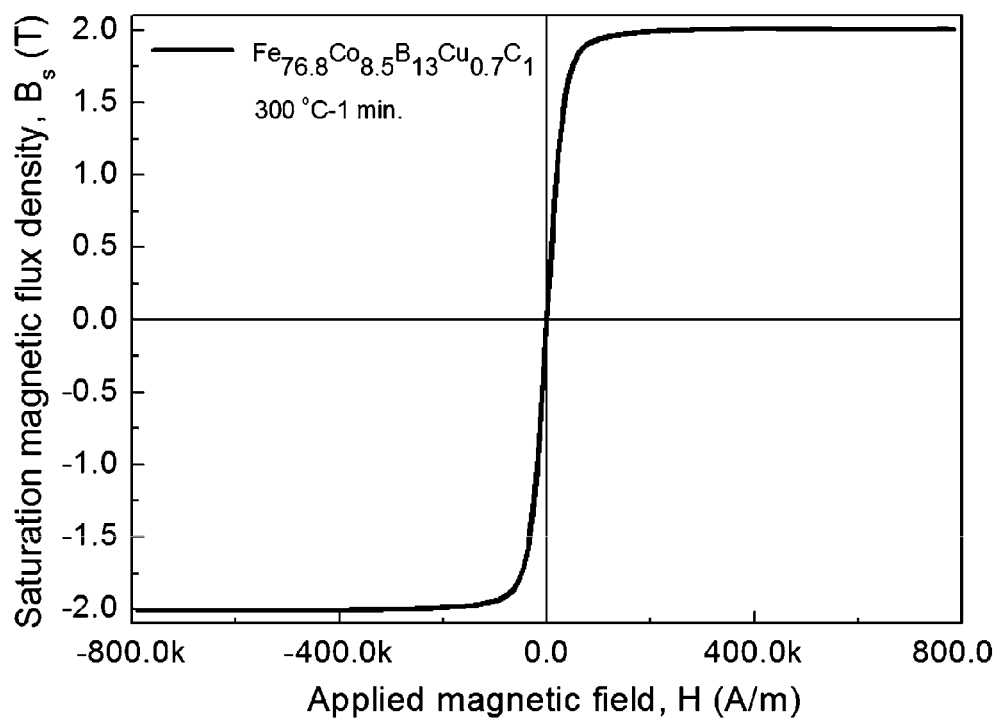
FIGS. 21A to 21D are VSM graphs of soft magnetic alloys obtained by heat-treating the initial alloys in FIGS. 16A to 16D.
Figure 21B:
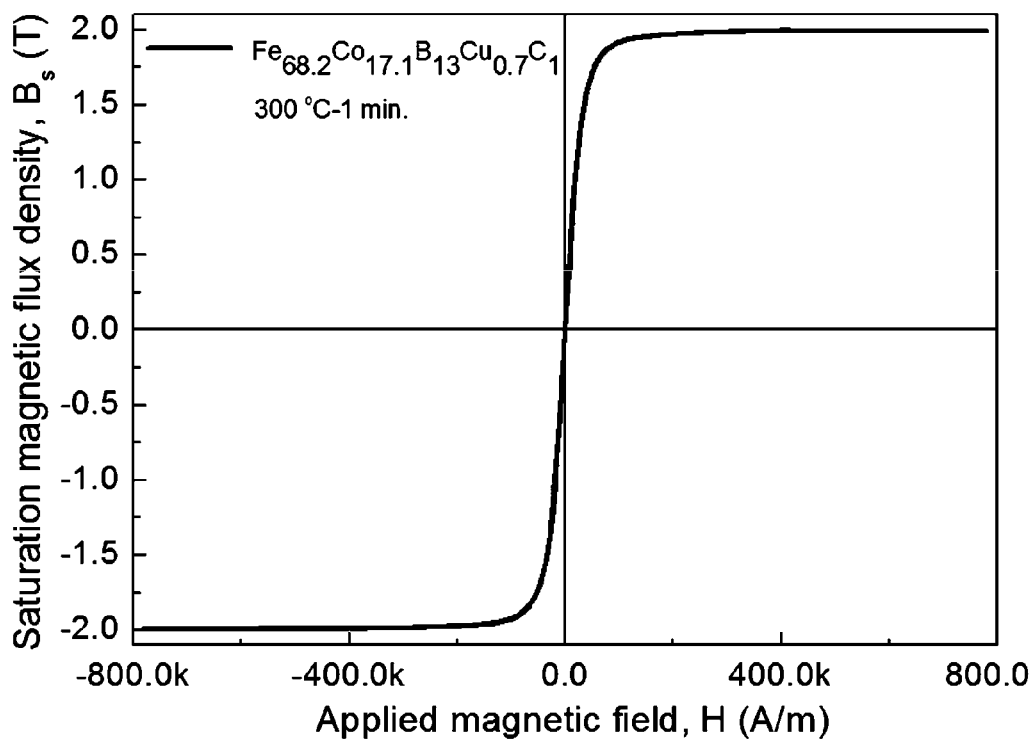
Figure 21C:
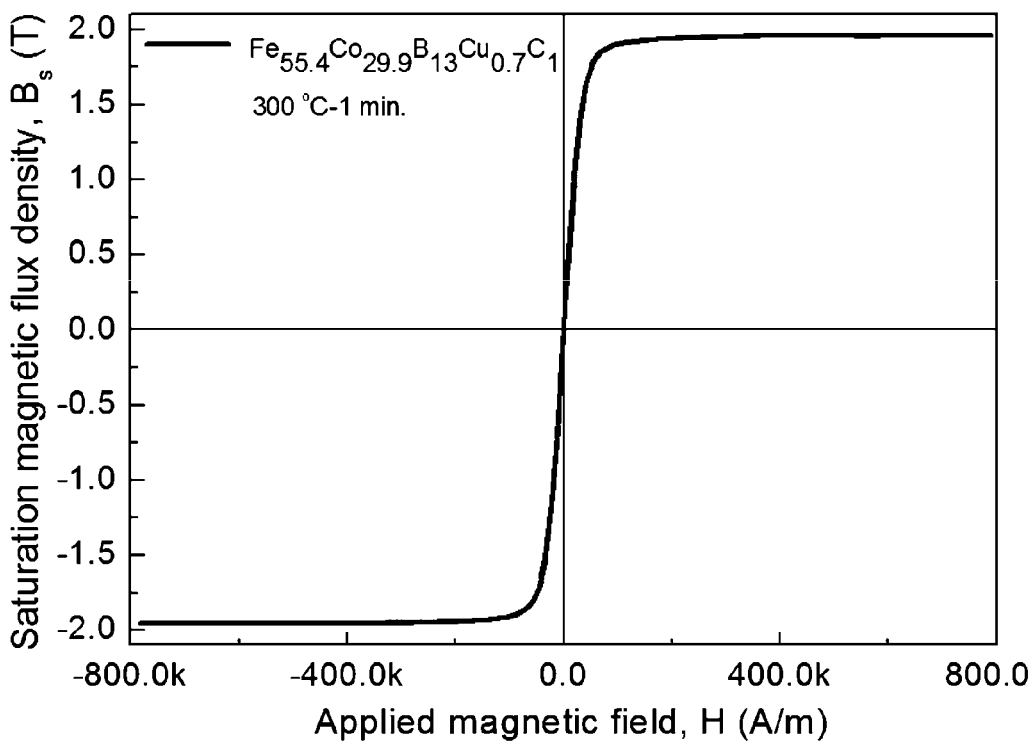
Figure 21D:
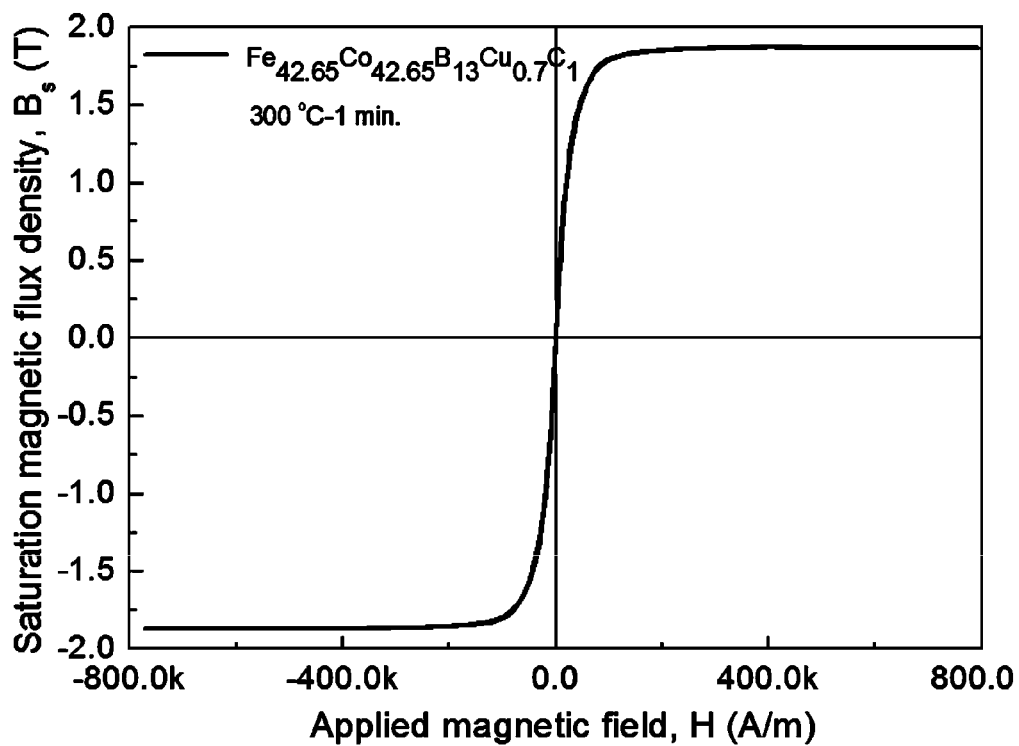
Figure 22A:
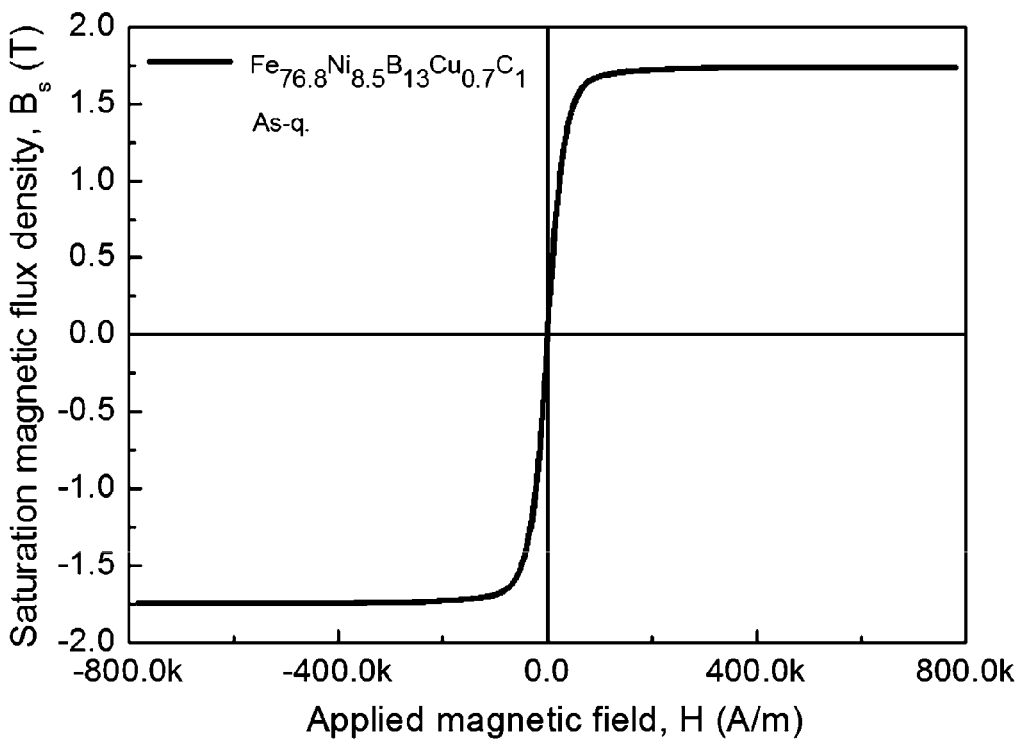
FIGS. 22A to 22D are VSM graphs for the initial alloys in FIGS. 18A to 18D.
Figure 22B:
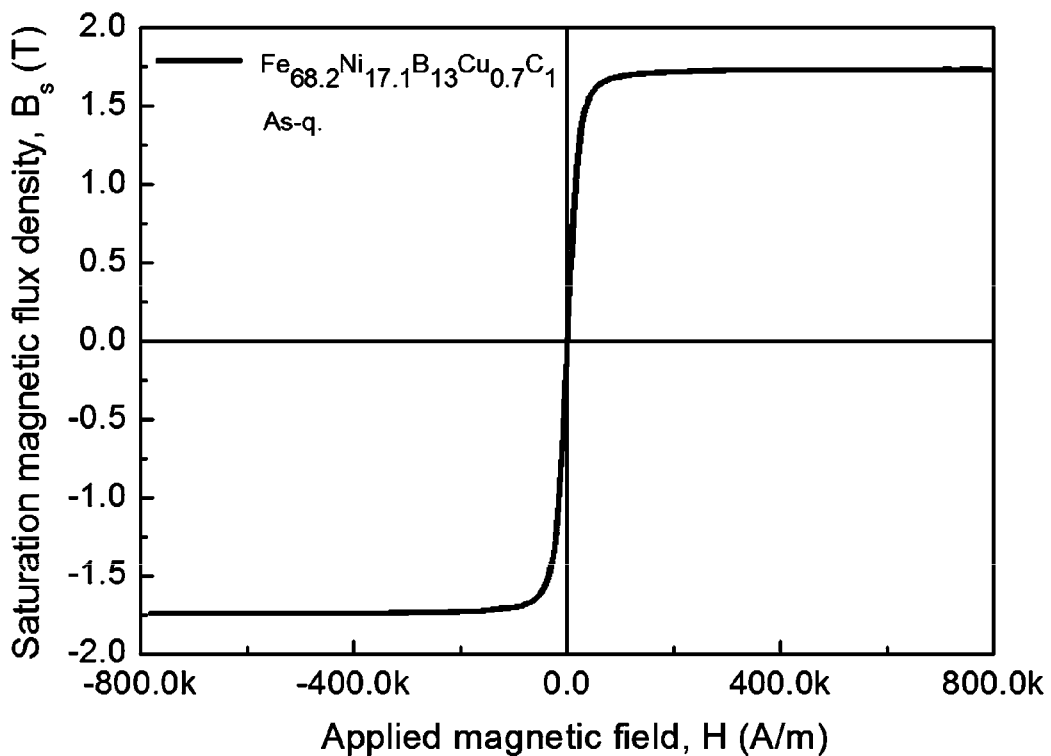
Figure 22C:
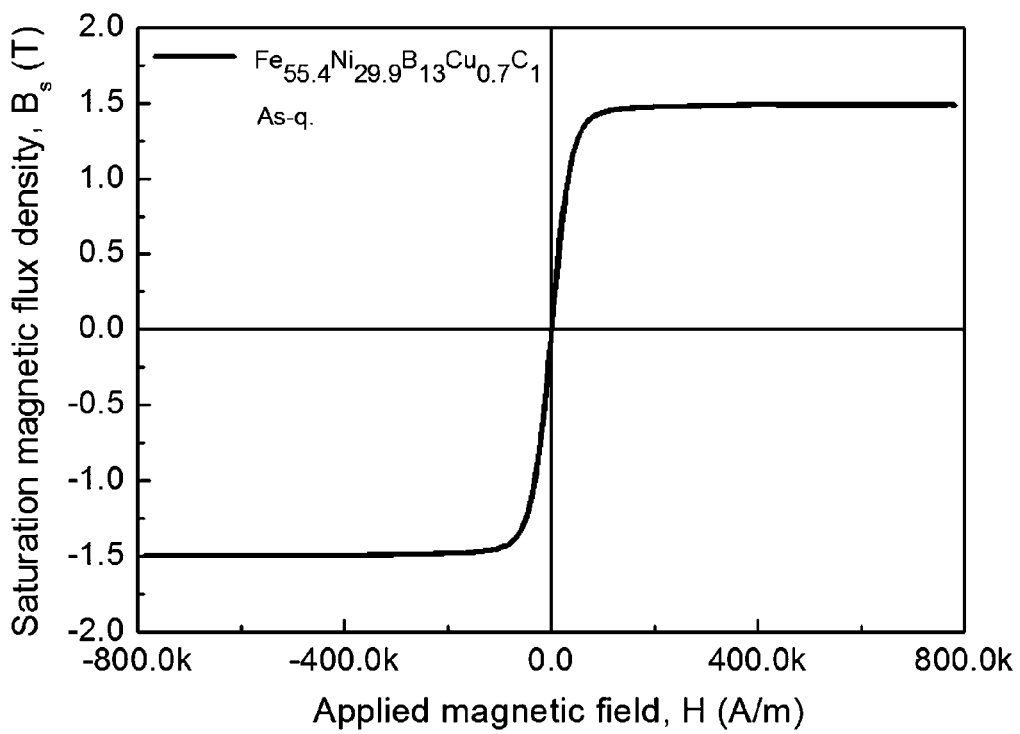
Figure 22D:
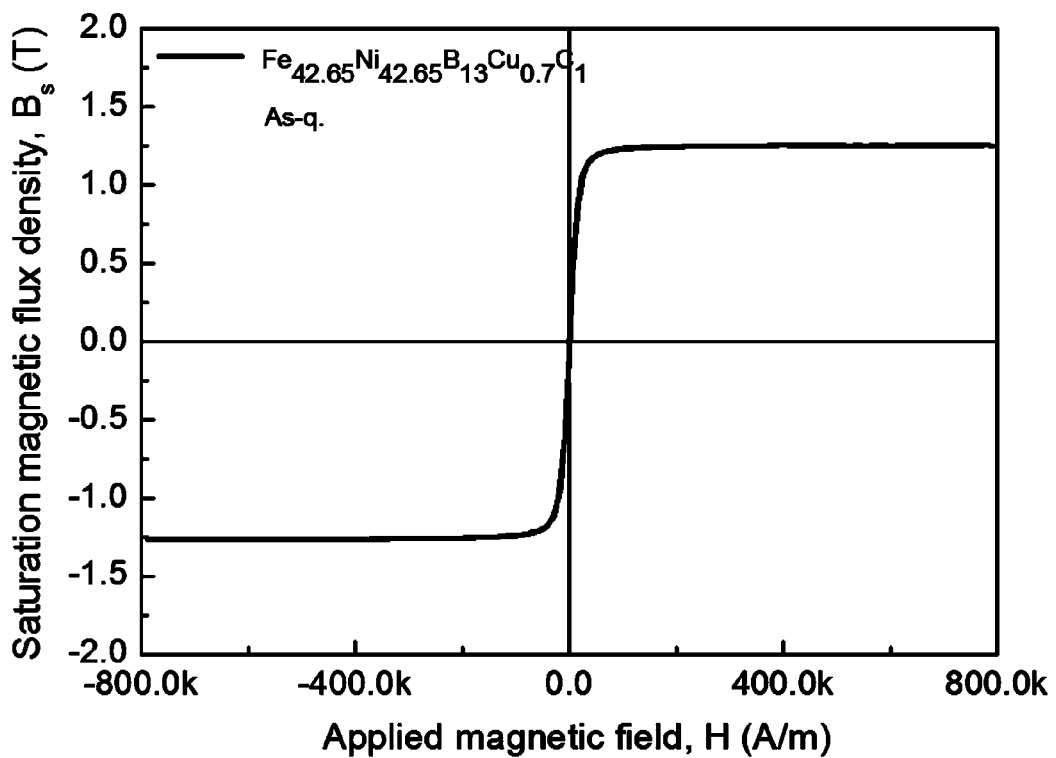

Further, the XRD patterns of the initial alloys in Examples 94, 95, 98 and 99 are illustrated in FIGS. 18A to 18D. In addition, the XRD patterns of the heat-treated soft magnetic alloys in Examples 94, 95 and 98 are illustrated in FIGS. 19A to 19C.

In this case, the crystallized area values and the average particle diameters of the crystals were calculated through the following Relationship Equation 1 and Relationship Equation 2 of the above-described Experimental Example 2.

As can be confirmed through FIGS. 16A to 16D, it can be confirmed that in Examples 53, 89, 90 and 91, amorphous initial alloys are realized.

Furthermore, as can be confirmed through FIGS. 18A to 18D, it can be confirmed that in Example 99 among Examples 94, 95, 98 and 99, an initial alloy in which the crystalline phase and the amorphous phase coexist is manufactured.

2. Evaluation of Magnetic Properties

In order to calculate the coercivity and saturated magnetization values, magnetic properties were evaluated at 800 kA/m through a vibrating sample magnetometer (VSM).

Among them, the VSM graphs of the initial alloys in Examples 53, 89, 90 and 91 are illustrated in FIGS. 20A to 20D, respectively, and the VSM graphs of the soft magnetic alloys obtained after the heat treatment of these Examples are illustrated in FIGS. 21A to 21D, respectively.

Figure 23A:
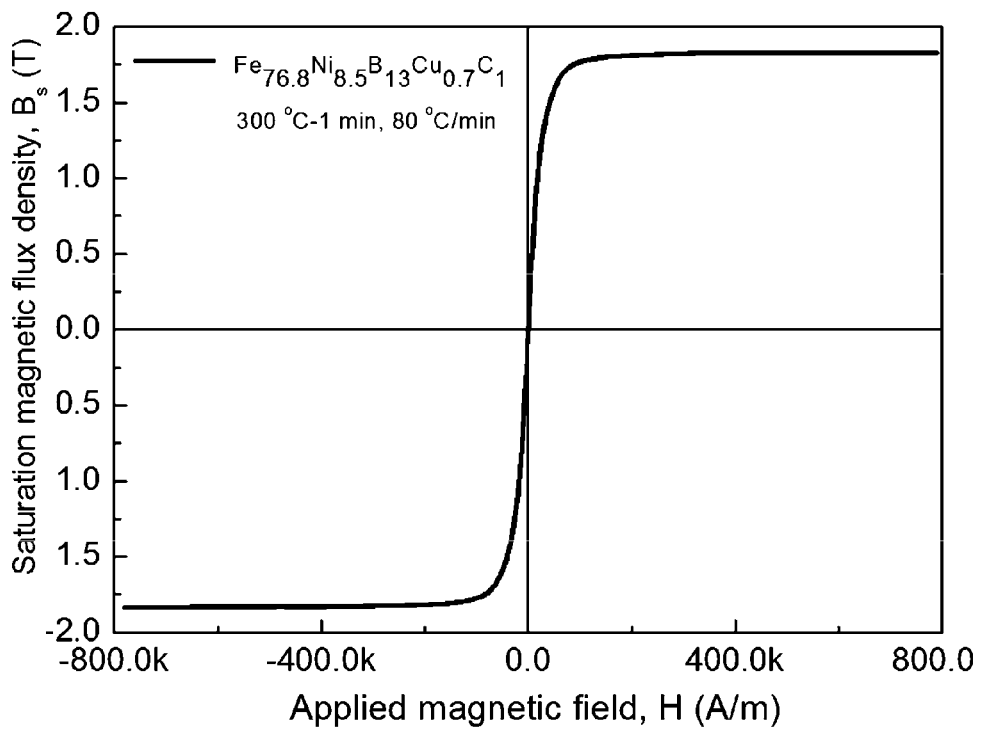
FIGS. 23A to 23C are VSM graphs of soft magnetic alloys obtained by heat-treating the initial alloys in FIGS. 18A to 18C.
Figure 23B:
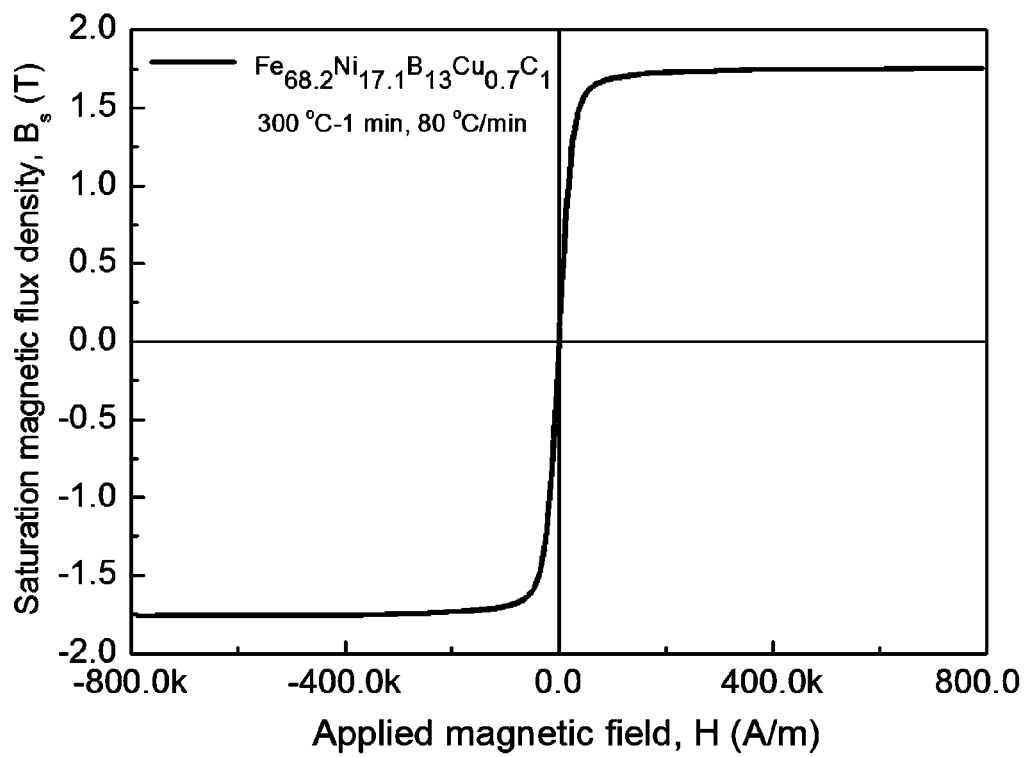
Figure 23C:
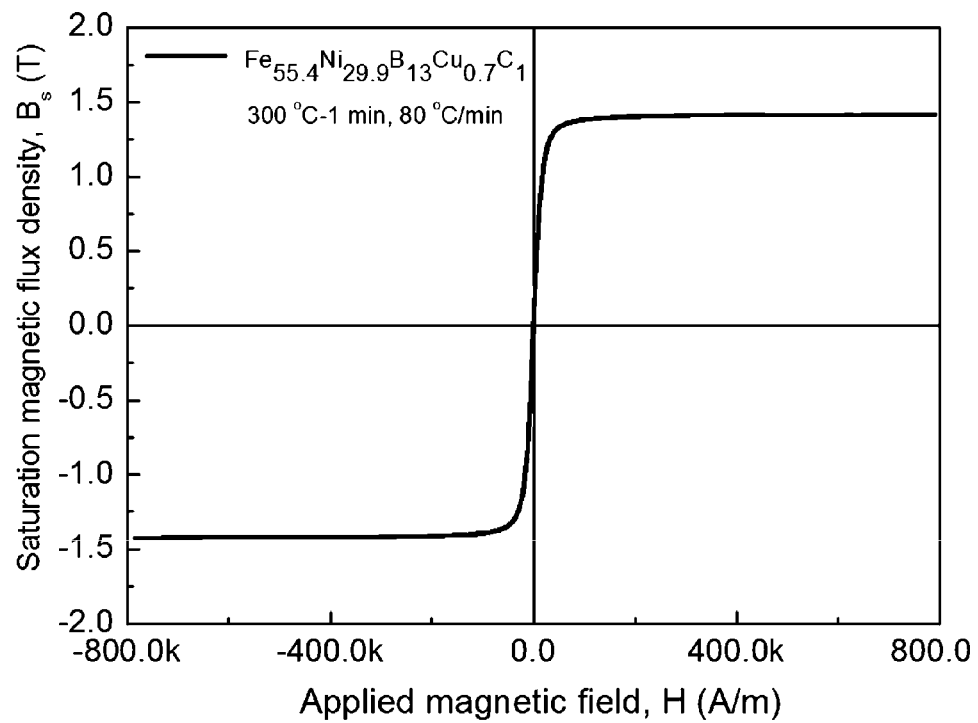

Further, the VSM graphs of the initial alloys in Examples 94, 95, 98 and 99 are illustrated in FIGS. 22A to 22D, respectively, and the VSM graphs of the soft magnetic alloys obtained after the heat treatment of Examples 94, 95 and 98 are illustrated in FIGS. 23A to 23C, respectively.

Through the VSM results of the initial alloys in which X includes Fe and Co in FIGS. 20A to 20D, it can be confirmed that even in the initial alloys prior to the heat treatment, alloys exhibiting excellent magnetic characteristics with a saturated magnetic flux density of 1.8 T (FIG. 20D) to 1.923 T (FIG. 20B) are realized.

In addition, through the VSM results of the alloys in which these initial alloys are heat-treated in FIGS. 21A to 21D, it can be confirmed that the saturated magnetic flux density ranges from 1.869 T (FIG. 21D) to 2.009 T (FIG. 21A) through the heat treatment, and alloys exhibiting more improved magnetic characteristics than the initial alloys are realized.

Furthermore, through the VSM results of the initial alloys in which X includes Fe and Ni in FIGS. 22A to 22D, it can be confirmed that in the case of Examples 94 and 95 in which the content ratio (at %) of Fe and Ni is 90:10 and 80:20, the saturated magnetic flux density even in the initial alloy prior to the heat treatment is 1.740 T (FIG. 22A) and 1.734 T (FIG. 22B), but in the case of Examples 98 and 99, the saturated magnetic flux density of the initial alloy prior to the heat treatment is decreased to 1.489 T (FIG. 22C) and 1.255 T (FIG. 22D) due to an excessive content of nickel. Further, even after the heat treatment, it can be confirmed that in the case of Examples 94 and 95, the saturated magnetic flux density is 1.829 T (FIG. 23A) and 1.753 T (FIG. 23B), respectively, showing an improved saturated magnetic flux density, but in the case of Example 98, the saturated magnetic flux density is 1.416 T (FIG. 23C), showing a saturated magnetic flux density somewhat decreased compared to the initial alloy.

TABLE 7

| | | | Example 53 | Example 54 | Example 55 | Example 56 | Example 57 |
|---|---|---|---|---|---|---|---|
| Initial alloy | Empirical formula $X_aB_bC_cCu_d$ | m/n (Fe$_m$Co$_n$) | | | 80/20 | | |
| | | a (at %) | 85.3 | 85.3 | 85.3 | 85.3 | 85.3 |
| | | b (at %) | 13 | 12 | 11 | 10 | 9 |
| | | c (at %) | 1 | 2 | 3 | 4 | 5 |
| | | d (at %) | 0.7 | 0.7 | 0.7 | 0.7 | 0.7 |
| | | b + c (at %) | 14 | 14 | 14 | 14 | 14 |
| | | Mathematical Equation 1 | 13 | 4.24 | 2.12 | 1.25 | 0.80 |
| | | Mathematical Equation 2 | 3.32 | 3.32 | 3.32 | 3.32 | 3.32 |
| | | Mathematical Equation 3 | — | — | — | — | — |
| | | Mathematical Equation 4 | — | — | — | — | — |
| | Crystal phase | | Amorphous | Amorphous | Amorphous | Amorphous | Amorphous |
| | Bs (T) | | 1.923 | 1.924 | 1.919 | 1.920 | 1.904 |
| | Hc (A/m) | | 146.3 | 135.2 | 132.3 | 142.5 | 137.4 |
| | Heat treatment temperature (° C.)/Heat treatment time (sec)/Heating rate (° C./m) | | 300/60/80 | 300/60/80 | 300/60/80 | 300/60/80 | 300/60/80 |
| Alloy after heat treatment | Crystal phase | | Amorphous + Crystalline | Amorphous + Crystalline | Amorphous + Crystalline | Amorphous + Crystalline | Amorphous + Crystalline |
| | Crystal average particle diameter (nm) | | 26.3 | 26.4 | 25.7 | 26.1 | 26.0 |
| | Crystallized area value (%) | | 59.4 | 60.4 | 59.8 | 61.2 | 60.2 |
| | Bs (T) | | 1.992 | 2.002 | 1.972 | 1.989 | 2.014 |
| | Hc (A/m) | | 83.1 | 85.2 | 84.7 | 85.0 | 84.7 |

| | | | Example 58 | Example 59 | Example 60 | Example 61 | Example 62 |
|---|---|---|---|---|---|---|---|
| Initial alloy | Empirical formula $X_aB_bC_cCu_d$ | m/n (Fe$_m$Co$_n$) | | | 80/20 | | |
| | | a (at %) | 79.3 | 79.3 | 79.3 | 79.3 | 79.3 |
| | | b (at %) | 14 | 12 | 10 | 8 | 6.67 |
| | | c (at %) | 6 | 8 | 10 | 12 | 13.33 |
| | | d (at %) | 0.7 | 0.7 | 0.7 | 0.7 | 0.7 |
| | | b + c (at %) | 20 | 20 | 20 | 20 | 20 |
| | | Mathematical Equation 1 | — | — | — | — | — |
| | | Mathematical Equation 2 | — | — | — | — | — |
| | | Mathematical Equation 3 | 4.76 | 2.65 | 1.85 | 0.96 | 0.68 |
| | | Mathematical Equation 4 | 10.64 | 10.64 | 10.64 | 10.64 | 10.64 |

TABLE 7-continued

|  |  |  |  |  |  |
|---|---|---|---|---|---|
| Crystal phase | Amorphous | Amorphous | Amorphous | Amorphous | Amorphous |
| Bs (T) | 1.701 | 1.713 | 1.721 | 1.708 | 1.714 |
| Hc (A/m) | 122.6 | 126.8 | 131.8 | 129.4 | 127.8 |
| Heat treatment temperature (° C.)/Heat treatment time (sec)/Heating rate (° C./m) | 300/60/80 | 300/60/80 | 300/60/80 | 300/60/80 | 300/60/80 |

Alloy after heat treatment:

|  |  |  |  |  |  |
|---|---|---|---|---|---|
| Crystal phase | Amorphous + Crystalline | Amorphous + Crystalline | Amorphous + Crystalline | Amorphous + Crystalline | Amorphous + Crystalline |
| Crystal average particle diameter (nm) | 24.3 | 23.7 | 23.2 | 24.1 | 24.0 |
| Crystallized area value (%) | 62.3 | 62.4 | 61.9 | 62.0 | 62.2 |
| Bs (T) | 1.894 | 1.882 | 1.901 | 1.904 | 1.910 |
| Hc (A/m) | 82.4 | 82.9 | 82.5 | 82.4 | 82.6 |

TABLE 8

|  |  |  | Example 63 | Example 64 | Example 65 | Example 66 | Example 67 |
|---|---|---|---|---|---|---|---|
| Initial alloy | Empirical formula $X_aB_bC_cCu_d$ | m/n (Fe$_m$Co$_n$) |  |  | 80/20 |  |  |
|  |  | a (at %) | 85.1 | 85.6 | 82.5 | 84.5 | 85.8 |
|  |  | b (at %) | 7.1 | 6.6 | 9 | 8 | 8 |
|  |  | c (at %) | 7.1 | 7.1 | 8 | 7 | 5.5 |
|  |  | d (at %) | 0.7 | 0.7 | 0.5 | 0.5 | 0.7 |
|  |  | b + c (at %) | 14.2 | 13.7 | 17 | 15 | 13.5 |
|  |  | Mathematical Equation 1 | 0.375 | 0.349 | 0.397 | 0.431 | 0.62 |
|  |  | Mathematical Equation 2 | 3.32 | 3.33 | 3.58 | 3.61 | 3.32 |
|  |  | Mathematical Equation 3 | — | — | — | — | — |
|  |  | Mathematical Equation 4 | — | — | — | — | — |
|  | Crystal phase |  | Crystalline + Amorphous | Crystalline + Amorphous | Amorphous | Amorphous | Amorphous |
|  | Bs (T) |  | 2.047 | 2.054 | 1.869 | 1.894 | 1.921 |
|  | Hc (A/m) |  | 225.1 | 226.3 | 146.3 | 164.2 | 130.1 |
|  | Heat treatment temperature (° C.)/Heat treatment time (sec)/Heating rate (° C./m) |  | 300/60/80 | 300/60/80 | 300/60/80 | 300/60/80 | 300/60/80 |
| Alloy after heat treatment | Crystal phase |  | Crystalline | Crystalline | Amorphous + Crystalline | Amorphous + Crystalline | Amorphous + Crystalline |
|  | Crystal average particle diameter (nm) |  | 28.6 | 29.4 | 25.2 | 25.5 | 24.9 |
|  | Crystallized area value (%) |  | 60.2 | 61.1 | 60.5 | 62.0 | 61.7 |
|  | Bs (T) |  | 2.12 | 2.12 | 1.92 | 1.94 | 2.08 |
|  | Hc (A/m) |  | 524.3 | 562.2 | 347.5 | 327.1 | 317.2 |

|  |  |  | Example 68 | Example 69 | Example 70 | Example 71 | Example 72 |
|---|---|---|---|---|---|---|---|
| Initial alloy | Empirical formula $X_aB_bC_cCu_d$ | m/n (Fe$_m$Co$_n$) |  |  | 80/20 |  |  |
|  |  | a (at %) | 83.3 | 82.3 | 82.51 | 82.01 | 82.2 |
|  |  | b (at %) | 10 | 16.0 | 16 | 16 | 16.6 |
|  |  | c (at %) | 6 | 1.0 | 0.99 | 0.99 | 0.7 |
|  |  | d (at %) | 0.7 | 1.0 | 0.5 | 1.0 | 0.5 |
|  |  | b + c (at %) | 16 | 17 | 16.99 | 16.99 | 17.3 |
|  |  | Mathematical Equation 1 | 0.68 | 16.0 | 16.24 | 16.24 | 28.34 |
|  |  | Mathematical Equation 2 | 3.30 | 3.29 | 3.58 | 3.00 | 3.58 |
|  |  | Mathematical Equation 3 | — |  |  |  |  |
|  |  | Mathematical Equation 4 | — |  |  |  |  |
|  | Crystal phase |  | Amorphous | Amorphous | Amorphous | Amorphous | Amorphous |
|  | Bs (T) |  | 1.895 | 1.887 | 1.864 | 1.862 | 1.848 |
|  | Hc (A/m) |  | 170.6 | 154.2 | 143.2 | 144.4 | 114.2 |
|  | Heat treatment temperature (° C.)/Heat treatment time (sec)/Heating rate (° C./m) |  | 300/60/80 | 300/60/80 | 300/60/80 | 300/60/80 | 300/60/80 |
| Alloy after heat treatment | Crystal phase |  | Amorphous + Crystalline | Amorphous + Crystalline | Amorphous + Crystalline | Amorphous + Crystalline | Amorphous + Crystalline |
|  | Crystal average particle diameter (nm) |  | 24.2 | 24.0 | 24.1 | 23.9 | 24.1 |
|  | Crystallized area value (%) |  | 59.9 | 60.4 | 60.1 | 60.9 | 62.2 |

TABLE 8-continued

|  | | | | | |
|---|---|---|---|---|---|
| Bs (T) | 1.93 | 1.91 | 1.92 | 1.91 | 1.92 |
| Hc (A/m) | 268.2 | 255.2 | 300.1 | 294.2 | 299.3 |

TABLE 9

| | | | Example 73 | Example 74 | Example 75 | Example 76 | Example 77 |
|---|---|---|---|---|---|---|---|
| Initial alloy | Empirical formula $X_aB_bC_cCu_d$ | m/n ($Fe_mCo_n$) | | | 80/20 | | |
| | | a (at %) | 82.0 | 83.8 | 82.9 | 85.51 | 78.7 |
| | | b (at %) | 16.8 | 14 | 13 | 13 | 6.8 |
| | | c (at %) | 0.7 | 1 | 3 | 0.99 | 14 |
| | | d (at %) | 0.5 | 1.2 | 1.1 | 0.5 | 0.5 |
| | | b + c (at %) | 17.5 | 15 | 16 | 13.99 | 20.8 |
| | | Mathematical Equation 1 | 28.69 | 14 | 2.50 | 13.19 | — |
| | | Mathematical Equation 2 | 3.58 | 2.89 | 2.94 | 3.62 | — |
| | | Mathematical Equation 3 | — | — | — | — | 0.65 |
| | | Mathematical Equation 4 | — | — | — | — | 12.55 |
| | | Crystal phase | Amorphous | Amorphous | Amorphous | Amorphous | Amorphous |
| | | Bs (T) | 1.894 | 1.907 | 1.902 | 1.927 | 1.709 |
| | | Hc (A/m) | 127.6 | 119.2 | 121.3 | 127.4 | 117.6 |
| | Heat treatment temperature (° C.)/Heat treatment time (sec)/Heating rate (° C./m) | | 300/60/80 | 300/60/80 | 300/60/80 | 300/60/80 | 300/60/80 |
| Alloy after heat treatment | | Crystal phase | Amorphous + Crystalline | Amorphous + Crystalline | Amorphous + Crystalline | Amorphous + Crystalline | Amorphous + Crystalline |
| | | Crystal average particle diameter (nm) | 29.2 | 23.3 | 23.6 | 24.4 | 24.3 |
| | | Crystallized area value (%) | 62.4 | 61.5 | 63.3 | 67.7 | 59.2 |
| | | Bs (T) | 2.012 | 2.074 | 2.068 | 2.122 | 1.842 |
| | | Hc (A/m) | 343.1 | 193.5 | 134.3 | 142.1 | 140.9 |

| | | | Example 78 | Example 79 | Example 80 | Example 81 | Example 82 |
|---|---|---|---|---|---|---|---|
| Initial alloy | Empirical formula $X_aB_bC_cCu_d$ | m/n ($Fe_mCo_n$) | | | 80/20 | | |
| | | a (at %) | 78.6 | 78.5 | 79.0 | 78.51 | 81.9 |
| | | b (at %) | 7 | 7.8 | 8 | 20.3 | 17.1 |
| | | c (at %) | 13.9 | 13.2 | 12.5 | 0.69 | 0.5 |
| | | d (at %) | 0.5 | 0.5 | 0.5 | 0.5 | 0.5 |
| | | b + c (at %) | 20.9 | 21 | 20.5 | 20.99 | 17.6 |
| | | Mathematical Equation 1 | — | — | — | — | — |
| | | Mathematical Equation 2 | — | — | — | — | — |
| | | Mathematical Equation 3 | 0.675 | 0.813 | 0.905 | 177.09 | 241.83 |
| | | Mathematical Equation 4 | 12.54 | 12.53 | 12.57 | 12.53 | 12.79 |
| | | Crystal phase | Amorphous | Amorphous | Amorphous | Amorphous | Amorphous |
| | | Bs (T) | 1.704 | 1.704 | 1.714 | 1.707 | 1.844 |
| | | Hc (A/m) | 118.0 | 117.5 | 119.4 | 120.7 | 121.9 |
| | Heat treatment temperature (° C.)/Heat treatment time (sec)/Heating rate (° C./m) | | 300/60/80 | 300/60/80 | 300/60/80 | 300/60/80 | 300/60/80 |
| Alloy after heat treatment | | Crystal phase | Amorphous + Crystalline | Amorphous + Crystalline | Amorphous + Crystalline | Amorphous + Crystalline | Amorphous + Crystalline |
| | | Crystal average particle diameter (nm) | 24.4 | 24.4 | 24.2 | 24.1 | 24.8 |
| | | Crystallized area value (%) | 60.6 | 62.2 | 61.1 | 64.2 | 66.3 |
| | | Bs (T) | 1.840 | 1.840 | 1.857 | 1.841 | 1.968 |
| | | Hc (A/m) | 125.3 | 126.7 | 124.1 | 125.5 | 155.8 |

TABLE 10

|  |  |  | Example 83 | Example 84 | Example 85 | Example 86 | Example 87 |
|---|---|---|---|---|---|---|---|
| Initial alloy | Empirical formula $X_aB_bC_cCu_d$ | m/n ($Fe_mCo_n$) | 80/20 | 97/3 |  | 94/6 | 90/10 |
|  |  | a (at %) | 81.9 | 78.5 | 78.5 | 81.9 | 85.3 |
|  |  | b (at %) | 8 | 7.4 | 19.4 | 16 | 13 |
|  |  | c (at %) | 8.9 | 13 | 1 | 1.6 | 1 |
|  |  | d (at %) | 1.2 | 1.1 | 1.1 | 0.5 | 0.7 |
|  |  | b + c (at %) | 20.4 | 20.4 | 20.4 | 17.6 | 14 |
|  |  | Mathematical Equation 1 | — | — | — | — | 13 |
|  |  | Mathematical Equation 2 | — | — | — | — | 3.32 |
|  |  | Mathematical Equation 3 | 1.51 | 0.79 | 97 | 39.5 | — |
|  |  | Mathematical Equation 4 | 8.26 | 8.45 | 8.45 | 12.79 | — |
|  |  | Crystal phase | Amorphous | Amorphous | Amorphous | Amorphous | Amorphous |
|  |  | Bs (T) | 1.842 | 1.811 | 1.792 | 1.832 | 1.901 |
|  |  | Hc (A/m) | 62.1 | 64.2 | 64.3 | 68.2 | 72.6 |
|  |  | Heat treatment temperature (° C.)/Heat treatment time (sec)/Heating rate (° C./m) | 300/60/80 | 300/60/80 | 300/60/80 | 300/60/80 | 300/60/80 |
| Alloy after heat treatment |  | Crystal phase | Amorphous + Crystalline | Amorphous + Crystalline | Amorphous + Crystalline | Amorphous + Crystalline | Amorphous + Crystalline |
|  |  | Crystal average particle diameter (nm) | 21.8 | 22.0 | 21.1 | 20.9 | 21.3 |
|  |  | Crystallized area value (%) | 64.2 | 68.4 | 67.2 | 70.1 | 72.2 |
|  |  | Bs (T) | 1.942 | 1.892 | 1.884 | 1.921 | 2.017 |
|  |  | Hc (A/m) | 139.3 | 102.6 | 97.2 | 87.3 | 139.7 |

|  |  |  | Example 88 | Example 89 | Example 90 | Example 91 | Example 92 |
|---|---|---|---|---|---|---|---|
| Initial alloy | Empirical formula $X_aB_bC_cCu_d$ | m/n ($Fe_mCo_n$) | 90/10 | 65/30 | 50/50 |  | 48/52 |
|  |  | a (at %) | 85.3 | 85.3 | 85.3 | 85.3 | 85.3 |
|  |  | b (at %) | 13 | 13 | 13 | 13 | 13 |
|  |  | c (at %) | 1 | 1 | 1 | 1 | 1 |
|  |  | d (at %) | 0.7 | 0.7 | 0.7 | 0.7 | 0.7 |
|  |  | b + c (at %) | 14 | 14 | 14 | 14 | 14 |
|  |  | Mathematical Equation 1 | 13 | 13 | 13 | 13 | 13 |
|  |  | Mathematical Equation 2 | 3.32 | 3.32 | 3.32 | 3.32 | 3.32 |
|  |  | Mathematical Equation 3 | — | — | — | — | — |
|  |  | Mathematical Equation 4 | — | — | — | — | — |
|  |  | Crystal phase | Amorphous | Amorphous | Amorphous | Amorphous | Amorphous |
|  |  | Bs (T) | 1.893 | 1.871 | 1.868 | 1.800 | 1.798 |
|  |  | Hc (A/m) | 80.6 | 83.0 | 64.2 | 66.7 | 76.2 |
|  |  | Heat treatment temperature (° C.)/Heat treatment time (sec)/Heating rate (° C./m) | 300/60/80 | 300/60/80 | 300/60/80 | 300/60/80 | 300/60/80 |
| Alloy after heat treatment |  | Crystal phase | Amorphous + Crystalline | Amorphous + Crystalline | Amorphous + Crystalline | Amorphous + Crystalline | Amorphous + Crystalline |
|  |  | Crystal average particle diameter (nm) | 22.3 | 20.8 | 22.4 | 28.7 | 29.1 |
|  |  | Crystallized area value (%) | 71.1 | 68.8 | 73.4 | 67.9 | 68.0 |
|  |  | Bs (T) | 2.013 | 2.009 | 1.959 | 1.869 | 1.857 |
|  |  | Hc (A/m) | 104.2 | 83.2 | 90.5 | 284.3 | 388.6 |

TABLE 11

|  |  |  | Example 93 | Example 94 | Example 95 | Example 96 | Example 97 | Example 98 | Example 99 |
|---|---|---|---|---|---|---|---|---|---|
| Initial alloy | Empirical formula $X_aB_bC_cCu_d$ | p/q ($Fe_pNi_p$) | 98/2 | 90/10 | 80/20 | 76/24 | 71/29 | 65/35 | 50/50 |
|  |  | a (at %) | 85.3 | 85.3 | 85.3 | 85.3 | 85.3 | 85.3 | 85.3 |
|  |  | b (at %) | 13 | 13 | 13 | 13 | 13 | 13 | 13 |
|  |  | c (at %) | 1 | 1 | 1 | 1 | 1 | 1 | 1 |
|  |  | d (at %) | 0.7 | 0.7 | 0.7 | 0.7 | 0.7 | 0.7 | 0.7 |
|  |  | b + c (at %) | 14 | 14 | 14 | 14 | 14 | 14 | 14 |
|  |  | Mathematical Equation 1 | 13 | 13 | 13 | 13 | 13 | 13 | 13 |
|  |  | Mathematical Equation 2 | 3.32 | 3.32 | 3.32 | 3.32 | 3.32 | 3.32 | 3.32 |

TABLE 11-continued

|  | Example 93 | Example 94 | Example 95 | Example 96 | Example 97 | Example 98 | Example 99 |
|---|---|---|---|---|---|---|---|
| Mathematical Equation 3 | — | — | — | — | — | — | — |
| Mathematical Equation 4 | — | — | — | — | — | — | — |
| Crystal phase | Amorphous | Amorphous | Amorphous | Amorphous | Amorphous | Amorphous | Amorphous + Crystalline |
| Bs (T) | 1.692 | 1.740 | 1.743 | 1.624 | 1.555 | 1.489 | 1.255 |
| Hc (A/m) | 42.2 | 41.2 | 43.2 | 45.6 | 48.2 | 56.2 | 53.1 |
| Heat treatment temperature (° C.)/Heat treatment time (sec)/Heating rate (° C./m) | 300/60/80 | 300/60/80 | 300/60/80 | 300/60/80 | 300/60/80 | 300/60/80 | 300/60/80 |
| Alloy after heat treatment — Crystal phase | Amorphous + Crystalline | Amorphous + Crystalline | Amorphous + Crystalline | Amorphous + Crystalline | Amorphous + Crystalline | Amorphous + Crystalline | Amorphous + Crystalline |
| Crystal average particle diameter (nm) | 21.2 | 21.4 | 25.5 | 25.7 | 26 | 29.2 | 29.4 |
| Crystallized area value (%) | 63.3 | 61.3 | 58.0 | 60.4 | 62.7 | 68.9 | 70.2 |
| Bs (T) | 1.817 | 1.829 | 1.753 | 1.707 | 1.624 | 1.416 | 1.189 |
| Hc (A/m) | 77.2 | 79.8 | 64.7 | 65.4 | 70.2 | 170.5 | 188.2 |

TABLE 12

|  |  |  | Comparative Example 10 | Comparative Example 11 | Comparative Example 12 | Comparative Example 13 | Comparative Example 14 | Comparative Example 15 |
|---|---|---|---|---|---|---|---|---|
| Initial alloy | Empirical formula $X_aB_bC_cCu_d$ | m/n $(Fe_mCo_n)$ | 80/20 | 80/20 | 80/20 | 80/20 | 80/20 | 80/20 |
|  |  | a (at %) | 86.3 | 86.3 | 86.0 | 87.3 | 86.2 | 78.2 |
|  |  | b (at %) | 11.0 | 12.0 | 10.0 | 11 | 8.7 | 15.0 |
|  |  | c (at %) | 2.0 | 1.0 | 3.0 | 1.0 | 4.6 | 6.3 |
|  |  | d (at %) | 0.7 | 0.7 | 1.0 | 0.7 | 0.5 | 0.5 |
|  |  | b + c (at %) | 13 | 13 | 13 | 12 | 13.3 | 21.3 |
|  | Crystal phase |  | Crystalline | Crystalline | Crystalline | Crystalline | Crystalline | Amorphous |
| Heat treatment temperature (° C.)/Heat treatment time (sec)/Heating rate (° C./m) |  |  | 300/60/80 | 300/60/80 | 300/60/80 | 300/60/80 | 300/60/80 | 300/60/80 |
| Alloy after heat treatment | Crystal phase |  | Crystalline | Crystalline | Crystalline | Crystalline | Crystalline | Amorphous + Crystalline |
|  | Crystal average particle diameter (nm) |  | 29.3 | 27.1 | 30.6 | 29.4 | 32.4 | 21.2 |
|  | Bs (T) |  | 2.107 | 2.118 | 2.102 | 2.122 | 2.172 | 169.7 |
|  | Hc (A/m) |  | 442.1 | 392.4 | 471.6 | 452.3 | 501.2 | 67.2 |

|  |  |  | Comparative Example 16 | Comparative Example 17 | Comparative Example 18 | Comparative Example 19 |
|---|---|---|---|---|---|---|
| Initial alloy | Empirical formula $X_aB_bC_cCu_d$ | m/n $(Fe_mCo_n)$ | 80/20 | 80/20 | 80/20 | 100/0 |
|  |  | a (at %) | 85.6 | 84.4 | 78.5 | 85.3 |
|  |  | b (at %) | 9.0 | 9 | 18.9 | 13 |
|  |  | c (at %) | 5.0 | 15 | 1 | 1 |
|  |  | d (at %) | 0.4 | 1.6 | 1.6 | 0.7 |
|  |  | b + c (at %) | 14 | 16.6 | 19.9 | 14 |
|  | Crystal phase |  | Amorphous | Crystalline | Crystalline | Amorphous |
| Heat treatment temperature (° C.)/Heat treatment time (sec)/Heating rate (° C./m) |  |  | 300/60/80 | 300/60/80 | 300/60/80 | 300/60/80 |
| Alloy after heat treatment | Crystal phase |  | Amorphous + Crystalline | Crystalline | Crystalline | Amorphous + Crystalline |
|  | Crystal average particle diameter (nm) |  | 26.8 | 35.2 | 30.3 | 17 |
|  | Bs (T) |  | 2.092 | 2.082 | 1.889 | 1.87 |
|  | Hc (A/m) |  | 135.7 | 543.2 | 482.6 | 64.27 |

Through Tables 7 to 12, it can be confirmed that as the soft magnetic alloys according to the Examples exhibit higher saturated magnetic flux densities and/or lower coercivities than those of the soft magnetic alloys according to Comparative Examples, the magnetic properties are excellent.

Further, referring to Examples 63 to 76 in which a in the empirical formula satisfies 82 to 86 at %, it can be confirmed that in the case of Examples 63 and 64, crystals are produced in the initial alloy as the value of Mathematical Formula 1 is less than 0.38, and accordingly, the coercivities become higher than those in Examples 65 to 72 which satisfy Mathematical Formula 1, and in particular, it can be seen that the coercivities after the heat treatment are remarkably increased.

In addition, it can be confirmed that in the case of Example 73 in which the value of Mathematical Formula 1 exceeds 28.5, an amorphous alloy in the initial alloy is realized, but the coercivity after the heat treatment is remarkably increased. Through this, it can be seen that when the content of B in the alloy is excessive, the particle diameter is not easily controlled.

Furthermore, it can be expected that in the case of Example 74 in which the value of Mathematical Formula 2 is less than 2.92, the magnetic loss is increased because the coercivity is larger than that in Example 75.

Further, referring to Examples 77 to 86 in which a in the empirical formula satisfies 78.5 or more and less than 82.0 at %, it can be confirmed that in the case of Example 77 in which the value of Mathematical Formula 3 is less than 0.67, the coercivity is larger than that in Example 78.

In addition, it can be confirmed that in the case of Example 83 in which the value of Mathematical Formula 4 is less than 8.3, crystals are produced in the initial alloy and the coercivity after the heat treatment is remarkably large, as compared to Examples 84 to 86.

Although an embodiment of the present invention has been described above, the spirit of the present invention is not limited to the Examples presented in the present specification, and although a person skilled in the art who understands the spirit of the present invention can easily propose other embodiments by supplementation, change, deletion, addition, and the like of the constituent elements, it can be said that those embodiments also fall within the scope of the spirit of the present invention.

The invention claimed is:

1. A Fe-based soft magnetic alloy represented by empirical formula $Fe_aB_bC_cCu_d$:
   wherein the empirical formula, a, b, c and d are atomic percent (at %) of the corresponding element and are respectively 82≤a≤86, 13.5≤b+c≤17.5, 1.0≤c≤4.0 and 0.5≤d<1.5, and
   wherein in the empirical formula, a value according to the following Mathematical Formula 1 is 0.38 to 28.5 and according to a and d, a value according to the following Mathematical Formula 2 is 2.92 to 3.70, and wherein the Fe-based soft magnetic alloy comprises nanocrystal grains having an average particle diameter of 15.2 to 30 nm:

$$\frac{b}{c\sqrt{c}} \quad \text{[Mathematical Formula 1]}$$

$$\sqrt[4]{\frac{a}{d}}. \quad \text{[Mathematical Formula 2]}$$

2. The Fe-based soft magnetic alloy of claim 1, wherein the value according to Mathematical Formula 1 is 0.65 to 16.1.

3. The Fe-based soft magnetic alloy of claim 1, wherein the Fe-based soft magnetic alloy is or crystalline, or has a heterogeneous atomic arrangement structure comprising both an amorphous region and a crystalline region.

4. The Fe-based soft magnetic alloy of claim 1, wherein the nanocrystal grains have an average particle diameter of 16 to 25 nm.

5. The Fe-based soft magnetic alloy of claim 1, wherein the Fe-based soft magnetic alloy comprise α-Fe and metal compounds formed between Fe and at least one of B, C and Cu.

6. The Fe-based soft magnetic alloy of claim 5, wherein in the Fe-based soft magnetic alloy, a crystallized area value according to the following Relationship Equation 1 is 45 to 90%:

$$\text{Crystallized area value (\%)} = \frac{\text{Area of crystlline region}}{\text{Area of crystlline region} + \text{Area of amorphous region}} \times 100 \quad \text{[Relationship Equation 1]}$$

in this case, the area refers to an integral value for a crystalline region or an amorphous region measured during an X-ray diffraction (XRD) analysis of the Fe-based soft magnetic alloy at an angle (2θ) of 0 to 90°.

7. A magnetic core comprising: the Fe-based soft magnetic alloy according to claim 1.

8. A coil part comprising: the magnetic core according to claim 7; and a coil part which is wound on the outside of the magnetic core.

* * * * *